US012805141B2

United States Patent
(12) United States Patent
Kurokawa et al.

(10) Patent No.: US 12,805,141 B2
(45) Date of Patent: Nov. 17, 2026

(54) DISPLAY APPARATUS, DISPLAY MODULE, AND ELECTRONIC DEVICE

(71) Applicant: Semiconductor Energy Laboratory Co., Ltd., Atsugi (JP)

(72) Inventors: Yoshiyuki Kurokawa, Sagamihara (JP); Sachiko Kawakami, Atsugi (JP); Nobuharu Ohsawa, Zama (JP); Daisuke Kubota, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 372 days.

(21) Appl. No.: 18/574,195

(22) PCT Filed: Jun. 17, 2022

(86) PCT No.: PCT/IB2022/055627

§ 371 (c)(1),
(2) Date: Dec. 26, 2023

(87) PCT Pub. No.: WO2023/275654

PCT Pub. Date: Jan. 5, 2023

(65) Prior Publication Data

US 2024/0260373 A1 Aug. 1, 2024

(30) Foreign Application Priority Data

Jun. 30, 2021 (JP) ................................ 2021-108864

(51) Int. Cl.
*H10K 59/35* (2023.01)
*H10K 39/34* (2026.01)

(52) U.S. Cl.
CPC .......... *H10K 59/353* (2023.02); *H10K 39/34* (2023.02); *H10K 59/351* (2023.02)

(58) Field of Classification Search
CPC ..... H10K 59/353; H10K 59/351; H10K 39/34
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 104009067 A 8/2014
CN 106537906 A 3/2017
(Continued)

OTHER PUBLICATIONS

International Search Report (Application No. PCT/IB2022/055627), dated Sep. 13, 2022.
(Continued)

*Primary Examiner* — David Y Chung
(74) *Attorney, Agent, or Firm* — Eric J. Robinson; Robinson Intellectual Property Law Office, P.C.

(57) ABSTRACT

A high-resolution display apparatus having a light detection function is provided. The display apparatus includes a display portion in which a first arrangement pattern and a second arrangement pattern are repeatedly placed in a first direction. In the first arrangement pattern, a first subpixel and a second subpixel are repeatedly arranged in a second direction. In the second arrangement pattern, a third subpixel, a fourth subpixel, and a fifth subpixel are repeatedly arranged in the second direction. Each of the first subpixel to the fourth subpixel includes a light-emitting device. The fifth subpixel includes a light-receiving device. Three or all of light-emitting devices included in the four subpixels can include EL layers with the same structure.

18 Claims, 28 Drawing Sheets

(56) References Cited

U.S. PATENT DOCUMENTS

| | | | |
|---|---|---|---|
| 7,965,266 | B2 | 6/2011 | Yamaguchi et al. |
| 8,907,928 | B2 | 12/2014 | Yamaguchi et al. |
| 10,388,706 | B2 | 8/2019 | Lee et al. |
| 10,488,962 | B2 | 11/2019 | Xie et al. |
| 10,985,220 | B2 | 4/2021 | Lee et al. |
| 11,073,692 | B2 | 7/2021 | Usukura et al. |
| 11,380,749 | B2 | 7/2022 | Liu et al. |
| 11,423,844 | B2 | 8/2022 | Ikeda et al. |
| 11,527,201 | B2 | 12/2022 | Liu et al. |
| 11,798,491 | B2 | 10/2023 | Ikeda et al. |
| 2002/0072139 | A1 | 6/2002 | Kashiwabara |
| 2006/0244693 | A1 | 11/2006 | Yamaguchi et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0123542 | A1 | 5/2017 | Xie et al. |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2018/0261655 | A1* | 9/2018 | Lee ........................ H10K 59/35 |
| 2019/0043932 | A1 | 2/2019 | Shih et al. |
| 2020/0018956 | A1 | 1/2020 | Usukura et al. |
| 2020/0203662 | A1 | 6/2020 | Mollard et al. |
| 2021/0124441 | A1 | 4/2021 | Ding et al. |
| 2021/0296409 | A1 | 9/2021 | Yamazaki et al. |
| 2022/0328571 | A1 | 10/2022 | Kurokawa et al. |

FOREIGN PATENT DOCUMENTS

| | | | |
|---|---|---|---|
| CN | 107785406 | A | 3/2018 |
| CN | 108573995 | A | 9/2018 |
| CN | 110634908 | A | 12/2019 |
| CN | 111580269 | A | 8/2020 |
| EP | 3373355 | A | 9/2018 |
| JP | 2000-036385 | A | 2/2000 |
| JP | 2003-059663 | A | 2/2003 |
| JP | 2006-301864 | A | 11/2006 |
| JP | 2008-098106 | A | 4/2008 |
| JP | 2008-147072 | A | 6/2008 |
| JP | 2008-251270 | A | 10/2008 |
| JP | 2009-288956 | A | 12/2009 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-147877 | A | 9/2018 |
| JP | 2019-179696 | A | 10/2019 |
| JP | 2020-160305 | A | 10/2020 |
| KR | 2018-0103206 | A | 9/2018 |
| WO | WO-2016/009925 | | 1/2016 |
| WO | WO-2018/159470 | | 9/2018 |
| WO | WO-2019/085986 | | 5/2019 |
| WO | WO-2019/220278 | | 11/2019 |
| WO | WO-2020/021399 | | 1/2020 |
| WO | WO-2021/077331 | | 4/2021 |

OTHER PUBLICATIONS

Written Opinion (Application No. PCT/IB2022/055627), dated Sep. 13, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 23A
100H
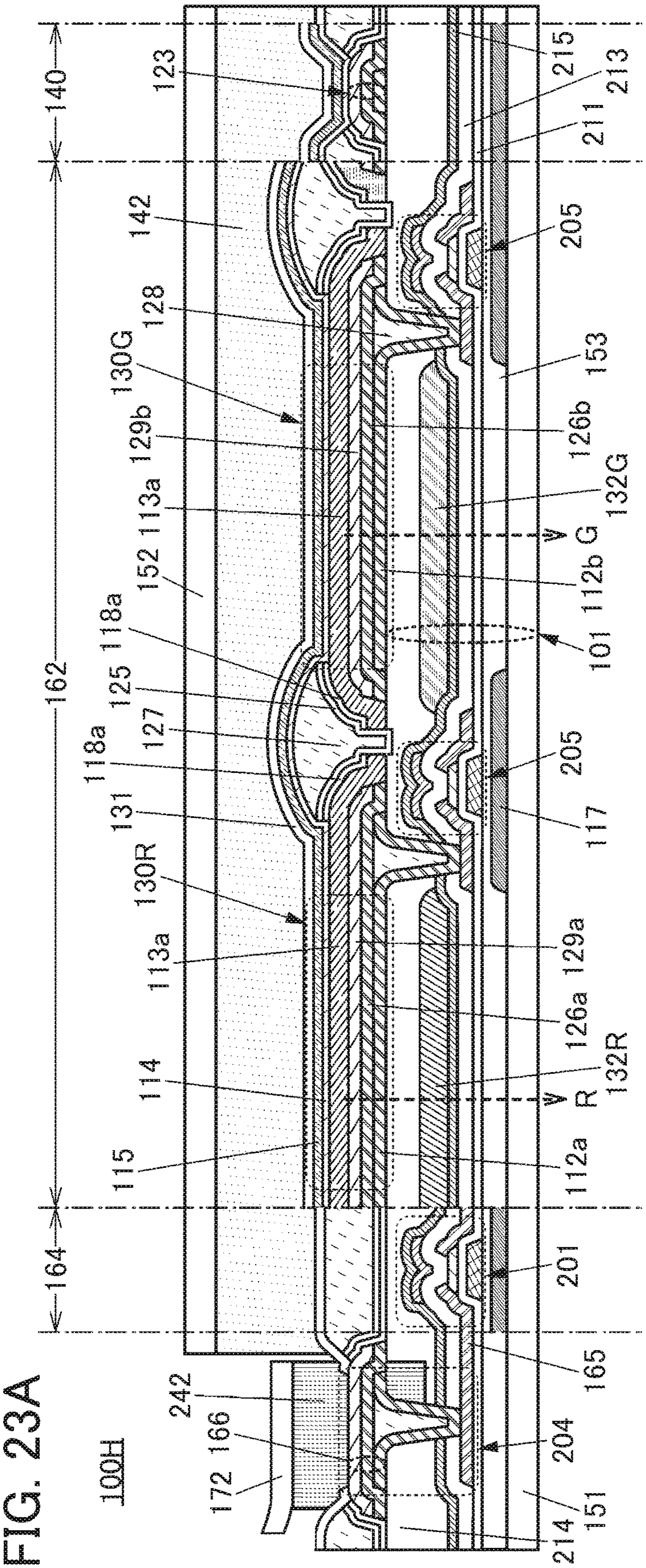
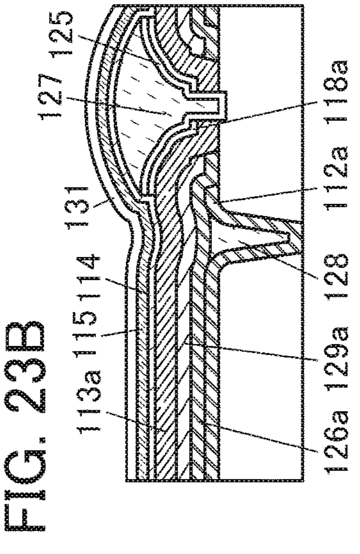
FIG. 23B
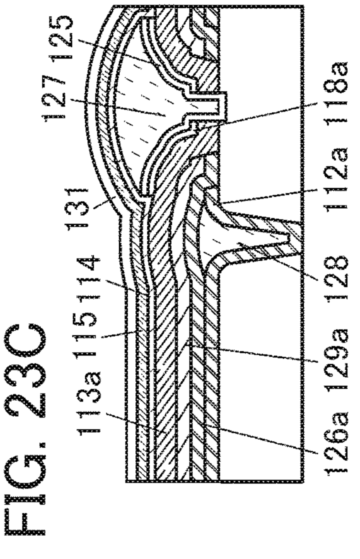
FIG. 23C
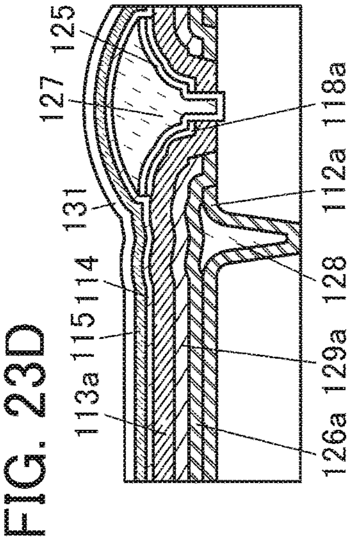
FIG. 23D

9101

9102

9103

9200

9201

9201

9201

DISPLAY APPARATUS, DISPLAY MODULE, AND ELECTRONIC DEVICE

TECHNICAL FIELD

One embodiment of the present invention relates to a display apparatus, a display module, and an electronic device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, higher resolution of display apparatuses have been desired. For example, devices for virtual reality (VR), augmented reality (AR), substitutional reality (SR), or mixed reality (MR) are given as devices requiring high-resolution display apparatuses and have been actively developed in recent years. Display apparatuses used for these devices are required to be downsized as well as to increase resolution.

Light-emitting apparatuses including light-emitting devices (light-emitting elements) have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

Patent Document 1, for example, discloses an example of a display apparatus using an organic EL element. In the case where high display quality is required as in the display apparatus in Patent Document 1, a high-resolution display apparatus including a large number of pixels is required in some cases.

REFERENCE

Patent Document

[Patent Document 1] PCT International Publication No. 2019/220278

SUMMARY OF THE INVENTION

Problems to be Solved by the Invention

A display apparatus having high display quality, such as the display apparatus disclosed in Patent Document 1, has been required for devices for virtual reality (VR) and augmented reality (AR). In this case, display is performed in a wearable housing, like in a glasses-type device or a goggle-type device; therefore, small size and light weight are important factors for the display apparatus. In the wearable housing, for example, the size of the display apparatus needs to be reduced to approximately less than or equal to 2 inches, or less than or equal to 1 inch.

The devices for VR and devices for AR are also becoming multifunctional with sensors.

An object of one embodiment of the present invention is to provide a high-resolution display apparatus having a light detection function. An object of one embodiment of the present invention is to provide a high-definition display apparatus having a light detection function. An object of one embodiment of the present invention is to provide a highly reliable display apparatus having a light detection function.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a display apparatus including a display portion in which a first arrangement pattern and a second arrangement pattern are repeatedly placed in a first direction. In the first arrangement pattern, a first subpixel and a second subpixel are repeatedly arranged in a second direction. In the second arrangement pattern, a third subpixel, a fourth subpixel, and a fifth subpixel are repeatedly arranged in the second direction. Each of the first subpixel to the fourth subpixel includes a light-emitting device. The fifth subpixel includes a light-receiving device.

A longitudinal direction of the third subpixel, the fourth subpixel, and the fifth subpixel is preferably the first direction.

A longitudinal direction of the first subpixel is preferably the second direction.

It is preferable that the second subpixel emit infrared light and have the lowest aperture ratio among the first subpixel to the fifth subpixel.

One embodiment of the present invention is a display apparatus including a display portion in which a first arrangement pattern and a second arrangement pattern are repeatedly placed in a first direction. In the first arrangement pattern, a first subpixel, a second subpixel, and a third subpixel are repeatedly arranged in a second direction. In the second arrangement pattern, a fourth subpixel and a fifth subpixel are repeatedly arranged in the second direction. Each of the first subpixel to the fourth subpixel includes a light-emitting device. The fifth subpixel includes a light-receiving device.

A longitudinal direction of the first subpixel, the second subpixel, and the third subpixel is preferably the first direction.

A longitudinal direction of the fifth subpixel is preferably the second direction.

It is preferable that the fourth subpixel emit infrared light and have the lowest aperture ratio among the first subpixel to the fifth subpixel.

One embodiment of the present invention is a display apparatus including a pixel comprising a first subpixel, a second subpixel, a third subpixel, a fourth subpixel, and a fifth subpixel. The first subpixel includes a first light-emitting device and a first coloring layer. The second subpixel includes a second light-emitting device and a second coloring layer. The third subpixel includes a third light-emitting device and a third coloring layer. The fourth subpixel includes a fourth light-emitting device. The first light-emitting device includes a first pixel electrode, a first EL layer over the first pixel electrode, and a common electrode over the first EL layer. The second light-emitting device includes a second pixel electrode, a second EL layer over the second pixel electrode, and the common electrode over the second EL layer. The third light-emitting device includes a third pixel electrode, a third EL layer over the third pixel electrode, and the common electrode over the third EL layer. The fourth light-emitting device includes a fourth pixel electrode, a fourth EL layer over the fourth pixel electrode, and the common electrode over the fourth EL layer. The first EL layer to the third EL layer have the same structure and are apart from one another. The first coloring layer to the third coloring layer transmit light of different colors. The fourth subpixel emits infrared light. The fifth subpixel includes a light-receiving device. The light-receiving device has a function of detecting light emitted by at least one of the first subpixel to the fourth subpixel.

One embodiment of the present invention is a display apparatus including a pixel including a first subpixel, a second subpixel, a third subpixel, a fourth subpixel, and a fifth subpixel. The first subpixel includes a first light-emitting device and a first coloring layer. The second subpixel includes a second light-emitting device and a second coloring layer. The third subpixel includes a third light-emitting device and a third coloring layer. The fourth subpixel includes a fourth light-emitting device and a fourth coloring layer. The first light-emitting device includes a first pixel electrode, a first EL layer over the first pixel electrode, and a common electrode over the first EL layer. The second light-emitting device includes a second pixel electrode, a second EL layer over the second pixel electrode, and the common electrode over the second EL layer. The third light-emitting device includes a third pixel electrode, a third EL layer over the third pixel electrode, and the common electrode over the third EL layer. The fourth light-emitting device includes a fourth pixel electrode, a fourth EL layer over the fourth pixel electrode, and the common electrode over the fourth EL layer. The first EL layer to the fourth EL layer have the same structure and are apart from one another. The first coloring layer to the third coloring layer transmit light of different colors. The fourth coloring layer includes a stack of two or more of the first coloring layer to the third coloring layer. The fifth subpixel includes a light-receiving device. The light-receiving device has a function of detecting light emitted by at least one of the first subpixel to the fourth subpixel.

One embodiment of the present invention is a display module including the display apparatus having any of the above structures. For example, the display module is provided with a connector such as a flexible printed circuit (FPC) or a TCP (Tape Carrier Package), or an integrated circuit (IC) is mounted on the display module by a COG (Chip On Glass) method, a COF (Chip On Film) method, or the like.

One embodiment of the present invention is an electronic device including the display module and at least one of a housing, a battery, a camera, a speaker, and a microphone.

Effect of the Invention

One embodiment of the present invention can provide a high-resolution display apparatus having a light detection function. One embodiment of the present invention can provide a high-definition display apparatus having a light detection function. One embodiment of the present invention can provide a highly reliable display apparatus having a light detection function.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 23A to FIG. 23D are cross-sectional views illustrating examples of a display apparatus.

MODE FOR CARRYING OUT THE INVENTION

Figure 1:
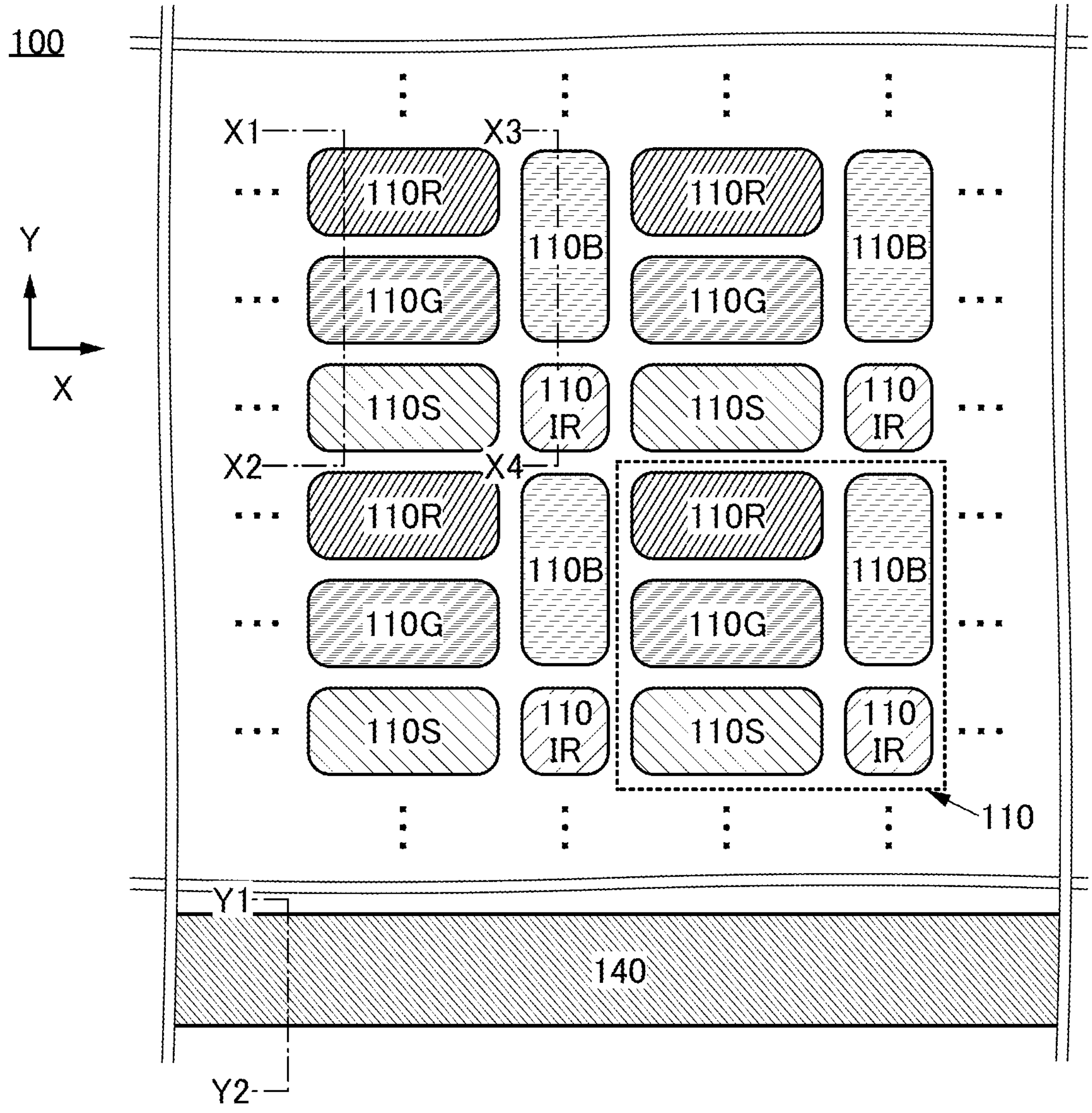
FIG. 1 is a top view illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, and the like of each component illustrated in drawings do not represent the actual position, size, range, and the like in some cases for easy understanding. Therefore, the disclosed invention is not necessarily limited to the position, size, range, and the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

In this specification and the like, a device fabricated using a metal mask or an FMM (fine metal mask or a high-resolution metal mask) is sometimes referred to as a device having an MM (metal mask) structure. In this specification and the like, a device fabricated without using a metal mask or an FMM is sometimes referred to as a device having an MML (metal maskless) structure.

In this specification and the like, a structure in which light-emitting layers of light-emitting devices having different emission wavelengths are separately formed is sometimes referred to as an SBS (Side By Side) structure. The SBS structure allows optimization of materials and structures of light-emitting devices and thus can extend freedom of choice of the materials and the structures, which makes it easy to improve the luminance and the reliability.

In this specification and the like, a hole or an electron is sometimes referred to as a "carrier". Specifically, a hole-injection layer or an electron-injection layer may be referred to as a "carrier-injection layer", a hole-transport layer or an electron-transport layer may be referred to as a "carrier-transport layer", and a hole-blocking layer or an electron-blocking layer may be referred to as a "carrier-blocking layer". Note that the above-described carrier-injection layer, carrier-transport layer, and carrier-blocking layer cannot be distinguished from each other on the basis of the cross-sectional shape or properties in some cases. One layer may have two or three functions of the carrier-injection layer, the carrier-transport layer, and the carrier-blocking layer in some cases.

Embodiment 1

In this embodiment, a display apparatus of one embodiment of the present invention will be described with reference to FIG. 1 to FIG. 10.

A display apparatus of one embodiment of the present invention includes a display portion in which a first arrangement pattern and a second arrangement pattern are repeatedly placed in the first direction. In the first arrangement pattern, a first subpixel and a second subpixel are repeatedly arranged in the second direction. In the second arrangement pattern, a third subpixel, a fourth subpixel, and a fifth subpixel are repeatedly arranged in the second direction. Each of the first subpixel to the fourth subpixel includes a light-emitting device, and a fifth subpixel includes a light-receiving device.

A display apparatus of another embodiment of the present invention includes a display portion in which a first arrangement pattern and a second arrangement pattern are repeatedly placed in the first direction. In the first arrangement pattern, a first subpixel, a second subpixel, and a third subpixel are repeatedly arranged in the second direction. In the second arrangement pattern, a fourth subpixel and a fifth subpixel are repeatedly arranged in the second direction. Each of the first subpixel to the fourth subpixel includes a light-emitting device, and a fifth subpixel includes a light-receiving device.

An example of a combination of light emitted from the first subpixel to the fourth subpixel is red (R) light, green (G) light, blue (B) light, and infrared (IR) light. Another example of the combination of light emitted from the four subpixels is yellow (Y) light, cyan (C) light, magenta (M) light, and infrared (IR) light.

The fifth subpixel is configured to detect at least one of visible light and infrared light, for example.

The display apparatus of one embodiment of the present invention includes a light-emitting device and a light-receiving device in a pixel. Since the display portion of the display apparatus of one embodiment of the present invention has a light-receiving function, image capturing can be performed with the use of the display portion. For example, the display portion can capture an image while displaying an image. In addition, in the display portion, some subpixels can emit light as light sources, some subpixels can detect light, and some subpixels can display an image.

In the case where a pixel includes five kinds of subpixels, a process of manufacturing the display apparatus becomes complicated and thus the manufacturing cost is increased in some cases. In view of this, in the display apparatus of one embodiment of the present invention, EL layers with the same structure are used for light-emitting devices functioning as display devices and coloring layers are separately formed for colors emitted from subpixels, whereby full-color display is achieved.

For example, subpixels emitting light of R, G, and B can be formed by employing light-emitting devices including EL layers with the same structure (e.g., white light-emitting devices) and separately forming coloring layers for R, G, and B. In that case, for a subpixel emitting IR light, a light-emitting device emitting infrared light is used.

Specifically, one embodiment of the present invention is a display apparatus in which a pixel includes the first subpixel to the fifth subpixel, the first subpixel includes the first light-emitting device and the first coloring layer, the second subpixel includes the second light-emitting device and the second coloring layer, the third subpixel includes the third light-emitting device and the third coloring layer, the fourth subpixel includes the fourth light-emitting device, the first light-emitting device to the third light-emitting device include EL layers with the same structure, the first coloring layer to the third coloring layer transmit light of different colors, the fourth subpixel emits infrared light, the fifth subpixel includes a light-receiving device, and the light-receiving device has a function of detecting light emitted from at least one of the first subpixel to the fourth subpixel.

Light-emitting devices including EL layers with the same structure may be employed for the subpixels emitting R light, G light, B light, and IR light. For example, the subpixels emitting R light, G light, B light, and IR light can be formed in such a manner that light-emitting devices each emitting both white light and infrared light are employed and coloring layers for R, G, and B are separately formed. Note that by stacking two or more of the coloring layers for R, G, and B, visible light is blocked and thus a subpixel emitting IR light can be achieved.

Specifically, one embodiment of the present invention is a display apparatus in which a pixel includes the first subpixel to the fifth subpixel, the first subpixel includes the first light-emitting device and the first coloring layer, the second subpixel includes the second light-emitting device and the second coloring layer, the third subpixel includes the third light-emitting device and the third coloring layer, the fourth subpixel includes the fourth light-emitting device and the fourth coloring layer, the first coloring layer to the third coloring layer transmit light of different colors, the fourth coloring layer includes a stacked layer of two or more of the first coloring layer to the third coloring layer, the first light-emitting device to the fourth light-emitting device include EL layers with the same structure, the fifth subpixel includes a light-receiving device, and the light-receiving device has a function of detecting light emitted from at least one of the first subpixel to the fourth subpixel.

Here, an island-shaped light-emitting layer is provided in a subpixel including a light-emitting device, and an island-shaped active layer (also referred to as a photoelectric conversion layer) is provided in a subpixel including a light-receiving device. In the case where light-emitting devices having different structures are used for subpixels emitting light of R, G, and B and a subpixel emitting IR light, island-shaped light-emitting layers are separately formed for the respective light-emitting devices. In this manner, in the display apparatus of one embodiment of the present invention, island-shaped light-emitting layers and island-shaped active layers need to be separately formed depending on the functions of the subpixels.

Note that in this specification and the like, the term “island shape” refers to a state where two or more layers formed using the same material in the same step are physically separated from each other. For example, the term “island-shaped light-emitting layer” means a state where the light-emitting layer and its adjacent light-emitting layer are physically separated from each other.

When light-emitting devices including EL layers with the same structure are used, layers included in the light-emitting devices other than a pixel electrode (e.g., a light-emitting layer) can be used in common between a plurality of subpixels. Thus, the plurality of subpixels can share a continuous film. However, some of the layers included in the light-emitting device have relatively high conductivity. When the plurality of subpixels share a continuous film with high conductivity, leakage current might be generated between the subpixels. Particularly when an increase in the resolution or the aperture ratio of a display apparatus reduces the distance between subpixels, the leakage current might become too large to ignore and cause a decrease in display quality or the like of the display apparatus.

In view of the above, in the display apparatus of one embodiment of the present invention, at least a part of the layers included in the EL layer is formed to have an island shape in each subpixel. When at least parts of the layers included in the EL layers are separately formed from each other in the subpixels, crosstalk between adjacent subpixels can be prevented from occurring. This enables the display apparatus to achieve both high resolution and high display quality.

For example, an island-shaped light-emitting layer can be formed by a vacuum evaporation method using a metal mask. However, this method causes a deviation from the designed shape and position of the island-shaped light-emitting layer due to various influences such as the accuracy of the metal mask, the positional deviation between the metal mask and a substrate, a warp of the metal mask, and the vapor-scattering-induced expansion of outline of the formed film; accordingly, it is difficult to achieve high resolution and high aperture ratio of the display apparatus. In addition, the outline of the layer may blur during vapor deposition, whereby the thickness of an end portion may be reduced. That is, the thickness of the island-shaped light-emitting layer may vary from area to area. In the case of manufacturing a display apparatus with a large size, high definition, or high resolution, the manufacturing yield might be reduced because of low dimensional accuracy of the metal mask and deformation due to heat or the like.

In view of the above, in manufacturing the display apparatus of one embodiment of the present invention, fine patterning of the light-emitting layer is performed by a photolithography method without using a shadow mask such as a metal mask. Specifically, a pixel electrode is formed for each subpixel, and then, a light-emitting layer is formed across a plurality of pixel electrodes. After that, the light-emitting layer is processed by a photolithography method, so that one island-shaped light-emitting layer is formed per pixel electrode. Thus, the light-emitting layer can be divided into island-shaped light-emitting layers for respective subpixels.

In a possible way of processing the light-emitting layer into an island shape, the light-emitting layer is processed directly by a photolithography method. In such a structure, damage to the light-emitting layer (e.g., processing damage) might significantly degrade the reliability. In view of the above, in the manufacture of the display apparatus of one embodiment of the present invention, a sacrificial layer (which may be referred to as a mask layer) or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable display apparatus.

As described above, the island-shaped light-emitting layers formed in the method for manufacturing a display apparatus of one embodiment of the present invention are formed not by using a metal mask having a fine pattern but by processing a light-emitting layer deposited over the entire surface. Specifically, the size of the island-shaped light-emitting layers is obtained by division and scale down of the light-emitting layer by a photolithography method or the like. Thus, its size can be made smaller than the size of the light-emitting layer capable of being formed using a metal mask. Accordingly, a high-resolution display apparatus or a display apparatus with a high aperture ratio, which has been difficult to achieve, can be manufactured.

The small number of times of processing of the light-emitting layer by a photolithography method is preferable because a reduction in manufacturing cost and an improvement of manufacturing yield become possible. In the method for manufacturing the display apparatus of one embodiment of the present invention, the number of times of processing of the light-emitting layer by a photolithography method can be two or three; thus, the display apparatus can be manufactured with high yield.

It is difficult to set the distance between adjacent light-emitting devices to be less than 10 μm by a formation method using a metal mask, for example. However, by the above method, the distance between adjacent light-emitting devices can be decreased to be less than 10 μm, less than or equal to 5 μm, less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. Accordingly, the area of a non-light-emitting region that could exist between two light-emitting devices can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the light-emitting layer itself (which can also be referred to as processing size) can be made much smaller than that in the case of using a metal mask. For example, in the case of using a metal mask for forming the light-emitting layers separately, a variation in the thickness occurs between the center and the edge of the light-emitting layer. This causes a reduction in an effective area that can be used as a light-emitting region with respect to the area of the light-emitting layer. In contrast, in the above manufacturing method, the film formed to have a uniform thickness is processed, so that island-shaped light-emitting layers can be formed to have a uniform thickness. Accordingly, even with a fine pattern, almost all the area can be used as a light-emitting region. Thus, a display apparatus having both a high resolution and a high aperture ratio can be manufactured.

The above-described manufacturing method can be applied to the light-receiving device as well as to the light-emitting device. An island-shaped active layer included in the light-receiving device is formed by depositing a film to be the active layer on the entire surface and then processing the film, not by using a metal mask having a fine pattern; thus, the island-shaped active layer can be formed to have a uniform thickness. In addition, a sacrificial layer provided over the active layer can reduce damage to the active layer in the manufacturing process of the display apparatus, increasing the reliability of the light-receiving device.

A method of manufacturing the display apparatus of one embodiment of the present invention will be described in detail in Embodiment 2.

[Example of Pixel Layout]

FIG. 1 is a top view of a display apparatus 100. The display apparatus 100 includes a display portion in which a plurality of pixels 110 are arranged in a matrix, and a connection portion 140 outside the display portion. One pixel 110 consists of five subpixels: subpixels 110R, 110G, 110B, 110IR, and 110S.

Although the top view of FIG. 1 illustrates an example in which the connection portion 140 is positioned in the lower side of the display portion, there is no particular limitation on the position of the connection portion 140. The connection portion 140 may be provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more. Note that in this specification and the like, a top surface shape refers to a shape in a plan view, i.e., a shape seen from above.

The top surface shape of the subpixel illustrated in FIG. 1 and the like corresponds to the top surface shape of a light-emitting region or a light-receiving region.

Examples of a top surface shape of the subpixel include polygons such as a triangle, a tetragon (including a rectangle and a square), and a pentagon; polygons with rounded corners; an ellipse; and a circle.

The range of the circuit layout for forming the subpixels is not limited to the range of the subpixels illustrated in FIG. 1 and the like and may be placed outside the subpixels. For example, transistors included in the subpixel 110R may be positioned within the range of the subpixel 110R illustrated in FIG. 1, or some or all of the transistors may be positioned outside the range of the subpixel 110R.

FIG. 1 illustrates an example in which one pixel 110 is provided in three rows and two columns. The pixel 110 includes the subpixel 110R in the first row, the subpixel 110G in the second row, and the subpixel 110B across these two rows. The pixel 110 includes two subpixels (the subpixels 110IR and 110S) in the third row. In other words, the pixel 110 includes three subpixels (the subpixels 110R, 110G, and 110S) in the left column (the first column) and two subpixels (the subpixels 110B and 110IR) in the right column (the second column).

In the display portion illustrated in FIG. 1, it can be said that the first arrangement pattern and the second arrangement pattern are repeatedly placed in the X direction. In the first arrangement pattern, the subpixels 110B and the subpixels 110IR are repeatedly arranged in the Y direction. In the second arrangement pattern, the subpixels 110R, the subpixels 110G, and the subpixels 110S are repeatedly arranged in this order in the Y direction.

The longitudinal direction (also referred to as a long-side direction) of the subpixel 110R, the subpixel 110G, and the subpixel 110S is the X direction. The longitudinal direction of the subpixel 110B is the Y direction.

The subpixel 110R emits red light. The subpixel 110G emits green light. The subpixel 110B emits blue light. The subpixel 110IR emits infrared light. The subpixel 110S detects at least infrared light. The subpixel 110S may be capable of detecting both infrared light and visible light.

The subpixels 110R, 110G, 110B, and 110IR each include a light-emitting device, and the subpixel 110S includes a light-receiving device.

As the light-emitting device, an OLED (Organic Light Emitting Diode) or a QLED (Quantum-dot Light Emitting Diode) is preferably used. Examples of a light-emitting substance (also referred to as a light-emitting material) included in the light-emitting device include a substance that emits fluorescent light (a fluorescent material), a substance that emits phosphorescent light (a phosphorescent material), and a substance exhibiting thermally activated delayed fluorescence (a thermally activated delayed fluorescent (TADF) material). As the light-emitting substance, inorganic compounds (e.g., quantum dot materials) can be used. In addition, an LED (Light Emitting Diode) such as a micro-LED can also be used as the light-emitting device.

The emission color of the light-emitting device can be infrared, red, green, blue, cyan, magenta, yellow, white, or the like. Furthermore, the color purity can be increased when the light-emitting device has a microcavity structure.

Embodiment 4 can be referred to for a structure and a material of the light-emitting device.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

The light-receiving device can detect one or both of visible light and infrared light. In the case where the light-receiving device detects visible light, for example, one or more of blue light, violet light, bluish violet light, green light, yellowish green light, yellow light, orange light, red light, and the like can be detected. The infrared light is preferably detected because an object can be detected even in a dark place.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

Embodiment 5 can be referred to for a structure and a material of the light-receiving device.

The pixel enables full-color display with the use of the subpixels 110R, 110G, and 110B. The layout of the subpixels 110R, 110G, and 110B is what is called S stripe arrangement. Thus, high display quality can be achieved.

The subpixel 110IR can be used as a light source, and the subpixel 110S can detect infrared light emitted from the subpixel 110IR. The subpixel 110IR may have the lowest aperture ratio among the five subpixels.

Although the subpixels 110R, 110G, 110B, and 110S have the same aperture ratio or substantially the same aperture ratios (also referred to as size or size of a light-emitting region or a light-receiving region) in FIG. 1, one embodiment of the present invention is not limited thereto. The aperture ratio of each of the subpixels 110R, 110G, 110B, 110IR, and 110S can be determined as appropriate. The subpixels 110R, 110G, 110B, 110IR, and 110S may have different aperture ratios, or two or more of them may have the same aperture ratio or substantially the same aperture ratios.

The subpixel 110S may have a higher aperture ratio than at least one of the subpixels 110R, 110G, and 110B. For example, in some cases, the size of the subpixel 110S is larger than the sizes of the other subpixels depending on the resolution of the display apparatus and the circuit structure or the like of the subpixel.

The subpixel 110S may have a lower aperture ratio than at least one of the subpixels 110R, 110G, and 110B. A smaller light-receiving area of the subpixel 110S leads to a narrower image-capturing range, so that a blur in an image capturing result can be inhibited and the definition can be improved. Accordingly, high-resolution or high-definition image capturing can be performed, which is preferable.

FIG. 1 illustrates an example in which the subpixel 110IR has the lowest aperture ratio among the five subpixels. For example, since the subpixel 110IR is used as a light source, a passive matrix driving method may be employed for driving the light-emitting device. That is, a transistor or the like is not necessarily provided in the subpixel 110IR, which can reduce the size of the subpixel 110IR.

FIG. 2A to FIG. 2E illustrate other structure examples of the pixel 110.

Each of the pixels 110 illustrated in FIG. 2A to FIG. 2E consists of five subpixels 110R, 110G, 110B, 110IR, and 110S.

Figure 2A:
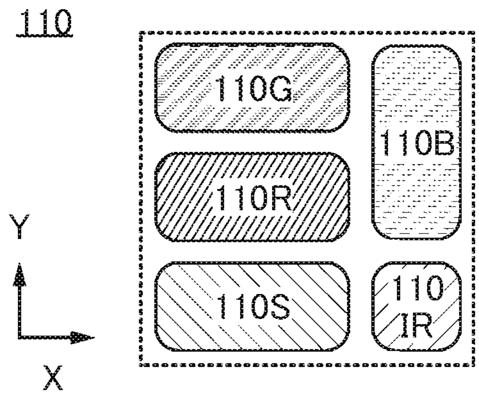
FIG. 2A to FIG. 2E are top views illustrating examples of a pixel.

The pixel 110 illustrated in FIG. 2A has a structure in which the positions of the subpixel 110R and the subpixel 110G in the pixel 110 illustrated in FIG. 1 are interchanged with each other.

The pixel 110 illustrated in FIG. 2A includes the subpixel 110G in the first row, the subpixel 110R in the second row, and the subpixel 110B across these two rows. The pixel 110 includes two subpixels (the subpixels 110IR and 110S) in the third row. In other words, the pixel 110 includes three subpixels (the subpixels 110G, 110R, and 110S) in the left column (the first column) and two subpixels (the subpixels 110B and 110IR) in the right column (the second column).

Figure 2B:
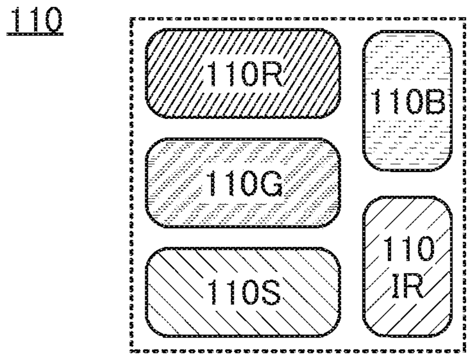

The pixel 110 illustrated in FIG. 2B has a structure in which the subpixel 110B and the subpixel 110IR in the pixel 110 illustrated in FIG. 1 have the same size.

The pixel 110 illustrated in FIG. 2B includes the subpixel 110R in the first row, the subpixel 110G in the second row, and the subpixel 110S in the third row. The subpixel 110B is provided in the first row and the middle of the second row, and the subpixel 110IR is provided in the second row and the middle of the third row. In other words, the pixel 110 includes three subpixels (the subpixels 110G, 110R, and 110S) in the left column (the first column) and two subpixels (the subpixels 110B and 110IR) in the right column (the second column).

Figure 2C:
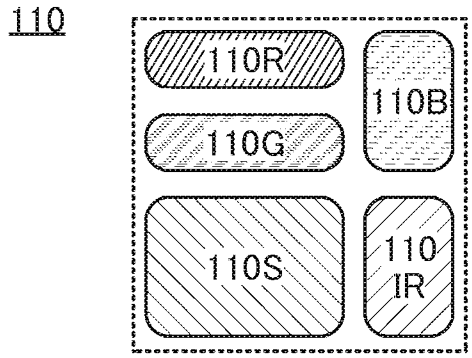

The pixel 110 illustrated in FIG. 2C has a structure in which the subpixel 110S has a larger size than each of the subpixels 110R and 110G in the pixel 110 in FIG. 2A.

The pixel 110 illustrated in FIG. 2C includes the subpixel 110R in the first row, the subpixel 110G in the second row, and the subpixel 110B across these two rows. The pixel 110 includes two subpixels (the subpixels 110IR and 110S) in the third row. In other words, the pixel 110 includes three subpixels (the subpixels 110R, 110G, and 110S) in the left column (the first column) and two subpixels (the subpixels 110B and 110IR) in the right column (the second column).

In the display portion including the pixel 110 illustrated in each of FIG. 2A to FIG. 2C, it can be said that the first arrangement pattern and the second arrangement pattern are repeatedly placed in the X direction as in FIG. 1. In the first arrangement pattern in FIG. 1, FIG. 2B, and FIG. 2C, the subpixels 110R, 110G, and 110S are repeatedly arranged in this order in the Y direction; in the first arrangement pattern in FIG. 2A, the subpixels 110G, 110R, and 110S are arranged in this order. The longitudinal direction of the subpixels 110R, 110G, and 110S is the X direction. In the second arrangement pattern, the subpixels 110B and 110IR are repeatedly arranged in the Y direction, and the longitudinal direction of the subpixel 110B is the Y direction.

In the pixel 110 illustrated in each of FIG. 2B and FIG. 2C, the subpixel 110B and the subpixel 110IR have the same aperture ratio or substantially the same aperture ratios. In FIG. 2C, the subpixel 110S has a higher aperture ratio than the subpixels 110R and 110G. The subpixel 110S has the highest aperture ratio of the subpixels 110R, 110G, 110B, 110IR, and 110S in the pixel 110 illustrated in FIG. 2C. In contrast, FIG. 2B illustrates an example in which the subpixels 110G, 110R, and 110S have the same aperture ratio or substantially the same aperture ratios.

Figure 2D:
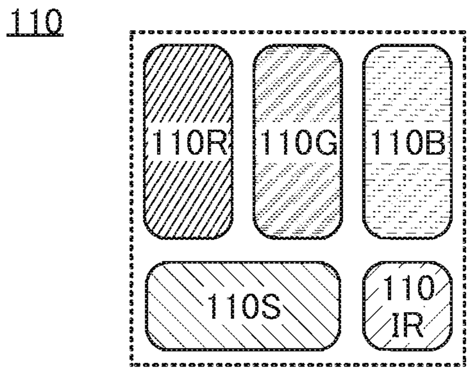
Figure 2E:
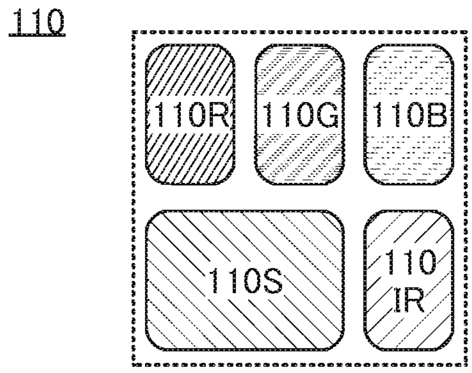

FIG. 2D and FIG. 2E each illustrate an example in which one pixel 110 is provided in two rows and three columns. The pixel 110 includes three subpixels (the subpixels 110R,

110G, and 110B) in the first row and two subpixels (the subpixels 110IR and 110S) in the second row. In other words, the pixel 110 includes the subpixel 110R in the left column (the first column), the subpixel 110G in the center column (the second column), and the subpixel 110S in the left and middle columns. In addition, the pixel 110 includes two subpixels (the subpixels 110B and 110IR) in the right column (the third column).

In the display portion including the pixel 110 illustrated in each of FIG. 2D and FIG. 2E, it can be said that the first arrangement pattern and the second arrangement pattern are repeatedly placed in the Y direction. In the first arrangement pattern, the subpixels 110R, 110G, and 110B are repeatedly arranged in the X direction. In the second arrangement pattern, the subpixels 110IR and 110S are repeatedly arranged in the X direction.

The longitudinal direction of the subpixels 110R, 110G, and 110B is the Y direction. The longitudinal direction of the subpixel 110S is the X direction.

The pixel enables full-color display with the use of the subpixels 110R, 110G, and 110B. In the pixel 110 illustrated in each of FIG. 2D and FIG. 2E, the layout of the subpixels 110R, 110G, and 110B is what is called stripe arrangement. Thus, high display quality can be achieved.

The subpixel 110IR can be used as a light source, and the subpixel 110S can detect infrared light emitted from the subpixel 110IR.

In the pixel 110 illustrated in FIG. 2D, the subpixels 110R, 110G, 110B, and 110S have the same aperture ratio or substantially the same aperture ratios. The subpixel 110IR has the lowest aperture ratio of the subpixels 110R, 110G, 110B, 110IR, and 110S.

In the pixel 110 illustrated in FIG. 2E, the subpixels 110R, 110G, 110B, and 110IR have the same aperture ratio or substantially the same aperture ratios. The subpixel 110S has the highest aperture ratio of the subpixels 110R, 110G, 110B, 110IR, and 110S.

Note that like the subpixels 110B and 110IR illustrated in FIG. 2B, the subpixels 110IR and 110S in FIG. 2D or FIG. 2E may have the same aperture ratio or substantially the same aperture ratios.

[Example of Cross-Sectional Structure]

FIG. 3 to FIG. 10 are cross-sectional views of examples of a display apparatus of one embodiment of the present invention.

Figure 3A:
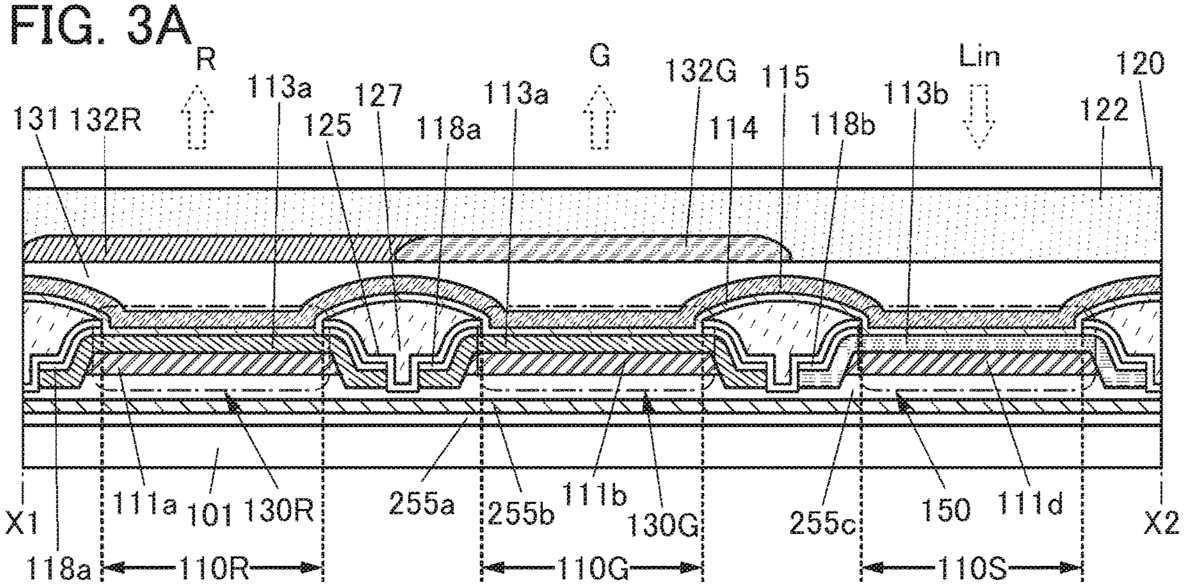
FIG. 3A and FIG. 3B are cross-sectional views illustrating an example of a display apparatus.
Figure 3B:
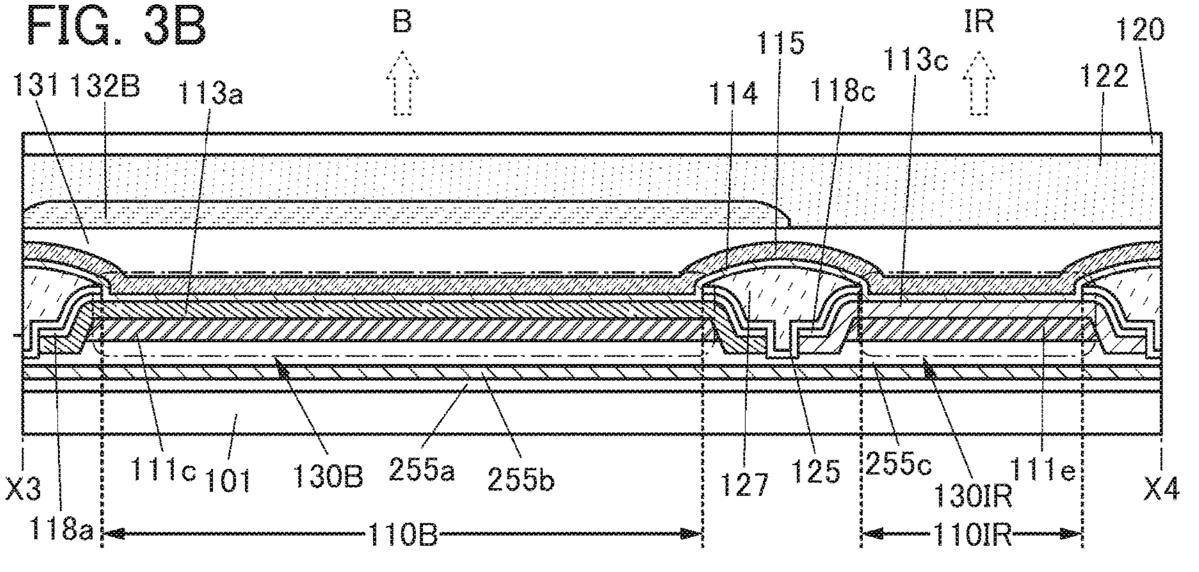
Figure 4A:
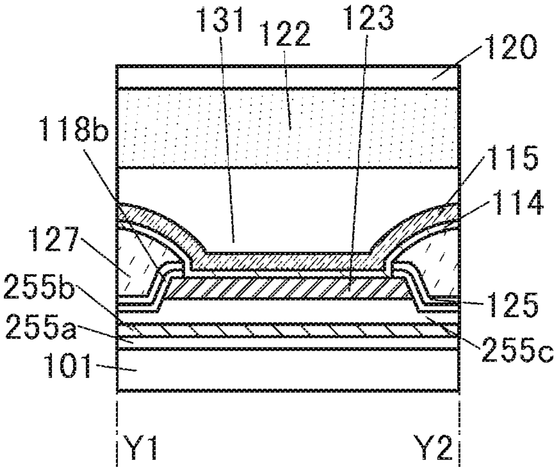
FIG. 4A and FIG. 4B are cross-sectional views illustrating examples of a display apparatus.
Figure 4B:
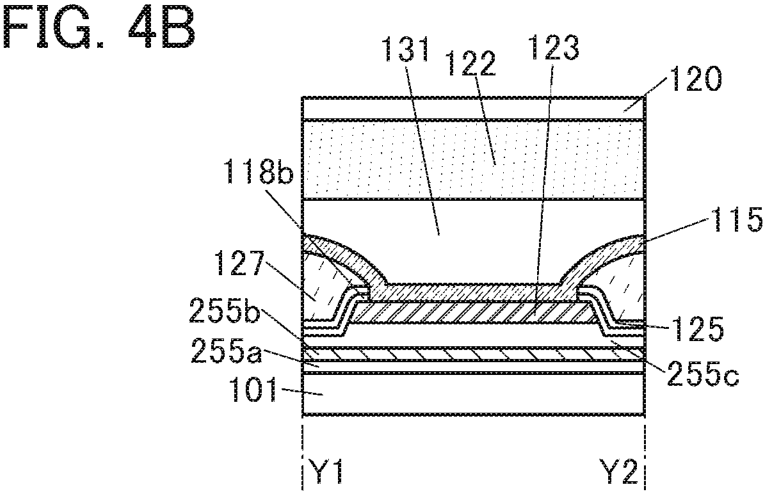

FIG. 3A is a cross-sectional view taken along the dashed-dotted line X1-X2 in FIG. 1, and FIG. 3B is a cross-sectional view taken along the dashed-dotted line X3-X4 in FIG. 1. FIG. 4A and FIG. 4B are each a cross-sectional view taken along the dashed-dotted line Y1-Y2 in FIG. 1.

The display apparatus illustrated in FIG. 3A and FIG. 3B includes the subpixel 110R emitting red light, the subpixel 110G emitting green light, the subpixel 110S detecting at least infrared light, the subpixel 110B emitting blue light, and the subpixel 110IR emitting infrared light.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces. In this embodiment, a top-emission display apparatus is mainly described as an example.

The subpixel 110R includes a light-emitting device 130R and a coloring layer 132R transmitting red light. Thus, light emitted from the light-emitting device 130R is extracted as red light to the outside of the display apparatus through the coloring layer 132R.

Similarly, the subpixel 110G includes a light-emitting device 130G and a coloring layer 132G transmitting green light. Thus, light emitted from the light-emitting device 130G is extracted as green light to the outside of the display apparatus through the coloring layer 132G.

The subpixel 110B includes a light-emitting device 130B and a coloring layer 132B transmitting blue light. Thus, light emitted from the light-emitting device 130B is extracted as blue light to the outside of the display apparatus through the coloring layer 132B.

Full-color display can be performed with the use of the subpixels 110R, 110G, and 110B.

The subpixel 110IR includes a light-emitting device 130IR emitting infrared light. Thus, light emitted from the light-emitting device 130IR is extracted as infrared light to the outside of the display apparatus not through a coloring layer.

Here, the wavelength of infrared light can be longer than or equal to 750 nm, and is preferably longer than or equal to 780 nm. It is particularly preferable to use, as infrared light, near-infrared light having a wavelength longer than or equal to 750 nm and shorter than or equal to 2500 nm.

The subpixel 110S includes a light-receiving device 150. There is no particular limitation on the wavelength of light detected by the subpixel 110S. The subpixel 110S detects at least one of visible light and infrared light. Light Lin enters the light-receiving device 150 from the outside of the display apparatus through a substrate 120, a resin layer 122, and a protective layer 131.

In particular, the subpixel 110S preferably detects infrared light emitted from the subpixel 110IR. For example, while an image is displayed using the subpixels 110R, 110G, and 110B, reflected light of the light emitted from the subpixel 110IR that is used as a light source can be detected by the subpixel 110S.

In one embodiment of the present invention, an organic EL device is used as the light-emitting device, and an organic photodiode is used as the light-receiving device. The organic EL device and the organic photodiode can be formed over the same substrate. Thus, the organic photodiode can be incorporated in the display apparatus using the organic EL device.

The light-emitting device includes an EL layer between a pair of electrodes. The EL layer includes at least a light-emitting layer. The light-receiving device includes at least an active layer that functions as a photoelectric conversion layer between a pair of electrodes. In this specification and the like, one of the pair of electrodes may be referred to as a pixel electrode and the other may be referred to as a common electrode.

One electrode of the pair of electrodes included in each of the light-emitting device and the light-receiving device functions as an anode and the other electrode functions as a cathode.

When the light-receiving device is driven by application of reverse bias between the pixel electrode and the common electrode, light entering the light-receiving device can be detected and electric charge can be generated and extracted as current.

Since a large number of layers in the organic photodiodes can have structures in common with the layers in the organic EL devices, forming the layers having common structures concurrently can inhibit an increase in the number of film formation steps.

For example, one of a pair of electrodes (a common electrode) can be a layer shared by the light-receiving device and the light-emitting device. For another example, at least one of a hole-injection layer, a hole-transport layer, a hole-blocking layer, an electron-blocking layer, an electron-transport layer, and an electron-injection layer is preferably shared by the light-receiving device and the light-emitting device.

Here, the display apparatus of one embodiment of the present invention may include a layer shared by the light-receiving device and the light-emitting device (also referred to as a continuous layer included in the light-receiving device and the light-emitting device). Such a layer has different functions in the light-emitting device and in the light-receiving device in some cases. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device has the same function in both the light-emitting device and the light-receiving device in some cases. The hole-transport layer functions as a hole-transport layer in both the light-emitting device and the light-receiving device, and the electron-transport layer functions as an electron-transport layer in both the light-emitting device and the light-receiving device.

The light-emitting device 130R includes a pixel electrode 111*a*, a first layer 113*a*, a common layer 114, and a common electrode 115. The light-emitting device 130G includes a pixel electrode 111*b*, the first layer 113*a*, the common layer 114, and the common electrode 115. The light-emitting device 130B includes a pixel electrode 111*c*, the first layer 113*a*, the common layer 114, and the common electrode 115. The light-receiving device 150 includes a pixel electrode 111*d*, a second layer 113*b*, the common layer 114, and the common electrode 115. The light-emitting device 130IR includes a pixel electrode 111*e*, a third layer 113*c*, the common layer 114, and the common electrode 115. The first layers 113*a* included in the light-emitting devices 130R, 130G, and 130B are apart from one another.

In this specification and the like, in the EL layers included in the light-emitting devices, the island-shaped layer provided in each light-emitting device is referred to as the first layer 113*a* or the third layer 113*c*, and the layer shared by the plurality of light-emitting devices is referred to as the common layer 114.

FIG. 3A and FIG. 3B illustrate an example in which light-emitting devices including EL layers with the same structure are used for the subpixels emitting light of R, G, and B, and a light-emitting device emitting infrared light is used for a subpixel emitting IR light.

When the light-emitting devices 130R, 130G, and 130B include EL layers with the same structure, the steps of manufacturing the display apparatus can be reduced, which can reduce the manufacturing cost and increase the manufacturing yield.

The light-emitting device in this embodiment may have a single structure or a tandem structure.

The first layer 113*a* and the third layer 113*c* each include at least a light-emitting layer. The first layer 113*a* and the third layer 113*c* may each include one or more of a hole-injection layer, a hole-transport layer, a hole-blocking layer, a charge-generation layer, an electron-blocking layer, an electron-transport layer, and an electron-injection layer.

The light-emitting devices 130R, 130G, and 130B each include the first layer 113*a*.

For example, the first layer 113*a* can contain a light-emitting material emitting blue light and a light-emitting material emitting visible light having a longer wavelength than blue light. For example, a structure containing a light-emitting material emitting blue light and a light-emitting material emitting yellow light, or a structure containing a light-emitting material emitting blue light, a light-emitting material emitting green light, and a light-emitting material emitting red light can be used for the first layer 113*a*.

As the light-emitting devices 130R, 130G, and 130B, for example, a single-structure light-emitting device including two light-emitting layers, which are a light-emitting layer emitting yellow (Y) light and a light-emitting layer emitting blue (B) light, or a single-structure light-emitting device including three light-emitting layers, which are a light-emitting layer emitting red (R) light, a light-emitting layer emitting green (G) light, and a light-emitting layer emitting blue light, can be used. As examples of the number of stacked light-emitting layers and the order of colors thereof, a three-layer structure of R, G, and B and a three-layer structure of R, B, and G from the anode side can be given. Another layer (also referred to as a buffer layer) may be provided between two light-emitting layers. The buffer layer can be formed using a material that can be used for the hole-transport layer or the electron-transport layer, for example.

In the case where a light-emitting device with a tandem structure is used, examples of applicable structures are as follows: a two-unit tandem structure including a light-emitting unit that emits yellow light and a light-emitting unit that emits blue light; a two-unit tandem structure including a light-emitting unit that emits red light and green light and a light-emitting unit that emits blue light; and a three-unit tandem structure in which a light-emitting unit that emits blue light, a light-emitting unit that emits yellow, yellow-green, or green light and red light, and a light-emitting unit that emits blue light are stacked in this order. Examples of the number of stacked units and the order of colors from an anode side include a two-unit structure of B and Y; a two-unit structure of B and X; a three-unit structure of B, Y, and B; and a three-unit structure of B, X, and B. Examples of the number of light-emitting layers stacked in the light-emitting unit X and the order of colors from the anode side include a two-layer structure of R and Y; a two-layer structure of R and G; a two-layer structure of G and R; a three-layer structure of G, R, and G; and a three-layer structure of R, G, and R. Another layer may be provided between two light-emitting layers.

The light-emitting device 130IR includes the third layer 113*c*. The third layer 113*c* includes a light-emitting material emitting infrared light.

As the light-emitting device 130IR, for example, a single-structure light-emitting device emitting infrared light or a light-emitting device with a tandem-structure including two or more light-emitting units emitting infrared light can be used, for example.

In the case where light-emitting devices are separately formed for subpixels emitting light of R, G, and B and subpixels emitting IR light, the light-emitting device 130IR can be configured to emit mainly infrared light. That is, the light-emitting device 130IR can be configured to emit extremely weak visible light or hardly emit visible light.

Therefore, a filter for blocking visible light does not need to be provided in the subpixel 110IR.

In the case where the light-emitting device with a tandem structure is used, the first layer 113*a* or the third layer 113*c* includes a plurality of light-emitting units. A charge-generation layer is preferably provided between light-emitting units.

The light-emitting unit includes at least one light-emitting layer. For example, when emission colors of the plurality of light-emitting units are complementary to each other, the light-emitting device can emit white light. The light-emitting unit may include one or more of a hole-injection layer, a hole-transport layer, a hole-blocking layer, an electron-blocking layer, an electron-transport layer, and an electron-injection layer.

In the case where the light-emitting device configured to emit white light has a microcavity structure, light of a specific wavelength such as red, green, blue, or infrared light is sometimes intensified to be emitted.

For example, each of the first layer 113*a* and the third layer 113*c* may include a hole-injection layer, a hole-transport layer, a light-emitting layer, and an electron-transport layer in this order. In addition, an electron-blocking layer may be provided between the hole-transport layer and the light-emitting layer. Furthermore, an electron-injection layer may be provided over the electron-transport layer.

Alternatively, each of the first layer 113*a* and the third layer 113*c* may include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

It is preferable that each of the first layer 113*a* and the third layer 113*c* include a light-emitting layer and a carrier-transport layer (an electron-transport layer or a hole-transport layer) over the light-emitting layer. Since the surface of each of the first layer 113*a* and the third layer 113*c* is exposed in the manufacturing process of the display apparatus, providing the carrier-transport layer over the light-emitting layer inhibits the light-emitting layer from being exposed on the outermost surface, so that damage to the light-emitting layer can be reduced. Thus, the reliability of the light-emitting device can be increased.

The second layer 113*b* includes at least an active layer. The second layer 113*b* included in a light-receiving device can be formed independently of the first layer 113*a* and the third layer 113*c* included in a light-emitting device; thus, a range of choices for materials that can be used is wide. Note that for the second layer 113*b*, materials that can be used for the first layer 113*a* and the third layer 113*c* may be used. The second layer 113*b* may include one or more of a hole-injection layer, a hole-transport layer, a hole-blocking layer, a charge-generation layer, an electron-blocking layer, an electron-transport layer, and an electron-injection layer which can be used for the first layer 113*a* and the third layer 113*c*.

The common layer 114 includes, for example, an electron-injection layer or a hole-injection layer. Alternatively, the common layer 114 may be a stack of an electron-transport layer and an electron-injection layer, and may be a stack of a hole-transport layer and a hole-injection layer. The common layer 114 is shared by the light-emitting devices 130R, 130G, 130B, and 130IR and the light-receiving device 150.

End portions of the pixel electrodes each preferably have a tapered shape. When the end portions of the pixel electrodes each have a tapered shape, the first layer 113*a*, the second layer 113*b*, and the third layer 113*c* provided along the side surfaces of the pixel electrodes also each have a tapered shape. With the tapered side surfaces of the pixel electrodes, coverage with the first layer 113*a*, the second layer 113*b*, and the third layer 113*c* provided along the side surfaces of the pixel electrodes can be improved. Furthermore, with the tapered side surfaces of the pixel electrodes, a foreign substance (also referred to as dust or a particle) in the manufacturing process is easily removed by processing such as cleaning, which is preferable.

Note that in this specification and the like, a tapered shape refers to a shape such that at least part of a side surface of a component is inclined with respect to the substrate surface or the surface where the component is formed. For example, a tapered shape preferably includes a region where the angle between the inclined side surface and the substrate surface or the surface where a component is formed (such an angle is also referred to as a taper angle) is less than 90°.

In FIG. 3A and the like, regions between the pixel electrode 111*a* and the first layer 113*a*, between the pixel electrode 111*b* and the first layer 113*a*, and between the pixel electrode 111*d* and the second layer 113*b* are not covered with an insulating layer. Thus, the distance between adjacent light-emitting devices and the distance between a light-emitting device and a light-receiving device which are adjacent to each other can be extremely short. Accordingly, the display apparatus can have high resolution or high definition. In addition, a mask for forming the insulating layer is not needed, which leads to a reduction in manufacturing cost of the display apparatus.

Furthermore, light emitted by the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display apparatus of one embodiment of the present invention can significantly reduce the viewing angle dependence. A reduction in the viewing angle dependence leads to an increase in visibility of an image on the display apparatus. For example, in the display apparatus of one embodiment of the present invention, the viewing angle (the maximum angle with a certain contrast ratio maintained when the screen is seen from an oblique direction) can be more than or equal to 100° and less than 180°, preferably more than or equal to 150° and less than or equal to 170°. Note that the viewing angle refers to that in both the vertical direction and the horizontal direction.

The common electrode 115 is shared by the light-emitting devices 130R, 130G, 130B, and 130IR and the light-receiving device 150. The common electrode 115 shared by the plurality of light-emitting devices and the light-receiving device is electrically connected to a conductive layer 123 provided in the connection portion 140 (see FIG. 4A and FIG. 4B). For the conductive layer 123, a conductive layer formed using the same material and through the same process as the pixel electrode is preferably used.

Note that FIG. 4A illustrates an example in which the common layer 114 is provided over the conductive layer 123 and the conductive layer 123 and the common electrode 115 are electrically connected to each other through the common layer 114. As illustrated in FIG. 4B, the common layer 114 is not necessarily provided in the connection portion 140. In FIG. 4B, the conductive layer 123 and the common electrode 115 are directly connected to each other. For example, by using a mask for specifying a film formation area (also referred to as an area mask or a rough metal mask to be distinguished from a fine metal mask), the common layer 114 and the common electrode 115 can be formed in different regions.

Figure 5A:
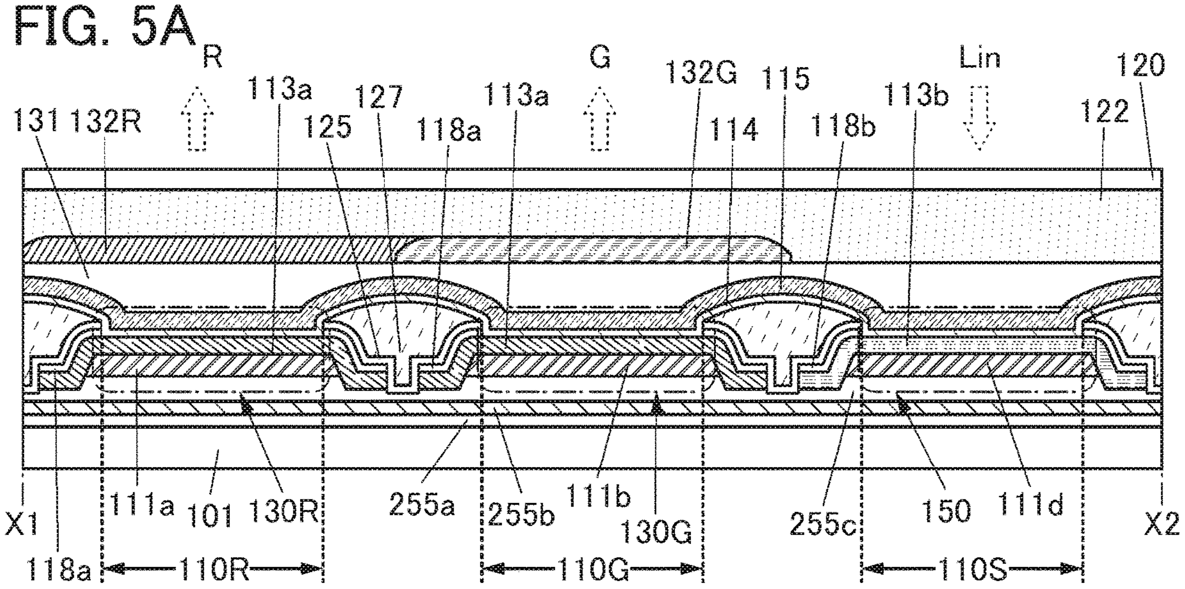
FIG. 5A and FIG. 5B are cross-sectional views illustrating an example of a display apparatus.
Figure 5B:
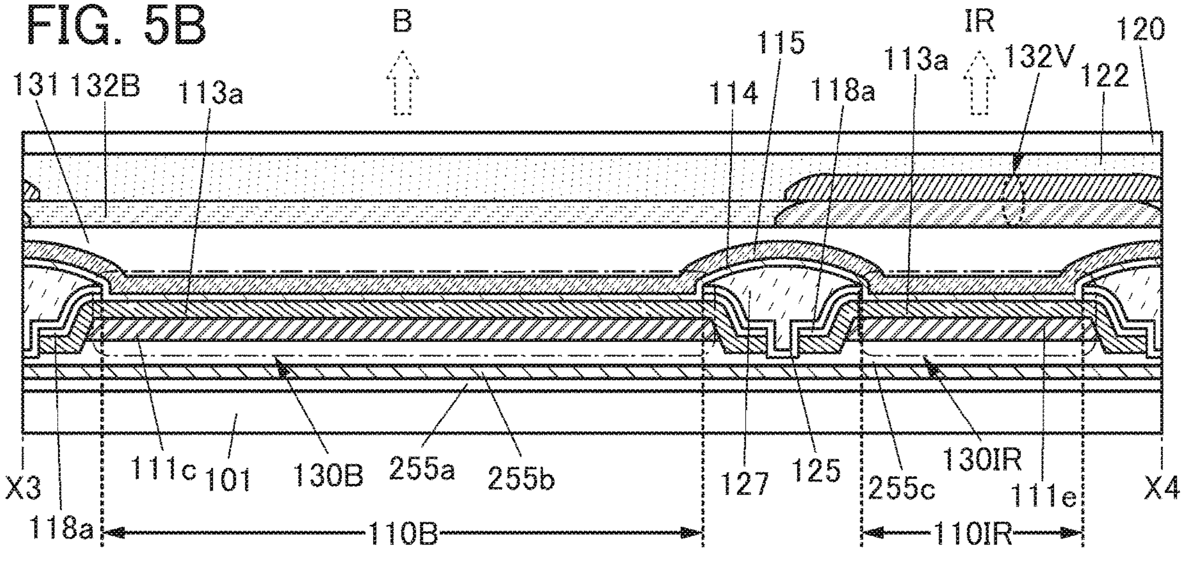

FIG. 5A is a cross-sectional view taken along the dashed-dotted line X1-X2 in FIG. 1, and FIG. 5B is a cross-sectional view taken along the dashed-dotted line X3-X4 in FIG. 1.

A cross-sectional structure illustrated in FIG. 5A is similar to that in FIG. 3A. A cross-sectional structure illustrated in FIG. 5B is different from that in FIG. 3B in that the light-emitting device 130IR does not include the third layer 113*c* and includes the first layer 113*a* and that a coloring layer 132V is provided in the subpixel 110IR.

FIG. 5A and FIG. 5B illustrate an example in which light-emitting devices including EL layers with the same structure are used for subpixels emitting R light, G light, B light, and IR light.

When the light-emitting devices 130R, 130G, 130B, and 130IR include EL layers with the same structure, the steps of manufacturing the display apparatus can be reduced, which can reduce the manufacturing cost and increase the manufacturing yield.

Detailed description of portions of the subpixels 110R, 110G, 110B, and 110S similar to those in FIG. 3A and FIG. 3B are omitted.

The subpixel 110IR includes the light-emitting device 130IR and the coloring layer 132V transmitting infrared light. Thus, light emitted from the light-emitting device 130IR is extracted as infrared light to the outside of the display apparatus through the coloring layer 132V.

The coloring layer 132V has a function of a visible-light cut filter. FIG. 5B illustrates an example in which a stacked layer of the coloring layer 132G and the coloring layer 132R is included as the coloring layer 132V. The coloring layer 132V is not particularly limited as long as it blocks visible light and transmits infrared light. For example, the coloring layer 132V is preferably formed by stacking two or more of the coloring layers 132R, 132G, and 132B, in which case the manufacturing steps can be reduced as compared with the case where the coloring layer 132V is formed separately.

For example, the first layer 113*a* can contain a light-emitting material emitting blue light, a light-emitting material emitting visible light having a longer wavelength than blue light, and a light-emitting material emitting infrared light. For example, a structure containing a light-emitting material emitting blue light, a light-emitting material emitting yellow light, and a light-emitting material emitting infrared light or a structure containing a light-emitting material emitting blue light, a light-emitting material emitting green light, a light-emitting material emitting red light, and a light-emitting material emitting infrared light can be used for the first layer 113*a*.

As the light-emitting devices 130R, 130G, 130B and 130IR, it is possible to use, for example, a single-structure light-emitting device including three light-emitting layers, which are a light-emitting layer emitting yellow (Y) light, a light-emitting layer emitting blue (B) light, and a light-emitting layer emitting infrared light (IR), or a single-structure light-emitting device including four light-emitting layers, which are a light-emitting layer emitting red (R) light, a light-emitting layer emitting green (G) light, a light-emitting layer emitting blue light, and a light-emitting layer emitting infrared light. As examples of the number of stacked light-emitting layers and the order of colors thereof, a four-layer structure of IR, R, G, and B and a four-layer structure of IR, R, B, and G from the anode side can be given. Another layer may be provided between two light-emitting layers.

In the case where the light-emitting device with a tandem structure is used, examples of applicable structures are as follows: a two-unit tandem structure of a light-emitting unit emitting infrared light and yellow light and a light-emitting unit emitting blue light; a three-unit tandem structure of a light-emitting unit emitting infrared light, a light-emitting unit emitting yellow light, and a light-emitting unit emitting blue light; a two-unit tandem structure of a light-emitting unit emitting infrared light, red light, and green light and a light-emitting unit emitting blue light; a three-unit tandem structure of a light-emitting unit emitting infrared light, a light-emitting unit emitting red light and green light, and a light-emitting unit emitting blue light; and a three-unit tandem structure in which a light-emitting unit emitting blue light, a light-emitting unit emitting yellow light, yellowish green light, or green light, red light, and infrared light, and a light-emitting unit emitting blue light are included in this order. For example, as for the number of stacked light-emitting units and the order of colors thereof in the above tandem structures, a structure in which a light-emitting unit emitting IR light is added or a structure in which a light-emitting layer emitting IR light is added to the light-emitting unit X can be used.

As illustrated in FIG. 3A, FIG. 3B, and the like, in the display apparatus, an insulating layer is provided over a layer 101 including a transistor, light-emitting devices and light-receiving devices are provided over the insulating layer, and the protective layer 131 is provided to cover these light-emitting devices and the light-receiving devices. Coloring layers 132R, 132G, and 132B are provided over the protective layer 131, and a substrate 120 is bonded onto the protective layer 131 with a resin layer 122. In a region between adjacent light-emitting devices and a region between a light-emitting device and a light-receiving device which are adjacent to each other, an insulating layer 125 and an insulating layer 127 over the insulating layer 125 are provided.

Although FIG. 3A, FIG. 3B, and the like illustrate a plurality of cross sections of the insulating layer 125 and the insulating layers 127, the insulating layer 125 and the insulating layer 127 are each a continuous layer when the display apparatus is seen from above. In other words, the display apparatus can have a structure such that one insulating layer 125 and one insulating layer 127 are provided, for example. Note that the display apparatus may include a plurality of insulating layers 125 that are separated from each other and a plurality of insulating layers 127 that are separated from each other.

A stacked-layer structure in which a plurality of transistors are provided over a substrate and an insulating layer is provided to cover these transistors can be employed for the layer 101 including a transistor, for example. The insulating layer over the transistors may have a single-layer structure or a stacked-layer structure. In FIG. 3A and the like, an insulating layer 255*a*, an insulating layer 255*b* over the insulating layer 255*a*, and an insulating layer 255*c* over the insulating layer 255*b* are illustrated as the insulating layers over the transistors. These insulating layers may have a depressed portion between adjacent light-emitting devices and between a light-emitting device and a light-receiving device which are adjacent to each other. In the example illustrated in FIG. 3A and the like, the insulating layer 255*c* has a depressed portion. Note that the insulating layers (the insulating layer 255*a* to the insulating layer 255*c*) over the transistors may be regarded as part of the layer 101 including a transistor.

As each of the insulating layer 255*a*, the insulating layer 255*b*, and the insulating layer 255*c*, a variety of inorganic insulating films such as an oxide insulating film, a nitride insulating film, an oxynitride insulating film, and a nitride oxide insulating film can be suitably used. As each of the insulating layer 255*a* and the insulating layer 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferable that a silicon oxide film be used as each of the insulating layer 255*a* and the insulating layer 255*c*, and a silicon nitride film be used as the insulating layer 255*b*. The insulating layer 255*b* preferably has a function of an etching protective film.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

Structure examples of the layer 101 including a transistor will be described later in Embodiment 3 and Embodiment 4.

The protective layer 131 is preferably included over the light-emitting devices and the light-receiving device. Providing the protective layer 131 can enhance the reliability of the light-emitting devices and the light-receiving device. The protective layer 131 may have a single-layer structure or a stacked-layer structure of two or more layers.

There is no limitation on the conductivity of the protective layer 131. As the protective layer 131, at least one type of an insulating film, a semiconductor film, and a conductive film can be used.

The protective layer 131 including an inorganic film can inhibit deterioration of the light-emitting devices by preventing oxidation of the common electrode 115 and inhibiting entry of impurities (e.g., moisture and oxygen) into the light-emitting devices and the light-receiving device, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a magnesium oxide film, a gallium oxide film, a germanium oxide film, an yttrium oxide film, a zirconium oxide film, a lanthanum oxide film, a neodymium oxide film, a hafnium oxide film, a tantalum oxide film, and the like. Examples of the nitride insulating film include a silicon nitride film, an aluminum nitride film, and the like. Examples of the oxynitride insulating film include a silicon oxynitride film, an aluminum oxynitride film, and the like. Examples of the nitride oxide insulating film include a silicon nitride oxide film, an aluminum nitride oxide film, and the like.

In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted by the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (such as water and oxygen) into the EL layer.

Furthermore, the protective layer 131 may include an organic film. For example, the protective layer 131 may include both an organic film and an inorganic film.

The protective layer 131 may have a stacked-layer structure of two layers which are formed by different deposition methods. Specifically, the first layer of the protective layer 131 may be formed by an atomic layer deposition (ALD) method, and the second layer of the protective layer 131 may be formed by a sputtering method.

The side surfaces of the first layer 113*a*, the second layer 113*b*, and the third layer 113*c* are covered with the insulating layer 125 and the insulating layer 127. Thus, the common layer 114 (or the common electrode 115) can be inhibited from being in contact with the side surface of any of the pixel electrode, the first layer 113*a*, the second layer 113*b*, and the third layer 113*c*, whereby a short circuit of the light-emitting device and the light-receiving device can be inhibited. Thus, the reliability of the light-emitting device and the light-receiving device can be increased.

The insulating layer 125 can be in contact with the side surfaces of the first layer 113*a*, the second layer 113*b*, and the third layer 113*c*. When the insulating layer 125 or the insulating layer 127 is in contact with the first layer 113*a*, the second layer 113*b*, and the third layer 113*c*, peeling of the first layer 113*a*, the second layer 113*b*, and the third layer 113*c* can be inhibited. The close contact of the insulating layer with the first layer 113*a*, the second layer 113*b*, or the third layer 113*c* brings an effect of fixing or adhering the adjacent first layers 113*a* or the like by the insulating layer. Thus, the reliability of the light-emitting device and the light-receiving device can be increased. Moreover, the manufacturing yield of the light-emitting device and the light-receiving device can be increased.

FIG. 3A, FIG. 3B, and the like illustrate a structure in which end portions of the pixel electrodes are covered with the first layer 113*a*, the second layer 113*b*, or the third layer 113*c*, and the insulating layer 125 is in contact with the side surfaces of the first layer 113*a*, the second layer 113*b*, and the third layer 113*c*.

The insulating layer 127 is provided over the insulating layer 125 to fill a depressed portion in the insulating layer 125. The insulating layer 127 can overlap with the side surfaces (in other words, the insulating layer 127 can cover the side surfaces) of the first layer 113*a*, the second layer 113*b*, and the third layer 113*c* with the insulating layer 125 therebetween. The insulating layer 127 may overlap with the side surfaces of the pixel electrode through the insulating layer 125.

The insulating layer 125 and the insulating layer 127 can fill a gap between adjacent island-shaped layers, whereby the formation surfaces of layers (e.g., the carrier-injection layer and the common electrode) provided over the island-shaped layers can be less uneven and can be flatter. Thus, the coverage with the carrier-injection layer, the common electrode, and the like can be increased and disconnection of the common electrode can be prevented.

Note that in this specification and the like, disconnection refers to a phenomenon in which a layer, a film, or an electrode is split because of the shape of the formation surface (e.g., a level difference).

The common layer 114 and the common electrode 115 are provided over the first layer 113*a*, the second layer 113*b*, the third layer 113*c*, the insulating layer 125, and the insulating layer 127. At the stage before the insulating layer 125 and the insulating layer 127 are provided, a step due to a region where a pixel electrode and the first layer 113*a*, the second layer 113*b*, or the third layer 113*c* are provided and a region where these are not provided (a region between light-emitting devices, a region between light-receiving devices, or a region between a light-emitting device and a light-receiving device) is generated. In the display apparatus of one embodiment of the present invention, the step can be planarized with the insulating layer 125 and the insulating layer 127, and the coverage with the common layer 114 and the common electrode 115 can be improved. Consequently, it is possible to inhibit a connection defect due to disconnection of the common electrode 115. Alternatively, an increase in electrical resistance due to local thinning of the common electrode 115 by the step can be inhibited.

The insulating layer 125 and the insulating layer 127 can each have a variety of shapes. To improve the planarity of a surface over which the common layer 114 and the common electrode 115 are formed, the levels of the top surface of the insulating layer 125 and the top surface of the insulating layer 127 are aligned or substantially aligned with the level of the top surface (also referred to as the level of the end portion of the top surface) of the first layer 113*a*, the second layer 113*b*, and the third layer 113*c* at their end portions. The top surface of the insulating layer 127 may have a flat shape and may have a protruding portion, a convex curved surface, a concave curved surface, or a depressed portion.

In FIG. 3A, FIG. 3B, and the like, a sacrificial layer 118*a* is positioned over the first layer 113*a*, a sacrificial layer 118*b* is positioned over the second layer 113*b*, and a sacrificial layer 118*c* is positioned over the third layer 113*c*. In FIG. 3A and the like, one end portion of the sacrificial layer 118*a* is aligned or substantially aligned with an end portion of the first layer 113*a*, and the other end portion of the sacrificial layer 118*a* is positioned over the first layer 113*a*. As described above, in the display apparatus of one embodiment of the present invention, part of the sacrificial layer used for protecting the first layer 113*a*, the second layer 113*b*, and the third layer 113*c* which are used in manufacturing the display apparatus may remain. For example, the sacrificial layer may remain between the first layer 113*a*, the second layer 113*b*, or the third layer 113*c* and the insulating layer 125 or the insulating layer 127. The sacrificial layer will be described in detail in Embodiment 2.

Figure 6A:
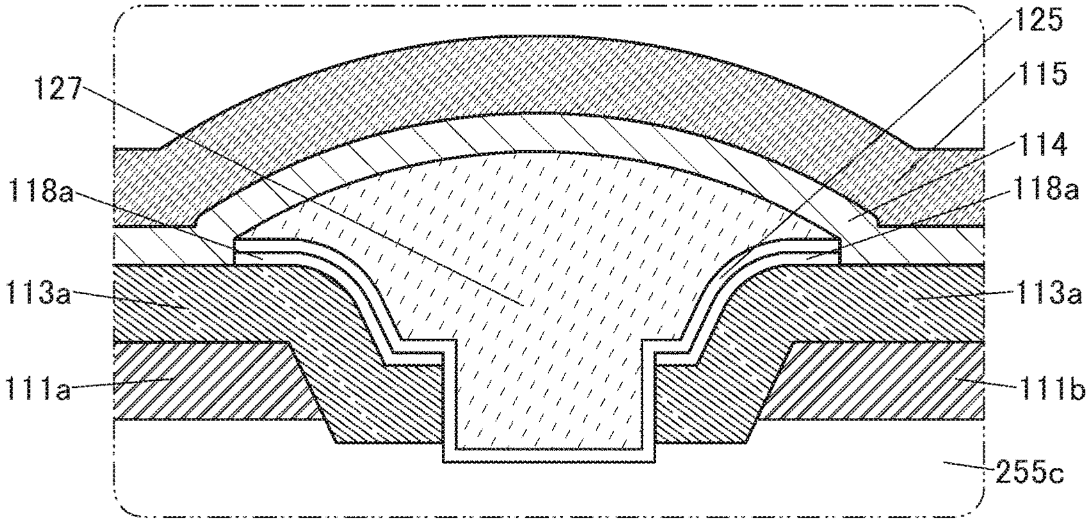
FIG. 6A to FIG. 6C are cross-sectional views illustrating examples of a display apparatus.
Figure 6B:
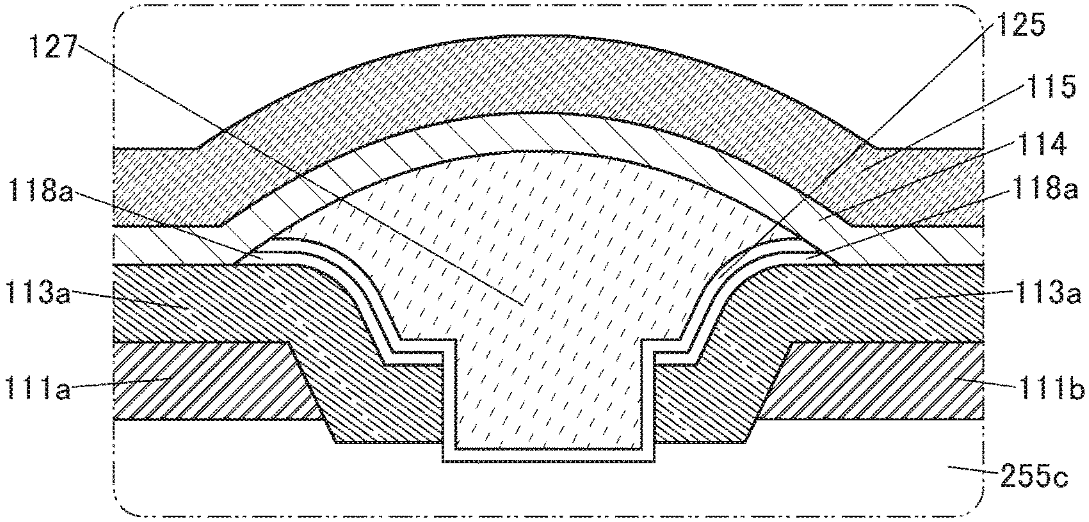
Figure 6C:
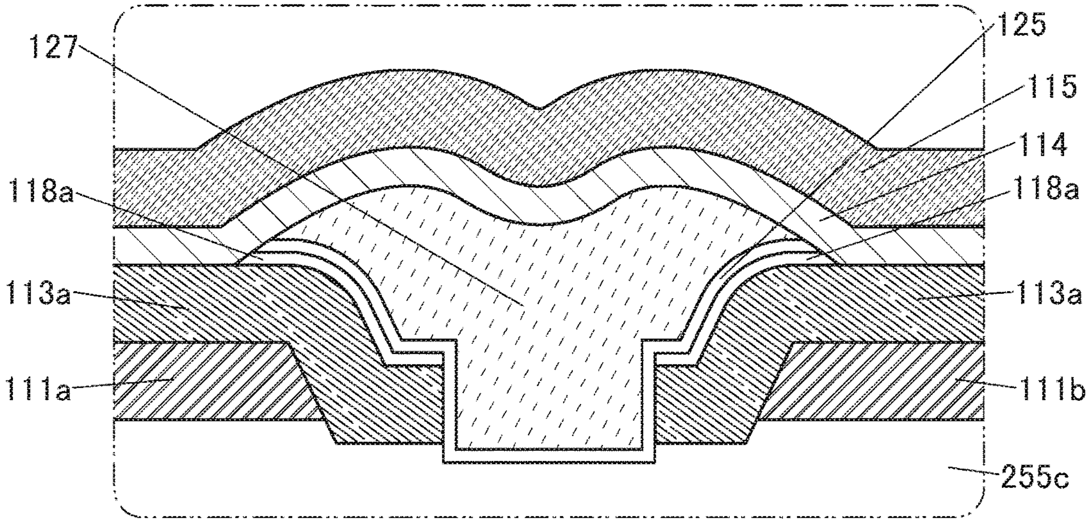

FIG. 6A to FIG. 6C each illustrate a cross-sectional structure of a region including the insulating layer 127 and its surroundings.

As illustrated in FIG. 6A to FIG. 6C, the pixel electrodes 111*a* and 111*b* each have a tapered shape. The first layer 113*a* is provided to cover an end portion of the pixel electrode 111*a*, and the first layer 113*a* also has a tapered portion. Similarly, the first layer 113*a* is provided to cover an end portion of the pixel electrode 111*b*, and the first layer 113*a* also has a tapered portion.

The sacrificial layer 118*a* is provided over the first layer 113*a*, and the sacrificial layer 118*a* includes a portion overlapping with the pixel electrode 111*a* or the pixel electrode 111*b* with the first layer 113*a* therebetween. Note that the sacrificial layer 118*a* does not necessarily include the portion overlapping with the pixel electrode 111*a* or the pixel electrode 111*b*.

The insulating layer 125 is provided to cover the first layer 113*a*, the sacrificial layer 118*a*, and the insulating layer 255*c*. The insulating layer 125 is in contact with a top surface and a side surface of the sacrificial layer 118*a*, a side surface of the first layer 113*a*, and a top surface of the insulating layer 255*c*. The insulating layer 127 is provided over the insulating layer 125. The insulating layer 127 overlaps with the pixel electrodes 111*a* and 111*b*, the first layer 113*a*, and the sacrificial layer 118*a* with the insulating layer 125 therebetween.

When one or both of the insulating layer 125 and the insulating layer 127 cover not only the side surface of the first layer 113*a* but also the top surface thereof, peeling of the first layer 113*a* can further be prevented and the reliability of the light-emitting devices can be improved. In addition, the manufacturing yield of the light-emitting devices can further be increased. Note that the insulating layer 125 and the insulating layer 127 do not necessarily overlap with the pixel electrodes 111*a* and 111*b*, the first layer 113*a*, and the sacrificial layer 118*a*.

The common layer 114 and the common electrode 115 are provided over the first layer 113*a* and the insulating layer 127.

FIG. 6A illustrates an example in which the end portion of the sacrificial layer 118*a* and an end portion of the insulating layer 125 are substantially perpendicular to a surface of the first layer 113*a*. As illustrated in FIG. 6B, the end portion of the sacrificial layer 118*a* and the end portion of the insulating layer 125 preferably have a tapered shape. This can further improve the coverage with the common layer 114 and the common electrode 115.

FIG. 6A illustrates an example in which the top surface of the insulating layer 127 has a convex surface. As illustrated in FIG. 6C, the top surface of the insulating layer 127 may have both a convex surface and a concave surface.

The insulating layer 125 can be formed using an inorganic material. The insulating layer 125 may have a single-layer structure or a stacked-layer structure. As the insulating layer 125, an inorganic insulating film such as an oxide insulating film, a nitride insulating film, an oxynitride insulating film, or a nitride oxide insulating film can be used, for example. Details of these inorganic films are described as in the description of the protective layer 131.

In particular, aluminum oxide is preferable because it has high selectivity with respect to the EL layer in etching and has a function of protecting the EL layer in formation of the insulating layer 127. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting the diffusion of at least one of water and oxygen. Alternatively, the insulating layer 125 preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a targeted substance (also referred to as having low permeability). Alternatively, a barrier property refers to a function of capturing or fixing (also referred to as gettering) a targeted substance.

When the insulating layer 125 has a function of the barrier insulating layer or a gettering function, entry of impurities (typically, at least one of water and oxygen) that would diffuse into the light-emitting device and the light-receiving device from the outside can be inhibited. With this structure, a highly reliable light-emitting device, a highly reliable light-receiving device, and a highly reliable display apparatus can be provided.

The insulating layer 125 preferably has a low impurity concentration. In this case, deterioration of the EL layer due to entry of impurities from the insulating layer 125 into the EL layer can be inhibited. In addition, when the impurity concentration is reduced in the insulating layer 125, a barrier property against at least one of water and oxygen can be increased. For example, the insulating layer 125 preferably has one of a sufficiently low hydrogen concentration and a sufficiently low carbon concentration, desirably has both of them.

The insulating layer 127 provided over the insulating layer 125 has a function of reducing the depressed portions of the insulating layer 125 formed between adjacent light-emitting devices and between a light-emitting device and a light-receiving device which are adjacent to each other. In other words, the insulating layer 127 brings an effect of improving the planarity of a surface where the common electrode 115 is formed. As the insulating layer 127, an insulating layer containing an organic material can be suitably used. For the insulating layer 127, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used, for example. Examples of organic materials that may be used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. Alternatively, a photosensitive resin can be used for the insulating layer 127. A photoresist may be used as the photosensitive resin. As the photosensitive resin, a positive photosensitive material or a negative photosensitive material can be used.

A material absorbing visible light may be used for the insulating layer 127. When the insulating layer 127 absorbs light emitted by the light-emitting device, leakage of light (stray light) from the light-emitting device to the adjacent light-emitting device through the insulating layer 127 can be inhibited. Thus, the display quality of the display apparatus can be improved. Since no polarizing plate is required to improve the display quality, the weight and thickness of the display apparatus can be reduced. In addition, light can be prevented from entering an adjacent light-receiving device from the light-emitting device through the insulating layer 127. Accordingly, the light detection accuracy of the display apparatus can be improved.

Examples of the material absorbing visible light include a material containing a pigment of black or any other color, a material containing a dye, a light-absorbing resin material (e.g., polyimide), and a resin material that can be used for color filters (a color filter material). Using a resin material obtained by stacking or mixing color filter materials of two or more colors is particularly preferred to enhance the effect of blocking visible light.

In the case where each of the side surfaces of the first layer 113*a*, the second layer 113*b*, and the third layer 113*c* is in direct contact with the organic resin film, these layers might be damaged by an organic solvent that can be contained in the organic resin film. When the insulating layer 125 (i.e., an inorganic insulating film) is provided, a structure in which the organic resin film is not in direct contact with the side surfaces of the first layer 113*a*, the second layer 113*b*, and the third layer 113*c* can be achieved. Thus, the first layer 113*a*, the second layer 113*b*, and the third layer 113*c* can be prevented from being dissolved by the organic solvent, for example.

A light-blocking layer may be provided on the surface of the substrate 120 on the resin layer 122 side. Moreover, a variety of optical members can be provided on the outer side of the substrate 120. Examples of optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be provided as a surface protective layer on the outer surface of the substrate 120. For example, it is preferable to provide, as the surface protective layer, a glass layer or a silica layer ($SiO_x$ layer) because the surface contamination or damage can be inhibited from being generated. For the surface protective layer, DLC (diamond like carbon), aluminum oxide ($AlO_x$), a polyester-based material, a polycarbonate-based material, or the like may be used. For the surface protective layer, a material having a high visible-light transmittance is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material which transmits the light. When a flexible material is used for the substrate 120, the display apparatuses can have increased flexibility and a flexible display can be obtained. Furthermore, a polarizing plate may be used as the substrate 120.

For the substrate 120, it is possible to use, for example, polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass thin enough to have flexibility may be used as the substrate 120.

In the case where a circularly polarizing plate overlaps with the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display apparatus might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A single-layer structure or a stacked-layer structure including a film containing one or more of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. They can also be used for conductive layers such as wirings and electrodes included in the display apparatus, and conductive layers (e.g., a conductive layer functioning as a pixel electrode or a counter electrode) included in a light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

FIG. 3A and the like illustrate an example in which the coloring layers 132R, 132G, and 132B are directly provided over the light-emitting devices 130R, 130G, and 130B with the protective layer 131 therebetween. With such a structure, the alignment accuracy of the light-emitting devices and the coloring layers can be improved. Furthermore, the structure is preferable because the distance between the light-emitting devices and the coloring layers can be reduced, so that color mixing can be inhibited and the viewing angle characteristics can be improved.

Figure 7A:
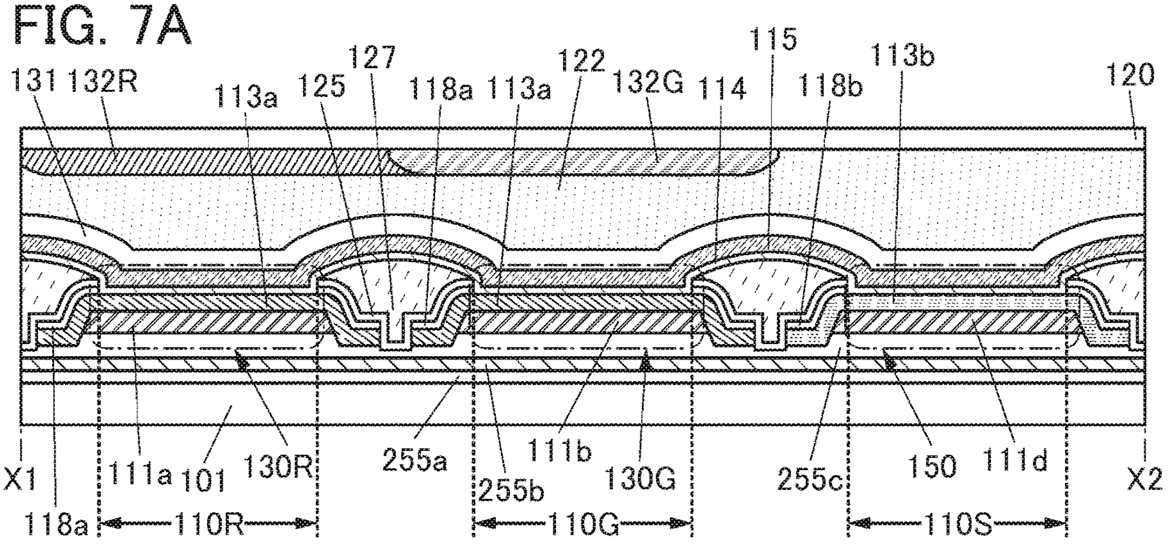
FIG. 7A to FIG. 7C are cross-sectional views illustrating examples of a display apparatus.
Figure 7B:
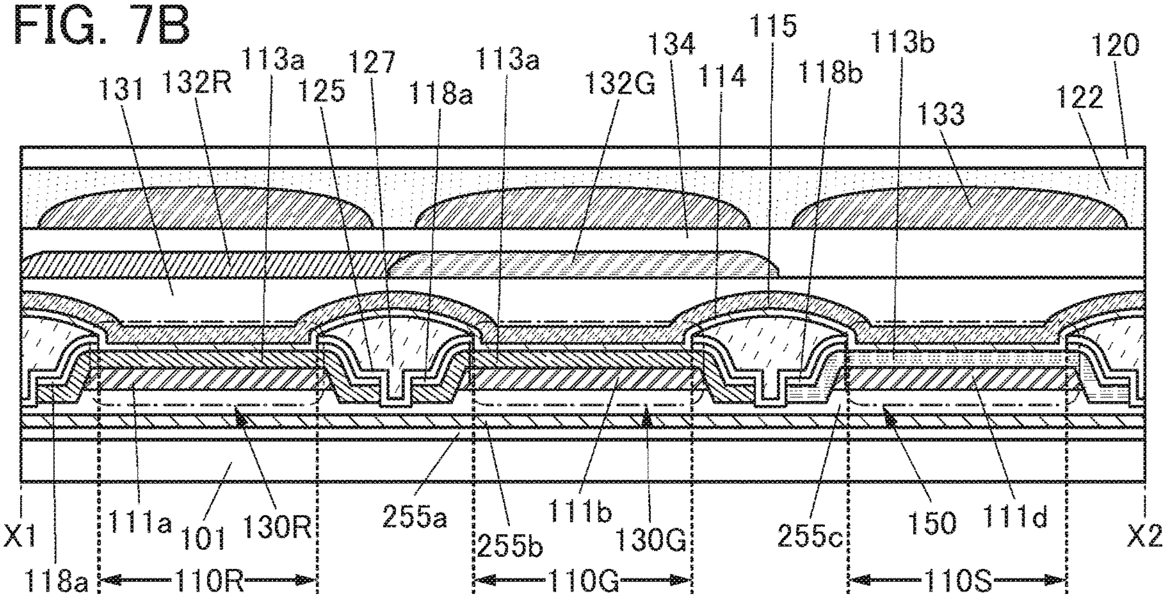
Figure 7C:
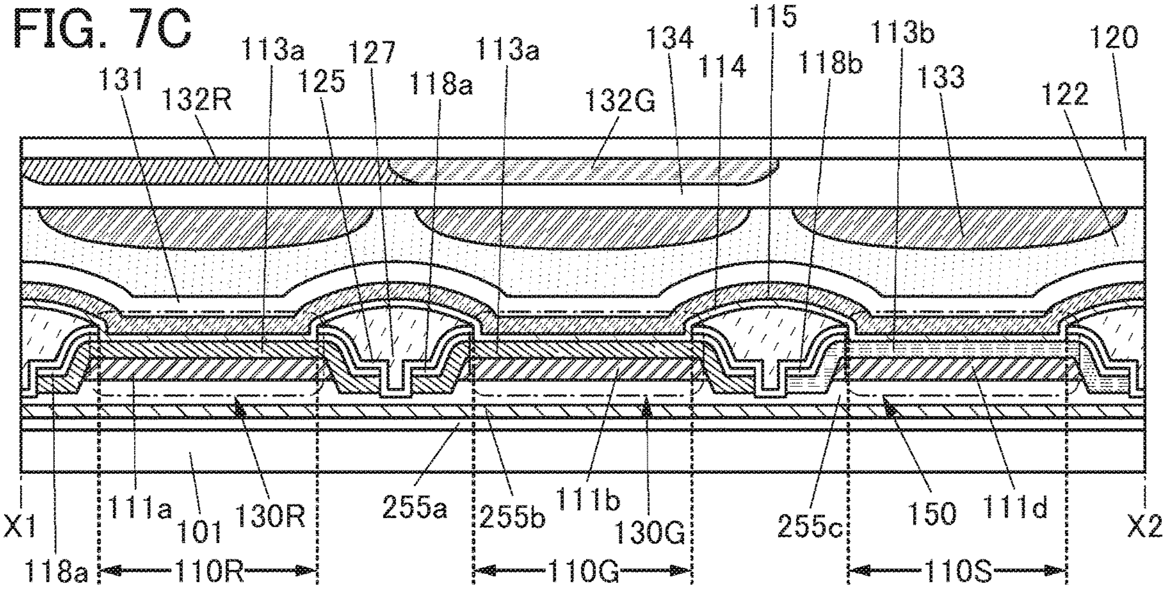

FIG. 7A to FIG. 7C are cross-sectional views taken along the dashed-dotted line X1-X2 in FIG. 1.

As illustrated in FIG. 7A, the substrate 120 provided with the coloring layers may be attached to the protective layer 131 with the resin layer 122. The coloring layers are provided on the substrate 120, whereby the heat treatment temperature in the process of forming the coloring layers can be increased.

As illustrated in FIG. 7B and FIG. 7C, a lens array 133 may be provided in the display apparatus. The lens array 133 can be provided to overlap with one or both of a light-emitting device and a light-receiving device.

FIG. 7B illustrates an example in which the coloring layers 132R and 132G are provided over the light-emitting devices 130R and 130G with the protective layer 131 therebetween, an insulating layer 134 is provided over the coloring layers 132R and 132G, and the lens array 133 is provided over the insulating layer 134. In FIG. 7B, the lens array 133 is provided also over the light-receiving device 150 with the protective layer 131 and the insulating layer 134 therebetween. The coloring layer 132R, the coloring layer 132G, and the lens array 133 are directly formed over the substrate provided with the light-emitting devices and the light-receiving devices, whereby the accuracy of positional alignment of the light-emitting device or the light-receiving device and the coloring layer or the lens array can be enhanced.

For the insulating layer 134, one or both of an inorganic insulating film and an organic insulating film can be used. The insulating layer 134 may have either a single-layer structure or a stacked-layer structure. The insulating layer 134 can be formed using a material that can be used for the protective layer 131, for example. When light emitted by the light-emitting device is extracted through the insulating layer 134, the insulating layer 134 preferably has a high visible-light-transmitting property.

In FIG. 7B, light emitted by the light-emitting device passes through the coloring layer and then passes through the lens array 133, resulting in being extracted to the outside of a display panel. It is preferable to shorten the distance between the light-emitting device and the coloring layer because color mixing can be inhibited and the viewing angle characteristics can be improved. Note that a structure in which the lens array 133 is provided over the light-emitting device and the coloring layer is provided over the lens array 133 may be employed.

FIG. 7C illustrates an example in which the substrate 120 provided with the coloring layer 132R, the coloring layer 132G, and the lens array 133 is attached onto the protective layer 131 with the resin layer 122. The substrate 120 is provided with the coloring layer 132R, the coloring layer 132G, and the lens array 133, whereby the heat treatment temperature in the forming step of them can be increased.

In the example of FIG. 7C, the coloring layers 132R and 132G are provided in contact with the substrate 120, the insulating layer 134 is provided in contact with the coloring layers 132R and 132G, and the lens array 133 is provided in contact with the insulating layer 134.

In FIG. 7C, light emitted from the light-emitting device passes through the lens array 133 and then passes through the coloring layer, resulting in being extracted to the outside of the display panel. Note that a structure in which the lens array 133 is provided in contact with the substrate 120, the insulating layer 134 is provided in contact with the lens array 133, and the coloring layers are provided in contact with the insulating layer 134 may be employed. In this case, light emitted from the light-emitting device passes through the coloring layer and then passes through the lens array 133, resulting in being extracted to the outside of the display panel. Note that as illustrated in FIG. 7B and FIG. 7C, it is preferable that a region where the coloring layer 132R and the coloring layer 132G overlap with each other be provided between the adjacent lens arrays 133. When such a region where coloring layers of different colors overlap with each other is provided, color mixture of light emitted from the light-emitting devices can be inhibited.

The lens array 133 may have a convex surface facing the substrate 120 side or a convex surface facing the light-emitting device side.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used, for example. The lens array 133 may be directly formed over the substrate or the light-emitting device. Alternatively, a lens array separately formed may be attached thereto.

There is no particular limitation on the relationship in width between the pixel electrodes 111*a*, 111*b*, and 111*c* and the first layer 113*a*. There is no particular limitation on the relationship in width between the pixel electrode 111*d* and the second layer 113*b*. There is no particular limitation on the relationship in width between the pixel electrode 111*e* and the first layer 113*a* or the third layer 113*c*. FIG. 3A and the like illustrate an example in which the end portions of the first layer 113*a*, end portions of the second layer 113*b*, and end portions of the third layer 113*c* are positioned outward from the end portions of the pixel electrode. In FIG. 3A and the like, the first layer 113*a*, the second layer 113*b*, and the third layer 113*c* are formed to cover the end portions of the pixel electrode. Such a structure can increase the aperture ratio as compared with the structure in which the end portions of the first layer 113*a*, the end portions of the second layer 113*b*, and the end portions of the third layer 113*c* are positioned inward from the end portions of the pixel electrode.

When the side surfaces of the pixel electrode are covered with the first layer 113*a*, the second layer 113*b*, or the third layer 113*c*, the pixel electrode and the common electrode 115 can be prevented from being in contact with each other, which can inhibit a short-circuit of the light-emitting device and the light-receiving device. Furthermore, the distance between the light-emitting region (i.e., the region overlapping with the pixel electrode) in the first layer 113*a* and the end portion of the first layer 113*a* can be increased. Part of the end portion of the first layer 113*a* might be damaged in the process of manufacturing the display apparatus. When this portion is not used as a light-emitting region, variations in light-emitting device characteristics can be reduced, resulting in higher reliability. Note that the same applies to the third layer 113*c*. Similarly, the distance between the light-receiving region (i.e., the region overlapping with the pixel electrode) in the second layer 113*b* and the end portion of the second layer 113*b* can be increased, resulting in higher reliability.

Figure 8A:
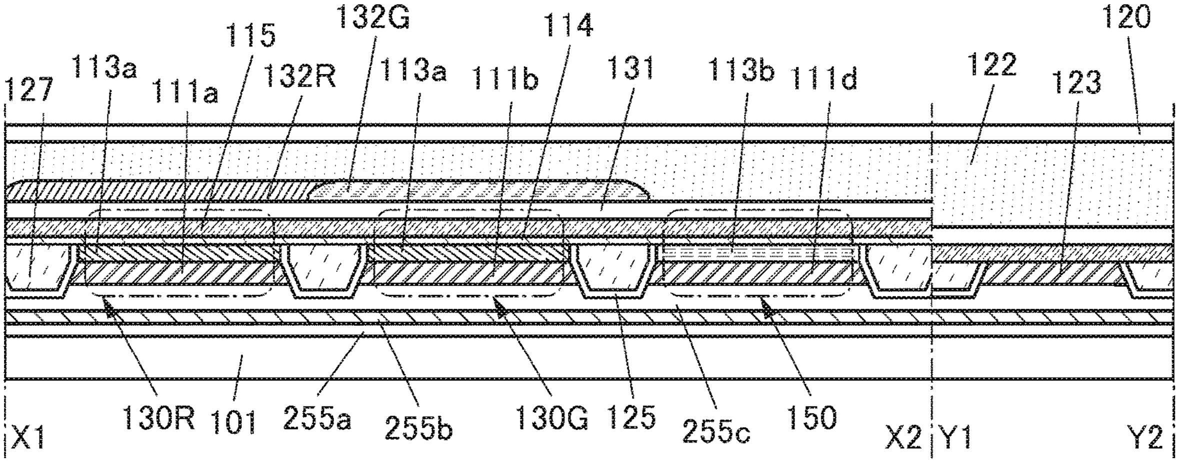
FIG. 8A and FIG. 8B are cross-sectional views illustrating examples of a display apparatus.
Figure 8B:
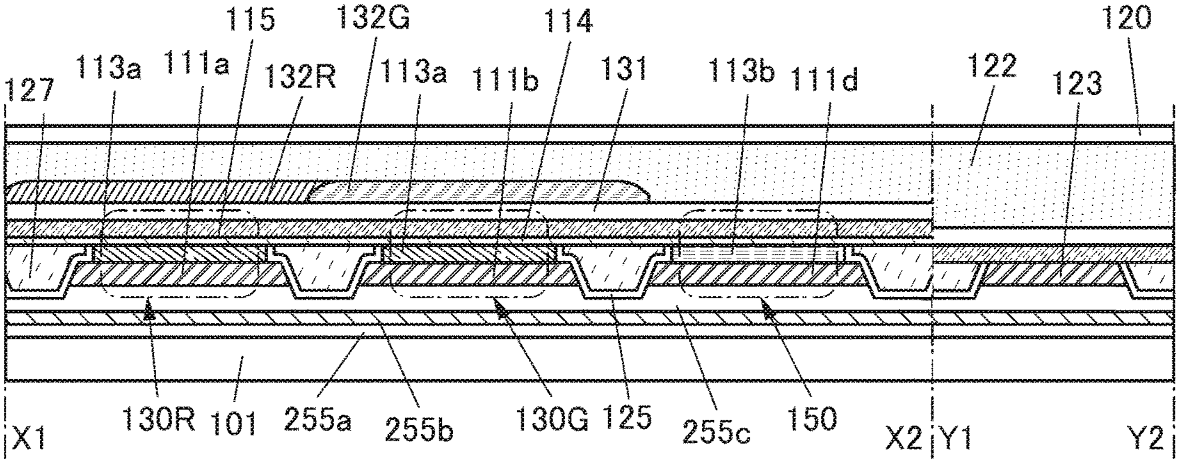

In each of FIG. 8A and FIG. 8B, a cross-sectional view taken along the dashed-dotted line X1-X2 in FIG. 1 and a cross-sectional view taken along the dashed-dotted line Y1-Y2 in FIG. 1 are shown side by side.

FIG. 8A illustrates an example in which an end portion of the top surface of the pixel electrode, the end portion of the first layer 113*a*, and the end portion of the second layer 113*b* are aligned or substantially aligned with each other. FIG. 8A illustrates an example in which the end portion of the first layer 113*a* and the end portion of the second layer 113*b* are positioned inward from an end portion of the bottom surface of the pixel electrode. FIG. 8B illustrates an example in which the end portion of the first layer 113*a* and the end portion of the second layer 113*b* are positioned inward from the end portion of the top surface of the pixel electrode. In FIG. 8A and FIG. 8B, the end portion of the first layer 113*a* and the end portion of the second layer 113*b* are positioned over the pixel electrode.

As illustrated in FIG. 8A and FIG. 8B, when the end portion of the first layer 113*a* and the end portion of the second layer 113*b* are positioned over the pixel electrode, a reduction in the thicknesses of the first layer 113*a* and the second layer 113*b* at or near the end portion of the pixel electrode can be inhibited to make the thicknesses of the first layer 113*a* and the second layer 113*b* uniform.

In the case where end portions are aligned or substantially aligned with each other and the case where top surface shapes are the same or substantially the same, it can be said that outlines of stacked layers at least partly overlap with each other in a top view. For example, the case of patterning or partly patterning an upper layer and a lower layer with use of the same mask pattern is included in the expression. However, in some cases, the outlines do not completely overlap with each other and the upper layer is positioned inward from the lower layer or the upper layer is positioned outward from the lower layer; such a case is also represented as "end portions are substantially aligned with each other" or "top surface shapes are substantially the same".

The end portion of the first layer 113*a* and the end portion of the second layer 113*b* may each have both a portion positioned outward from the end portion of the pixel electrode and a portion positioned inward from the end portion of the pixel electrode.

Figure 9A:
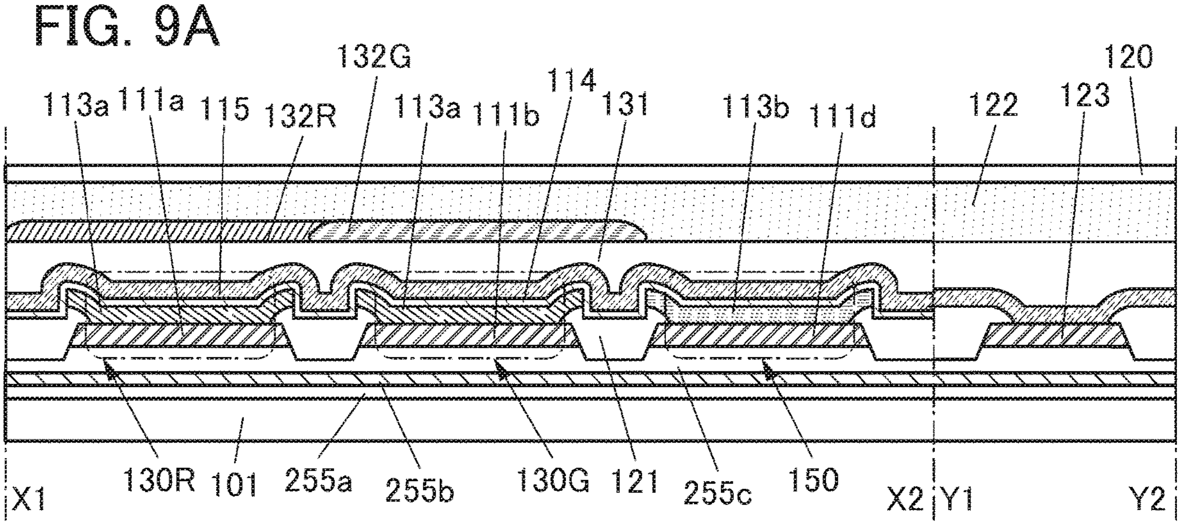
FIG. 9A to FIG. 9C are cross-sectional views illustrating examples of a display apparatus.
Figure 9B:
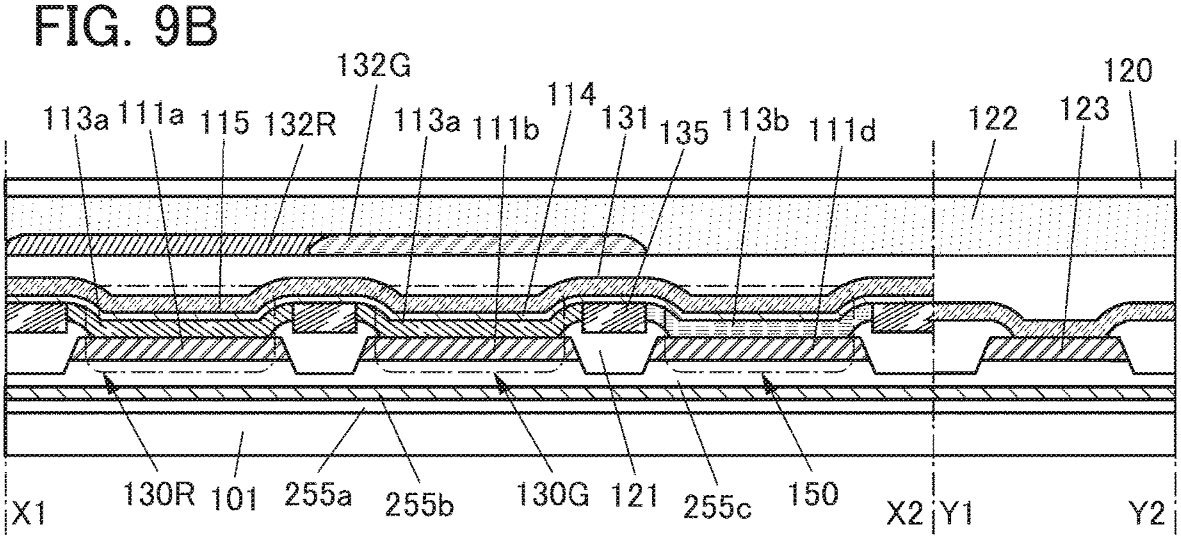
Figure 9C:
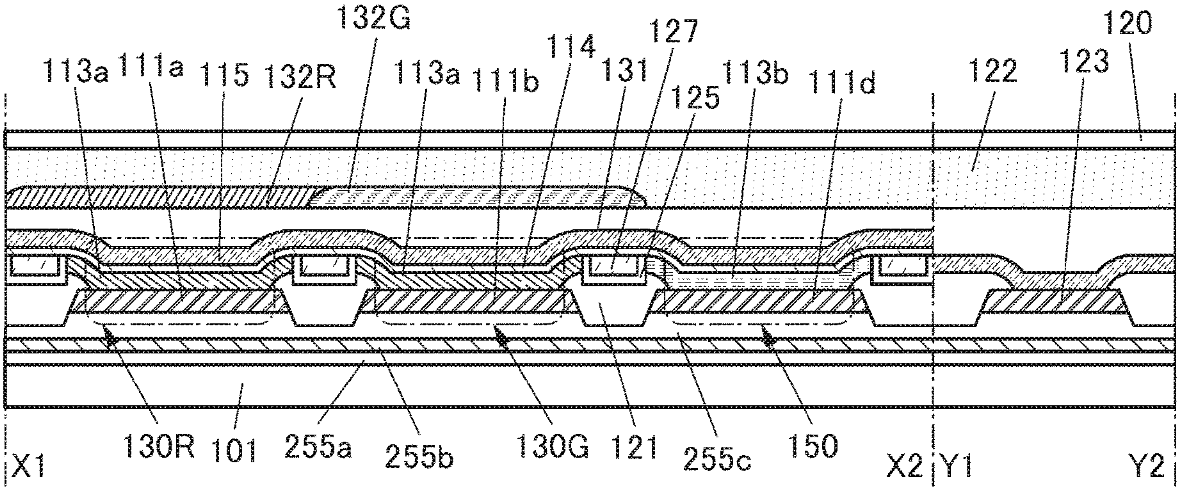

In each of FIG. 9A to FIG. 9C, a cross-sectional view taken along the dashed-dotted line X1-X2 in FIG. 1 and a cross-sectional view taken along the dashed-dotted line Y1-Y2 in FIG. 1 are shown side by side.

As illustrated in FIG. 9A to FIG. 9C, an insulating layer 121 covering the end portion of the top surface of the pixel electrode may be provided. Each of the first layer 113*a* and the second layer 113*b* can include a portion on and in contact with the pixel electrode and a portion on and in contact with the insulating layer 121. The insulating layer 121 can have a single-layer structure or a stacked-layer structure using one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layer 131 can be used.

When an inorganic insulating film is used as the insulating layer 121, impurities are less likely to enter the light-emitting device and the light-receiving device as compared with the case where an organic insulating film is used; therefore, the reliability of the light-emitting device and the light-receiving device can be improved. Furthermore, the insulating layer 121 can be thinner, so that high resolution can be easily achieved. When an organic insulating film is used as the insulating layer 121, good step coverage can be obtained as compared with the case where an inorganic insulating film is used; therefore, an influence of the shape of the pixel electrodes can be small. Therefore, a short circuit in the light-emitting device and the light-receiving device can be prevented. Specifically, when an organic insulating film is used as the insulating layer 121, the insulating layer 121 can be processed into a tapered shape or the like.

Note that the insulating layer 121 is not necessarily provided. The aperture ratio of the subpixel can be sometimes increased without providing the insulating layer 121. Alternatively, the distance between subpixels can be shortened and the resolution or the definition of the display apparatus can be sometimes increased.

Note that FIG. 9A illustrates an example in which the common layer 114 fall into a region between two first layers 113*a* over the insulating layer 121, and the like. As illustrated in FIG. 9B, a space 135 may be formed in the region.

The space 135 contains, for example, one or more selected from air, nitrogen, oxygen, carbon dioxide, and Group 18 elements (typified by helium, neon, argon, xenon, and krypton). Alternatively, a resin or the like may fill the space 135.

As illustrated in FIG. 9C, the insulating layer 125 may be provided to cover the top surface of the insulating layer 121, the side surface of the first layer 113*a*, and the side surface of the second layer 113*b*, and the insulating layer 127 may be provided over the insulating layer 125.

Figure 10A:
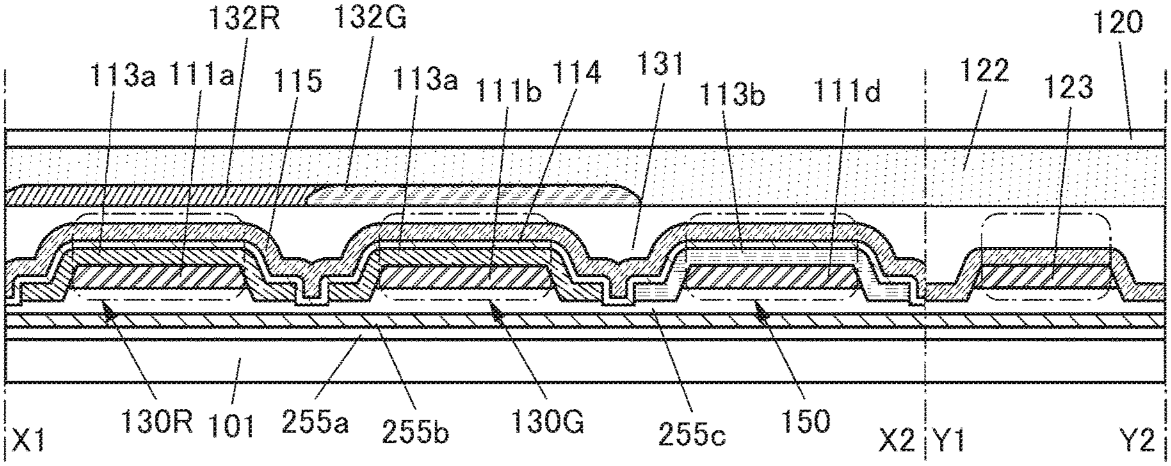
FIG. 10A to FIG. 10C are cross-sectional views illustrating examples of a display apparatus.
Figure 10B:
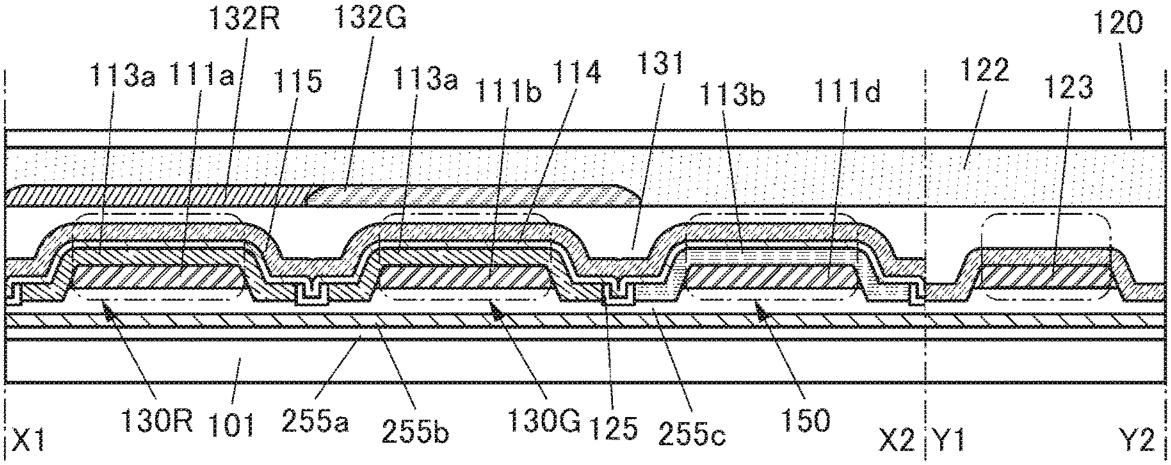
Figure 10C:
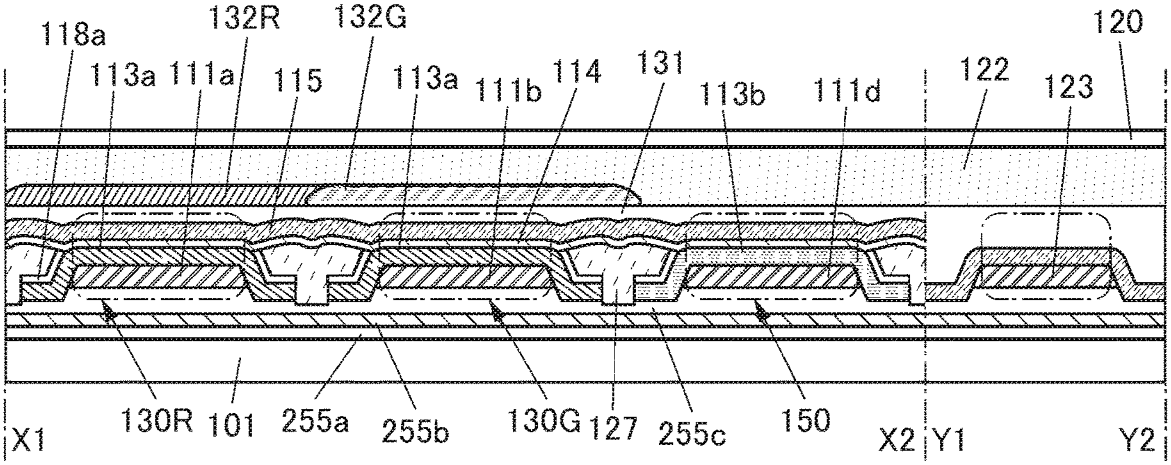

In each of FIG. 10A to FIG. 10C, a cross-sectional view taken along the dashed-dotted line X1-X2 in FIG. 1 and a cross-sectional view taken along the dashed-dotted line Y1-Y2 in FIG. 1 are shown side by side.

As illustrated in FIG. 10A, the display apparatus does not necessarily include the insulating layer 125 and the insulating layer 127. FIG. 10A illustrates an example in which the common layer 114 is provided in contact with the top surface of the insulating layer 255*c*, the side surface and the top surface of the first layer 113*a*, and the side surface and the top surface of the second layer 113*b*. Note that as illustrated in FIG. 9B, the space 135 may be provided between the adjacent first layers 113*a*, for example.

Note that one of the insulating layer 125 and the insulating layer 127 is not necessarily provided. When the insulating layer 125 is formed using an inorganic material, for example, the insulating layer 125 can be used as a protective insulating layer for the first layer 113*a* and the second layer 113*b*. This leads to higher reliability of the display apparatus. For another example, when the insulating layer 127 is formed using an organic material, the insulating layer 127 can fill a gap between adjacent first layers 113*a* and planarization can be performed. In this way, the coverage with the common electrode 115 (upper electrode) formed over the first layer 113*a*, the second layer 113*b*, and the insulating layer 127 can be increased.

FIG. 10B illustrates an example where the insulating layer 127 is not provided. Note that although the common layer

114 enters the depressed portion of the insulating layer 125 in the example illustrated in FIG. 10B, a space may be formed in the region.

FIG. 10C illustrates an example where the insulating layer 125 is not provided. In the case where the insulating layer 125 is not provided, the insulating layer 127 can be in contact with the side surfaces of the first layer 113*a* and the second layer 113*b*. The insulating layer 127 can be provided to fill, for example, the gaps between the adjacent first layers 113*a*.

In this case, an organic material that causes less damage to the first layer 113*a* and the second layer 113*b* is preferably used for the insulating layer 127. For example, it is preferable to use, for the insulating layer 127, an organic material such as polyvinyl alcohol (PVA), polyvinyl butyral, polyvinyl pyrrolidone, polyethylene glycol, polyglycerin, pullulan, water-soluble cellulose, or alcohol-soluble polyamide resin.

As described above, the display apparatus of this embodiment includes, in a pixel, a subpixel including a light-emitting device used for image display, a subpixel including a light-emitting device used as a light source, and a subpixel including a light-receiving device used for image capturing. This structure enables multifunctionalization of an electronic device.

This embodiment can be combined with the other embodiments as appropriate. In this specification, in the case where a plurality of structure examples are described in one embodiment, the structure examples can be combined as appropriate.

Embodiment 2

In this embodiment, a method of manufacturing the display apparatus of one embodiment of the present invention will be described with reference to FIG. 11 to FIG. 13. Note that as for a material and a formation method of each component, portions similar to those described in Embodiment 1 are not described in some cases. The details of structures of the light-emitting device and the light-receiving device will be described in Embodiment 4 and Embodiment 5.

In each of FIG. 11A to FIG. 11D, FIG. 12A to FIG. 12C, and FIG. 13A to FIG. 13C, a cross-sectional view taken along the dashed-dotted line X1-X2 in FIG. 1A, a cross-sectional view taken along the dashed-dotted line X3-X4 in FIG. 1A, and a cross-sectional view taken along the dashed-dotted line Y1-Y2 in FIG. 1A are shown side by side.

Thin films that form the display apparatus (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method is a metal organic chemical vapor deposition (MOCVD) method.

Alternatively, the thin films included in the display apparatus (insulating films, semiconductor films, conductive films, and the like) can be formed by a wet film formation method such as spin coating, dipping, spray coating, ink-jetting, dispensing, screen printing, offset printing, a doctor knife method, slit coating, roll coating, curtain coating, or knife coating.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a hole-blocking layer, a light-emitting layer, an electron-blocking layer, an electron-transport layer, an electron-injection layer, and a charge-generation layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, a screen printing (stencil) method, an offset printing (planography) method, a flexography (relief printing) method, a gravure printing method, or a micro-contact printing method), or the like.

Thin films included in the display apparatus can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are two typical methods in a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use extreme ultraviolet light, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

Figure 11A:
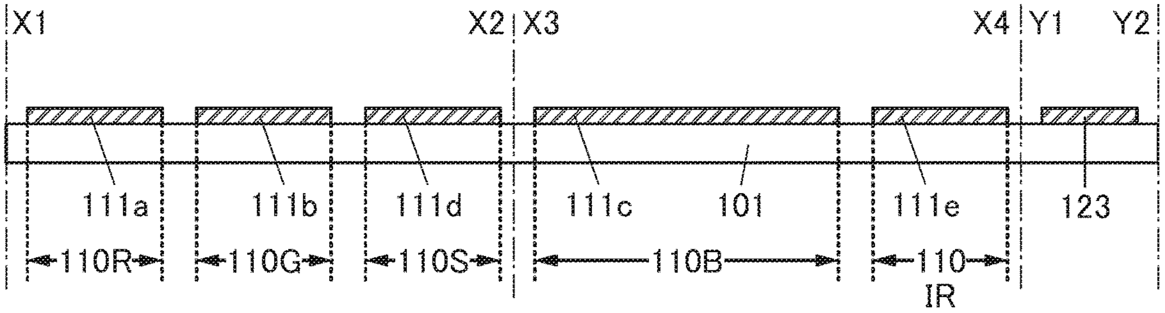
FIG. 11A to FIG. 11D are cross-sectional views illustrating an example of a manufacturing method of a display apparatus.

First, the pixel electrodes 111*a*, 111*b*, 111*c*, 111*d*, and 111*e* and the conductive layer 123 are formed over the layer 101 including a transistor (FIG. 11A). The pixel electrode can be formed by a sputtering method or a vacuum evaporation method, for example.

As illustrated in FIG. 11A, the pixel electrode 111*a* is provided in a region to be the subpixel 110R emitting red light, the pixel electrode 111*b* is provided in a region to be the subpixel 110G emitting green light, the pixel electrode 111*c* is provided in a region to be the subpixel 110B emitting blue light, the pixel electrode 111*d* is provided in a region to be the subpixel 110S having a light detection function, and the pixel electrode 111*e* is provided in a region to be the subpixel 110IR emitting infrared light.

Figure 11B:
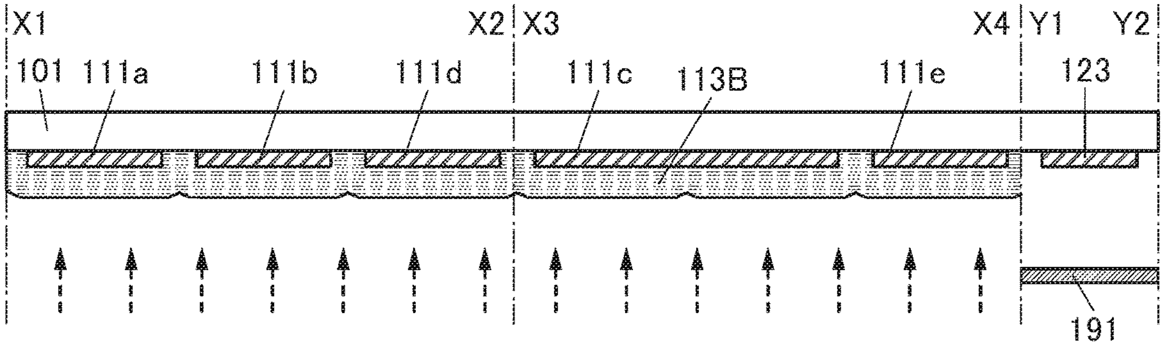

Next, an film 113B that is to be the second layer 113*b* later is formed over the pixel electrode and the layer 101 including a transistor (FIG. 11B).

Either the first layer 113*a* included in the light-emitting device or the second layer 113*b* included in the light-receiving device may be formed first. For example, when the one having higher adhesion with the pixel electrode is formed first, the film peeling in the process can be inhibited. Specifically, in the case where the first layer 113*a* has higher adhesion with the pixel electrode than the second layer 113*b*, the first layer 113*a* is preferably formed first. For another example, when the one having a smaller thickness is formed first, a shadow of the layer formed first is prevented from being generated and thus, the layer formed later can be prevented from being formed uneven. Specifically, in the case where a light-emitting device with a tandem structure is formed, the first layer 113*a* often has a larger thickness than the second layer 113*b*, and thus the second layer 113*b* is preferably formed first. For another example, when a film is formed with use of a high molecular material by a wet method, the film is preferably formed first. Specifically, in the case where a high molecular material is used for an active layer, the second layer 113*b* is preferably formed first. The order of forming layers is determined in accordance with a material, a film formation method, and the like as described above, whereby the manufacturing yield of the display apparatus can be increased.

As illustrated in FIG. 11B, the film 113B is not formed over the conductive layer 123 in the cross-sectional view along the dashed-dotted line Y1-Y2. For example, a mask 191 for specifying a film formation area (also referred to as an area mask or a rough metal mask to be distinguished from a fine metal mask) is used, so that the film 113B can be formed only in a desired region. A light-emitting device and a light-receiving device can be manufactured through a relatively simple process, by employing a film formation step using an area mask and a processing step using a resist mask.

The film 113B can be formed by an evaporation method, specifically a vacuum evaporation method, for example. FIG. 11B illustrates a state where film formation is performed under a condition that the substrate is inverted so that a film formation surface faces downward, i.e., film formation is performed with a face-down system.

Alternatively, the film 113B may be formed by a transfer method, a printing method, an inkjet method, a coating method, or the like.

Figure 11C:
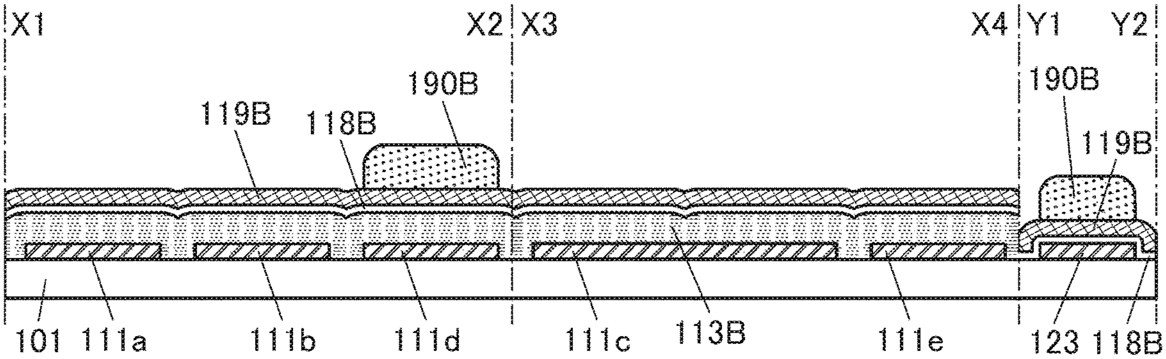

Next, over the film 113B and the conductive layer 123, a sacrificial film 118B that is to be the sacrificial layer 118*b* later and a sacrificial film 119B that is to be the sacrificial layer 119*b* later are sequentially formed (FIG. 11C).

Although this embodiment describes an example where the sacrificial film is formed to have a two-layer structure of the sacrificial film 118B and the sacrificial film 119B, the sacrificial film may have a single-layer structure or a stacked-layer structure of three or more layers.

Provision of a sacrificial layer over the film 113B can reduce damage to the film 113B in the process of manufacturing the display apparatus and increase the reliability of the light-receiving device.

For the sacrificial film 118B, a film that is highly resistant to the process conditions for the film 113B, specifically, a film having high etching selectivity with the film 113B is used. For the sacrificial film 119B, a film having high etching selectivity with respect to the sacrificial film 118B is used.

The sacrificial film 118B and the sacrificial film 119B are formed at a temperature lower than the upper temperature limit of the film 113B. The typical substrate temperatures in formation of the sacrificial film 118B and the sacrificial film

119B are each lower than or equal to 200° ° C., preferably lower than or equal to 150° C., further preferably lower than or equal to 120° C., still further preferably lower than or equal to 100° C., and yet still further preferably lower than or equal to 80° C.

Examples of indicators of the upper temperature limit are the glass transition point, the softening point, the melting point, the thermal decomposition temperature, and the 5% weight loss temperature. The upper temperature limit of the film 113A and the film 113B (i.e., the first layer 113*a* and the second layer 113*b*) can be any of the above temperatures, preferably the lowest one among the temperatures. In the case where the film 113A or the film 113B is formed of a plurality of layers, the lowest temperature of the upper temperature limits of the layers can be the upper temperature limit of the film 113A or the film 113B. In the case of a mixed layer that is one layer formed of a plurality of materials, for example, the upper temperature limit of the most contained material or the lowest temperature of the upper temperature limits of the materials can be regarded as the upper temperature limit of the layer.

As the sacrificial film 118B and the sacrificial film 119B, it is preferable to use a film that can be removed by a wet etching method. Using a wet etching method can reduce damage to the film 113B in processing the sacrificial film 118B and the sacrificial film 119B, as compared to the case of using a dry etching method.

The sacrificial film 118B and the sacrificial film 119B can be formed by a sputtering method, an ALD method (including a thermal ALD method and a PEALD method), a CVD method, or a vacuum evaporation method, for example. Alternatively, the sacrificial film 118B and the sacrificial film 119B may be formed by the above-described wet film formation method.

Note that the sacrificial film 118B, which is formed over and in contact with the film 113B, is preferably formed by a formation method that causes less damage to the film 113B than a formation method for the sacrificial film 119B. For example, the sacrificial film 118B is preferably formed by an ALD method or a vacuum evaporation method rather than a sputtering method.

As the sacrificial film 118B and the sacrificial film 119B, it is possible to use one or more of a metal film, an alloy film, a metal oxide film, a semiconductor film, an organic insulating film, and an inorganic insulating film, for example.

For the sacrificial film 118B and the sacrificial film 119B, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the sacrificial film 118B and the sacrificial film 119B is preferable, in which case the film 113B can be inhibited from being irradiated with ultraviolet light and deteriorating.

For the sacrificial film 118B and the sacrificial film 119B, metal oxide such as In—Ga—Zn oxide, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or indium tin oxide containing silicon can be used.

In addition, in place of gallium described above, the element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial film 118B and the sacrificial film 119B, a variety of inorganic insulating films that can be used as the protective layer 131 can be used. In particular, an oxide insulating film is preferable because its adhesion to the film 113B is higher than that of a nitride insulating film. For example, an inorganic insulating material such as aluminum oxide, hafnium oxide, or silicon oxide can be used for the sacrificial film 118B and the sacrificial film 119B. As the sacrificial film 118B or the sacrificial film 119B, an aluminum oxide film can be formed by an ALD method, for example. The use of an ALD method is preferable, in which case damage to a base (in particular, the EL layer, the active layer, or the like) can be reduced.

For example, an inorganic insulating film (e.g., an aluminum oxide film) formed by an ALD method can be used as the sacrificial film 118B, and an inorganic film (e.g., an In—Ga—Zn oxide film, an aluminum film, or a tungsten film) formed by a sputtering method can be used as the sacrificial film 119B.

Note that the same inorganic insulating film can be used for both the sacrificial film 118B and the insulating layer 125 that is to be formed later. For example, an aluminum oxide film formed by an ALD method can be used for both the sacrificial film 118B and the insulating layer 125. Here, for the sacrificial film 118B and the insulating layer 125, the same film-formation condition may be used or different film-formation conditions may be used. For example, when the sacrificial film 118B is formed under conditions similar to those of the insulating layer 125, the sacrificial film 118B can be an insulating layer having a high barrier property against at least one of water and oxygen. Meanwhile, the sacrificial film 118B is a layer almost or all of which is to be removed in a later step, and thus is preferably easy to process. Therefore, the sacrificial film 118B is preferably formed with a substrate temperature lower than that for formation of the insulating layer 125.

An organic material may be used for one or both of the sacrificial film 118B and the sacrificial film 119B. For example, as the organic material, a material that can be dissolved in a solvent chemically stable with respect to at least a film positioned in the uppermost portion of the film 113B may be used. Specifically, a material that will be dissolved in water or alcohol can be suitably used. In forming a film of such a material, it is preferable to apply the material dissolved in a solvent such as water or alcohol by a wet film formation method and then perform heat treatment for evaporating the solvent. At this time, the heat treatment is preferably performed in a reduced-pressure atmosphere, in which case the solvent can be removed at a low temperature in a short time and thermal damage to the film 113B can be reduced accordingly.

The sacrificial film 118B and the sacrificial film 119B may each be formed using an organic resin such as polyvinyl alcohol (PVA), polyvinyl butyral, polyvinylpyrrolidone, polyethylene glycol, polyglycerin, pullulan, water-soluble cellulose, an alcohol-soluble polyamide resin, or a fluorine resin like perfluoropolymer.

For example, an organic film (e.g., a PVA film) formed by an evaporation method or the above wet film formation method can be used as the sacrificial film 118B, and an inorganic film (e.g., a silicon nitride film) formed by a sputtering method can be used as the sacrificial film 119B.

Next, a resist mask 190B is formed over the sacrificial film 119B (FIG. 11C). The resist mask 190B can be formed by application of a photosensitive resin (photoresist), exposure, and development.

The resist mask 190B may be formed using either a positive resist material or a negative resist material.

The resist mask 190B is provided at a position overlapping with the pixel electrode 111*d*. The resist mask 190B is preferably provided also at a position overlapping with the conductive layer 123. This can inhibit the conductive layer 123 from being damaged in the process of manufacturing the display apparatus. Note that the resist mask 190B is not necessarily provided over the conductive layer 123.

Figure 11D:
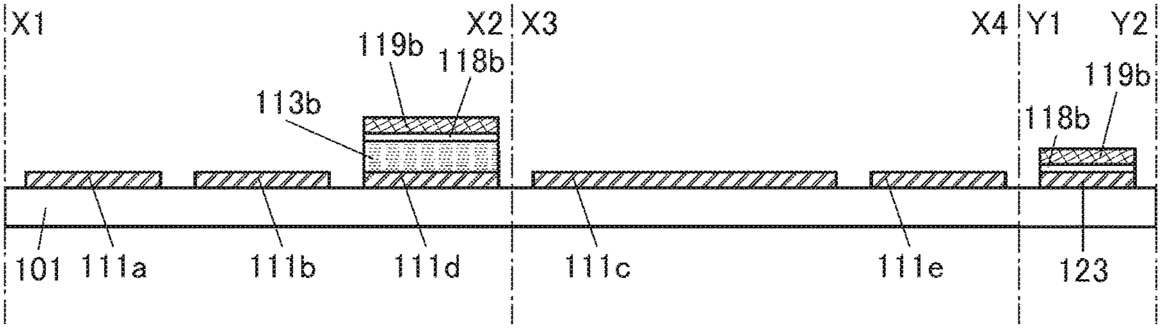

Next, part of the sacrificial film 119B is removed using the resist mask 190B, so that the sacrificial layer 119*b* is formed. The sacrificial layer 119*b* remains over the pixel electrode 111*d* and the conductive layer 123. After that, the resist mask 190B is removed. Next, part of the sacrificial film 118B is removed using the sacrificial layer 119*b* as a mask (also referred to as hard mask) to form the sacrificial layer 118*b* (FIG. 11D).

The sacrificial film 118B and the sacrificial film 119B can be processed by a wet etching method or a dry etching method. The sacrificial film 118B and the sacrificial film 119B are preferably processed by anisotropic etching.

Using a wet etching method can reduce damage to the film 113B in processing the sacrificial film 118B and the sacrificial film 119B, as compared to the case of using a dry etching method. In the case of using a wet etching method, it is preferable to use a developer, a tetramethylammonium hydroxide (TMAH) aqueous solution, dilute hydrofluoric acid, oxalic acid, phosphoric acid, acetic acid, nitric acid, or a chemical solution containing a mixed solution of any of these acids, for example.

Since the film 113B is not exposed in processing the sacrificial film 119B, the range of choices of the processing method is wider than that for processing the sacrificial film 118B. Specifically, deterioration of the film 113B can be further inhibited even when a gas containing oxygen is used as an etching gas in processing the sacrificial film 119B.

In the case of using a dry etching method for processing the sacrificial film 118B, deterioration of the film 113B can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the sacrificial film 118B, the sacrificial film 118B can be processed by a dry etching method using $CHF_3$ and He. In the case where an In—Ga—Zn oxide film formed by a sputtering method is used as the sacrificial film 119B, the sacrificial film 119B can be processed by a wet etching method using a diluted phosphoric acid. Alternatively, the sacrificial film 119B may be processed by a dry etching method using $CH_4$ and Ar. Alternatively, the sacrificial film 119B can be processed by a wet etching method using a diluted phosphoric acid. When a tungsten film formed by a sputtering method is used as the sacrificial film 119B, the sacrificial film 119B can be processed by a dry etching method using a combination of $SF_6$, $CF_4$, and $O_2$ or a combination of $CF_4$, $Cl_2$, and $O_2$.

The resist mask 190B can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, or a noble gas such as He may be used. Alternatively, the resist mask 190B may be removed by wet etching. At this time, the sacrificial film 118B is positioned on the outermost surface and the film 113B is not exposed; thus, the film 113B can be inhibited from being damaged in the step of removing the resist mask 190B. In addition, the range of choices of the method for removing the resist mask 190B can be widened.

Next, the film 113B is processed to form the second layer 113*b*. For example, part of the film 113B is removed using the sacrificial layer 119*b* and the sacrificial layer 118*b* as a hard mask to form the second layer 113*b* (FIG. 11D).

The film 113B is preferably processed by anisotropic etching. In particular, an anisotropic dry etching is preferably used. Alternatively, a wet etching may be used.

In the case of using a dry etching method, deterioration of the film 113B can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the film 113B can be inhibited. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

As described above, in one embodiment of the present invention, the sacrificial layer 119*b* is formed in the following manner: the resist mask 190B is formed over the sacrificial film 119B, and part of the sacrificial film 119B is removed using the resist mask 190B. After that, part of the film 113B is removed using the sacrificial layer 119*b* as a hard mask, so that the second layer 113*b* is formed. In other words, the second layer 113*b* can be formed by processing the film 113B by a photolithography method. Note that part of the film 113B may be removed using the resist mask 190B. Then, the resist mask 190B may be removed.

Figure 12A:
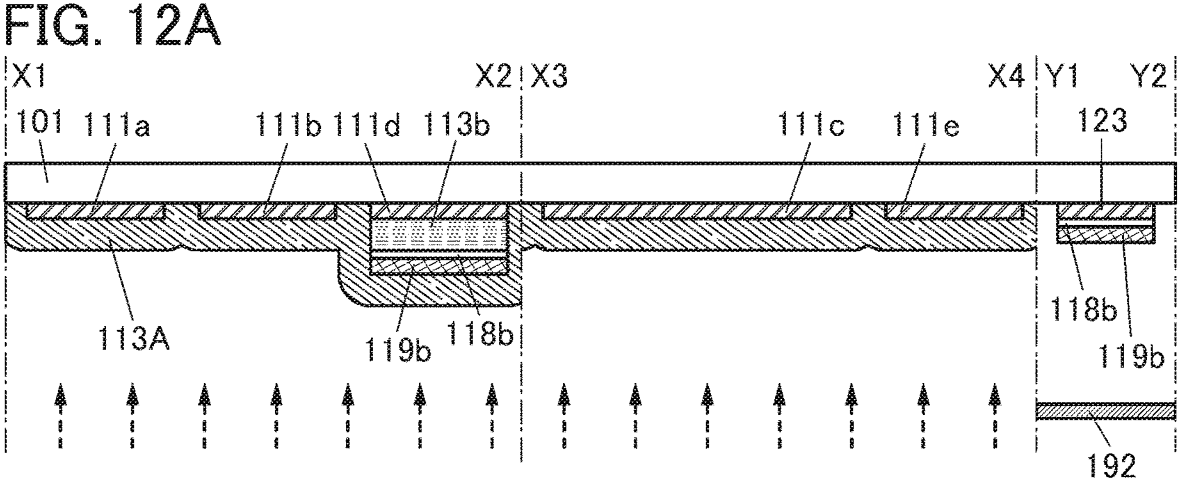
FIG. 12A to FIG. 12C are cross-sectional views illustrating an example of a manufacturing method of a display apparatus.

Next, the film 113A to be the first layer 113*a* later is formed over the pixel electrodes 111*a*, 111*b*, 111*c*, and 111*e*, the sacrificial layer 119*b*, and the layer 101 including a transistor (FIG. 12A).

FIG. 12A illustrates an example in which the use of a mask 192 prevents the film 113A from being formed over the conductive layer 123. The film 113A can be formed by a method similar to that usable for forming the film 113B.

Figure 12B:
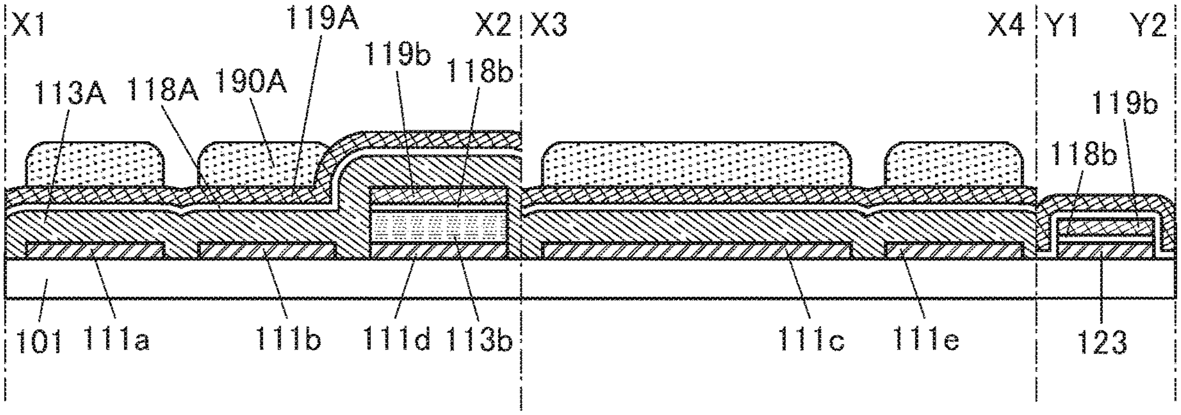

Next, a sacrificial film 118A to be the sacrificial layer 118*a* later and a sacrificial film 119A to be the sacrificial layer 119*a* later are formed in this order over the film 113A and the conductive layer 123, and after that, the resist mask 190A is formed (FIG. 12B). Materials and methods for forming the sacrificial film 118A and the sacrificial film 119A are the same as those that can be used for the sacrificial film 118B and the sacrificial film 119B. A material and a method for forming the resist mask 190A are similar to those for the resist mask 190B.

Provision of a sacrificial layer over the film 113A can reduce damage to the film 113A in the process of manufacturing the display apparatus and increase the reliability of the light-emitting device.

The resist mask 190A is provided at a position overlapping with the pixel electrodes 111*a*, 111*b*, 111*c*, and 111*e*.

Then, part of the sacrificial film 119A is removed with use of the resist mask 190A to form the sacrificial layer 119*a*. The sacrificial layer 119*a* remains over the pixel electrodes 111*a*, 111*b*, 111*c*, and 111*e*. After that, the resist mask 190A is removed. Next, part of the sacrificial film 118A is removed with use of the sacrificial layer 119*a* as a mask to form the sacrificial layer 118*a* (FIG. 12C).

Next, the film 113A is processed to form the first layer 113*a*. For example, part of the film 113A is removed using the sacrificial layer 119*a* and the sacrificial layer 118*a* as a hard mask to form the first layer 113*a* (FIG. 12C).

Figure 12C:
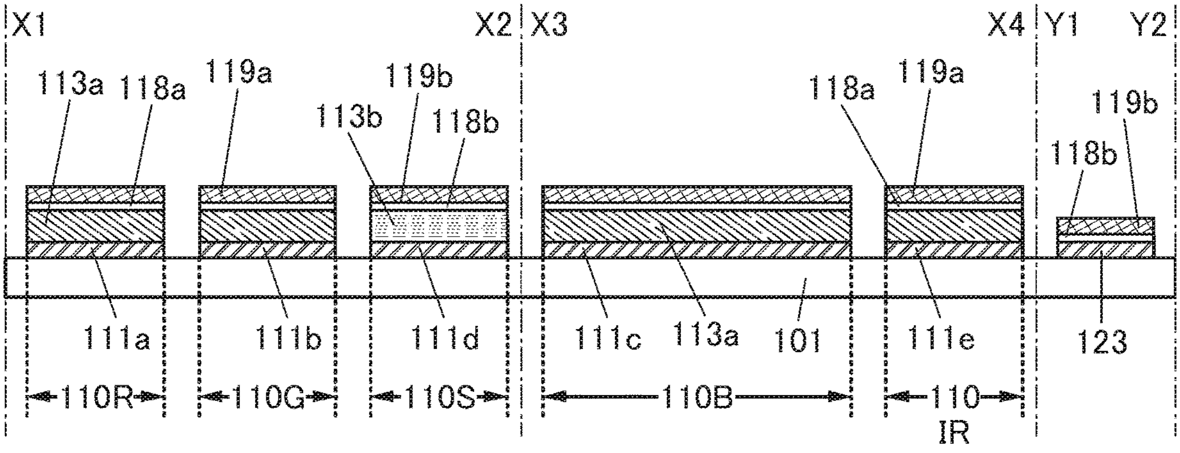

As illustrated in FIG. 12C, the film 113A is processed, whereby the plurality of first layers 113*a* can be formed. That is, the film 113A can be divided into the plurality of first layers 113*a*. In this manner, the island-shaped first layer 113*a* is provided in each subpixel. Furthermore, between adjacent subpixels, the island-shaped first layers 113*a* or the island-shaped first layer 113*a* and the island-shaped second layer 113*b* can be prevented from being in contact with each other. As a result, generation of a leakage current between the subpixels can be inhibited. Accordingly, degradation of the display quality of the display apparatus can be inhibited. In addition, both the higher resolution and higher display quality of the display apparatus can be achieved.

Note that in the case where the third layer 113*c* is formed, the above-described method of forming the second layer 113*b* can be referred to for the method of forming the third layer 113*c*. In the case where the third layer 113*c* is formed, the resist mask 190A is not provided over the pixel electrode 111*e*, and a resist mask is provided over the pixel electrode 111*e* at the time of processing a film to be the third layer 113*c*. Note that the order of forming the first layer 113*a*, the second layer 113*b*, and the third layer 113*c* is not limited.

Next, the sacrificial layers 119*a* and 119*b* may be removed. The sacrificial layers 118*a*, 118*b*, 119*a*, and 119*b* remain in the display apparatus in some cases, depending on the later steps. Removing the sacrificial layers 119*a* and 119*b* at this stage can inhibit the sacrificial layers 119*a* and 119*b* from remaining in the display apparatus. For example, in the case where a conductive material is used for the sacrificial layers 119*a* and 119*b*, removing the sacrificial layers 119*a* and 119*b* in advance can inhibit generation of a leakage current due to the remaining sacrificial layers 119*a* and 119*b*, formation of a capacitance, or the like.

The step of removing the sacrificial layers can be performed by a method similar to that for the step of processing the sacrificial layers. In particular, using a wet etching method can reduce damage to the first layer 113*a* and the second layer 113*b* in removing the sacrificial layers, as compared to the case of using a dry etching method.

The sacrificial layer may be removed by being dissolved in a solvent such as water or alcohol. Examples of alcohol include ethyl alcohol, methyl alcohol, isopropyl alcohol (IPA), and glycerin.

After the sacrificial layers are removed, drying treatment may be performed to remove water included in the first layer 113*a* and the second layer 113*b* and water adsorbed on the surfaces of the first layer 113*a* and the second layer 113*b*. For example, heat treatment in an inert gas atmosphere or a reduced-pressure atmosphere can be performed. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° ° C. Employing a reduced-pressure atmosphere is preferable, in which case drying at a lower temperature is possible.

Figure 13A:
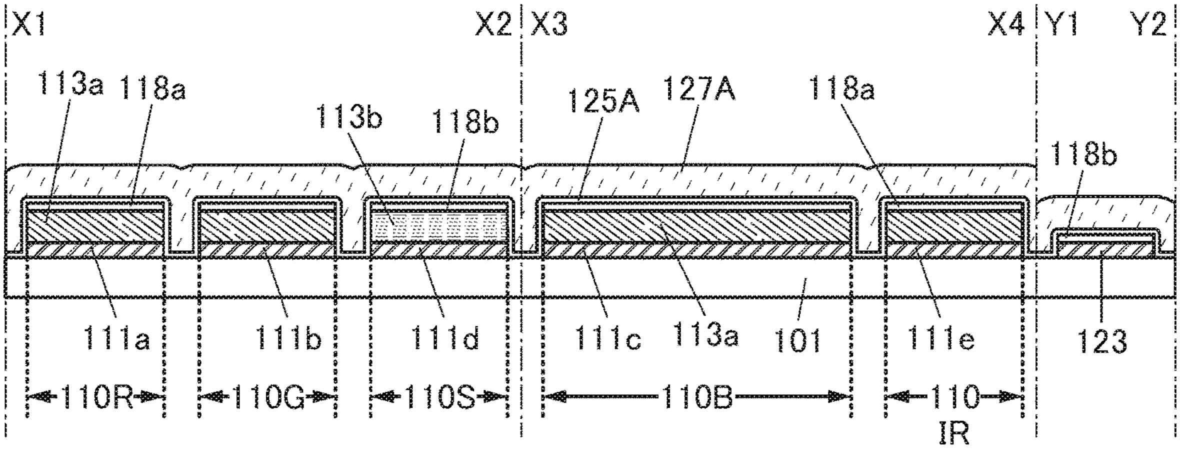
FIG. 13A to FIG. 13C are cross-sectional views illustrating an example of a manufacturing method of a display apparatus.

Next, an insulating film 125A that is to be the insulating layer 125 later is formed to cover the pixel electrode, the first layer 113*a*, the second layer 113*b*, the sacrificial layer 118*a*, and the sacrificial layer 118*b*. Then, an insulating film 127A is formed over the insulating film 125A (FIG. 13A).

The insulating film 125A and the insulating film 127A are preferably formed by a formation method that causes less damage to the first layer 113*a* and the second layer 113*b*. In particular, the insulating film 125A, which is formed in contact with the side surfaces of the first layer 113*a* and the second layer 113*b*, is preferably formed by a formation method that causes less damage to the first layer 113*a* and the second layer 113*b* than the method of forming the insulating film 127A.

The insulating film 125A and the insulating film 127A are each formed at a temperature lower than the upper temperature limits of the first layer 113*a* and the second layer 113*b*. When the substrate temperature at the time when the insulating film 125A is formed is increased, the formed insulating film 125A, even with a small thickness, can have a low impurity concentration and a high barrier property against at least one of water and oxygen.

The insulating film 125A and the insulating film 127A are preferably formed at a substrate temperature higher than or equal to 60° C., higher than or equal to 80° C., higher than or equal to 100° C., or higher than or equal to 120° C. and lower than or equal to 200° ° C., lower than or equal to 180° C., lower than or equal to 160° C., lower than or equal to 150° C., or lower than or equal to 140° C.

As the insulating film 125A, an insulating film is preferably formed within the above substrate temperature range to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating film 125A is preferably formed by an ALD method, for example. The use of an ALD method is preferable, in which case damage by the film formation can be reduced and a film with good coverage can be formed. As the insulating film 125A, an aluminum oxide film is preferably formed by an ALD method, for example.

Alternatively, the insulating film 125A may be formed by a sputtering method, a CVD method, or a PECVD method each of which has higher deposition speed than an ALD method. In that case, a highly reliable display apparatus can be manufactured with high productivity.

The insulating film 127A is preferably formed by the aforementioned wet film formation method. For example, the insulating film 127A is preferably formed by spin coating using a photosensitive resin.

Figure 13B:
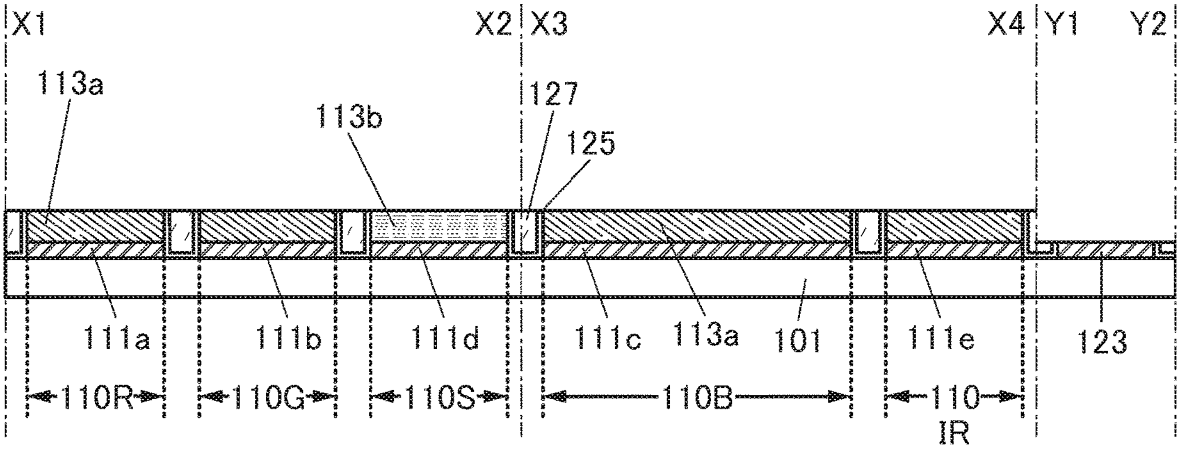

Next, the insulating film 127A is processed to form the insulating layer 127 (FIG. 13B). For example, in the case where a photosensitive material is used for the insulating film 127A, exposure and development are performed on the insulating film 127A, whereby the insulating layer 127 can be formed. Etching may be performed so that the surface level of the insulating layer 127 is adjusted. The insulating layer 127 may be processed by ashing using oxygen plasma, for example. In the case where a non-photosensitive material is used for the insulating film 127A, the surface level of the insulating layer 127 can be adjusted by the ashing, for example.

Next, at least part of the insulating film 125A is removed to form the insulating layer 125 (FIG. 13B).

The insulating film 125A is preferably processed by a dry etching method. The insulating film 125A is preferably processed by anisotropic etching. The insulating film 125A can be processed using an etching gas that can be used for processing the sacrificial film.

After that, the sacrificial layers 118*a* and 118*b* are removed. Accordingly, at least part of the top surfaces of the first layer 113*a*, the second layer 113*b*, and the conductive layer 123 are exposed.

The insulating film 125A and the sacrificial layers 118*a* and 118*b* may be removed in different steps or in the same step. For example, the sacrificial layers 118*a* and 118*b* and the insulating film 125A are preferably films (e.g., an aluminum oxide films) that are formed using the same material, in which case they can be removed in the same step.

Figure 13C:
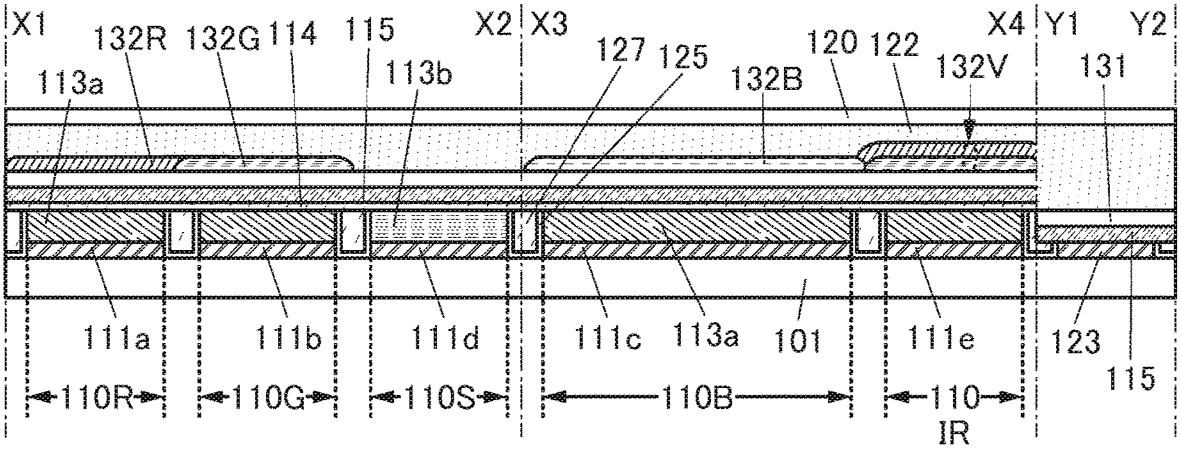

Next, the common layer 114 is formed over the insulating layer 125, the insulating layer 127, the first layer 113*a*, and the second layer 113*b*. Then, the common electrode 115 is formed over the common layer 114 (FIG. 13C).

The common layer 114 can be formed by an evaporation method (including a vacuum evaporation method), a transfer method, a printing method, an inkjet method, a coating method, or the like.

The common electrode 115 can be formed by a sputtering method or a vacuum evaporation method, for example. Alternatively, the common electrode 115 may be a stack of a film formed by an evaporation method and a film formed by a sputtering method.

Next, the protective layer 131 is formed over the common electrode 115, and the coloring layers 132R, 132G, and 132B are formed over the protective layer 131. Note that the coloring layer 132V illustrated in FIG. 13C is formed by stacking the coloring layer 132G and the coloring layer 132R. In addition, the substrate 120 is bonded onto the protective layer 131 and the coloring layers with the resin layer 122, whereby the display apparatus can be manufactured (FIG. 13C).

Examples of methods for forming the protective layer 131 include a vacuum evaporation method, a sputtering method, a CVD method, and an ALD method.

As described above, in the method of manufacturing the display apparatus of one embodiment of the present invention, the island-shaped first layer 113*a* and the island-shaped second layer 113*b* are formed not by using a shadow mask such as a metal mask but by processing, by a photolithography method, a film formed on the entire surface; thus, the island-shaped layers can have a uniform thickness. Accordingly, a high-resolution display apparatus or a display apparatus with a high aperture ratio can be achieved. Furthermore, even when the resolution or the aperture ratio is high and the distance between the subpixels is extremely short, contact between the island-shaped first layers 113*a* or between the island-shaped first layers 113*a* and the island-shaped second layer 113*b* can be inhibited in the adjacent subpixels. As a result, generation of a leakage current between the subpixels can be inhibited. Accordingly, degradation of the display quality and the light detection accuracy of the display apparatus can be inhibited. In addition, both the higher resolution and higher display quality of the display apparatus can be achieved.

This embodiment can be combined with the other embodiments as appropriate.

Embodiment 3

In this embodiment, display apparatuses of embodiments of the present invention are described with reference to FIG. 14 to FIG. 23.

The display apparatus of this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on a head, such as a VR device like a head-mounted display and a glasses-type AR device.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer and the like, digital signage, and a large game machine such as a pachinko machine.

[Display Module]

Figure 14A:
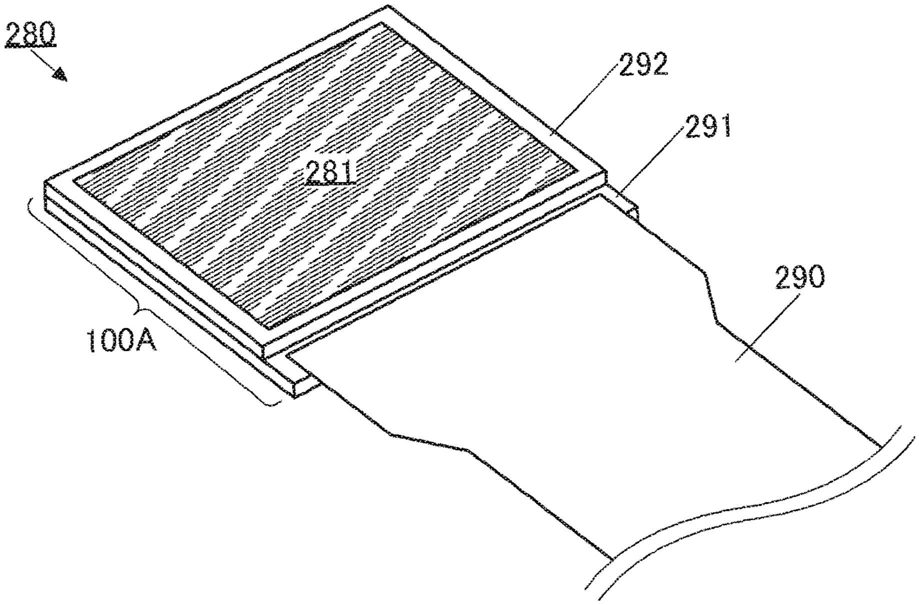
FIG. 14A and FIG. 14B are perspective views illustrating an example of a display apparatus.

FIG. 14A is a perspective view of a display module 280. The display module 280 includes a display apparatus 100A and an FPC 290. Note that the display apparatus included in the display module 280 is not limited to the display apparatus 100A and may be any of a display apparatus 100B to a display apparatus 100F described later.

The display module 280 includes a substrate 291 and a substrate 292. The display module 280 includes a display portion 281. The display portion 281 is a region of the display module 280 where an image is displayed, and is a region where light from pixels provided in a pixel portion 284 described later can be seen.

Figure 14B:
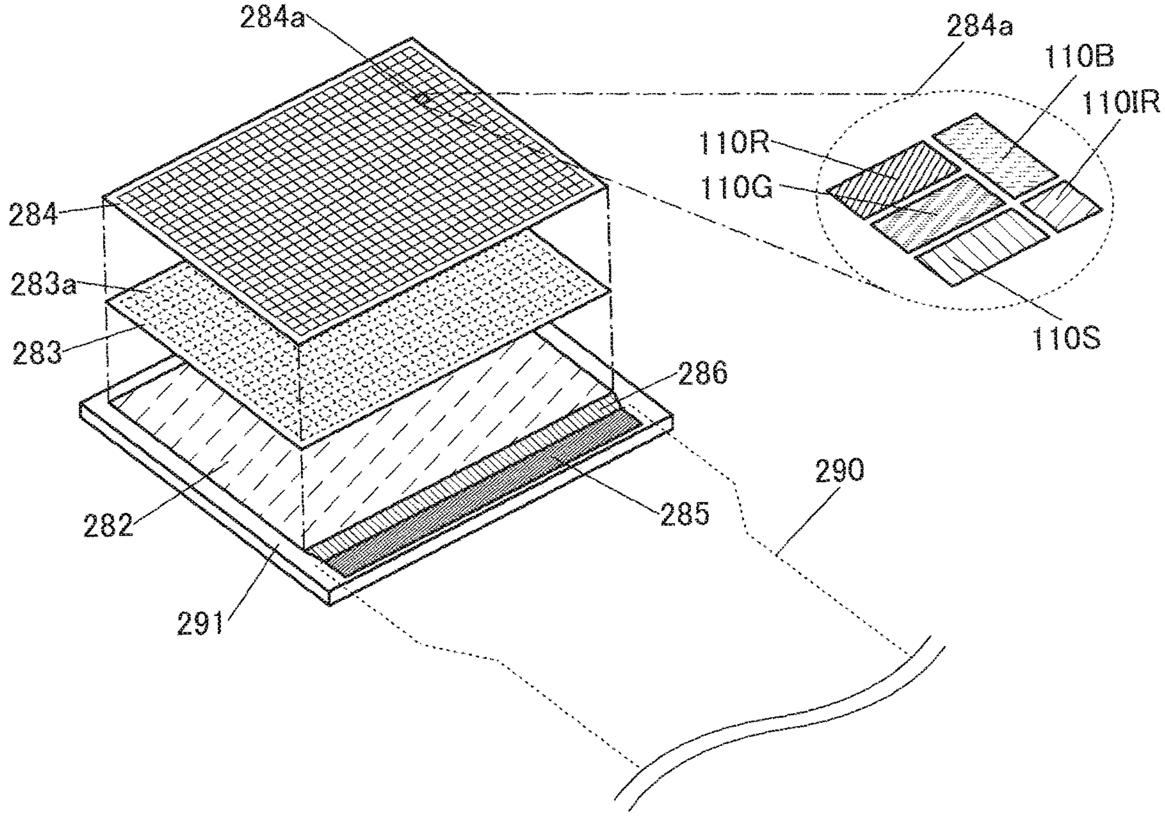

FIG. 14B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 which does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 14B. The pixel 284*a* can employ any of the structures described in Embodiment 1. FIG. 14B illustrates an example where a structure similar to that of the pixel 110 illustrated in FIG. 1 is employed.

The pixel circuit portion 283 includes a plurality of pixel circuits 283*a* arranged periodically.

One pixel circuit 283*a* is a circuit that controls driving of a plurality of elements included in one pixel 284*a*. One pixel circuit 283*a* can be provided with five circuits each of which controls driving of an element. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. With such a structure, an active-matrix display apparatus is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, further preferably higher than or equal to 60% and lower than or equal to 95%. Furthermore, the pixels 284*a* can be arranged extremely densely and thus the display portion 281 can have an extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has an extremely high resolution, and thus can be suitably used for a VR device or a glasses-type AR device. For example, even with a structure where the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a watch.

[Display Apparatus 100A]

Figure 15:
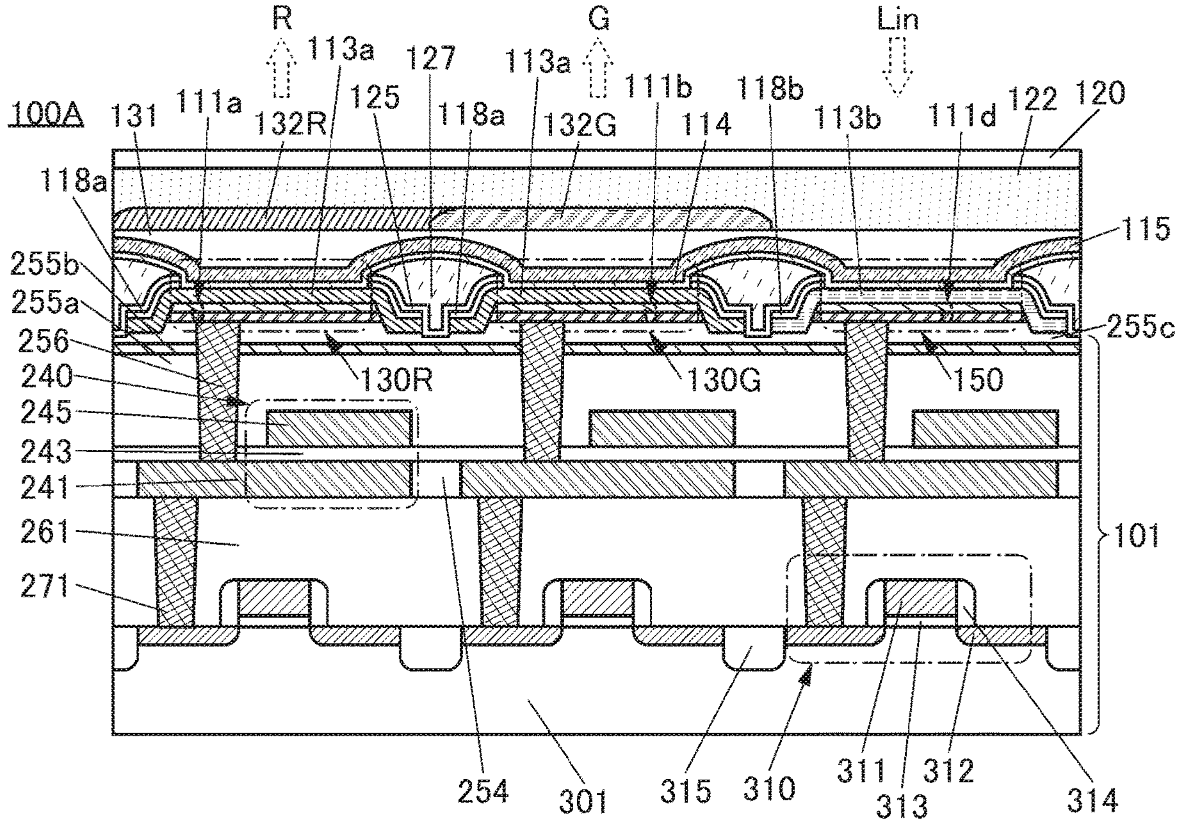
FIG. 15 is a cross-sectional view illustrating an example of a display apparatus.

The display apparatus 100A illustrated in FIG. 15 includes a substrate 301, the light-emitting device 130R, the light-emitting device 130G, the light-receiving device 150, the coloring layer 132R, the coloring layer 132G, a capacitor 240, and a transistor 310.

The subpixel 110R illustrated in FIG. 14B includes the light-emitting device 130R and the coloring layer 132R, the subpixel 110G includes the light-emitting device 130G and the coloring layer 132G, and the subpixel 110B includes the light-emitting device 130B and the coloring layer 132B. In the subpixel 110R, light emitted by the light-emitting device 130R is extracted as red light to the outside of the display apparatus 100A through the coloring layer 132R. Similarly, in the subpixel 110G, light emitted by the light-emitting device 130G is extracted as green light to the outside of the display apparatus 100A through the coloring layer 132G. In the subpixel 110B, light emitted by the light-emitting device 130B is extracted as blue light to the outside of the display apparatus 100A through the coloring layer 132B. For example, the structure illustrated in FIG. 3B or FIG. 4B can be used for the subpixel 110IR.

The substrate 301 corresponds to the substrate 291 in FIG. 14A and FIG. 14B. A stacked-layer structure including the substrate 301 and the components thereover up to an insulating layer 255*c* corresponds to the layer 101 including a transistor in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*. The light-emitting device 130R, the light-emitting device 130G, and the light-receiving device 150 are provided over the insulating layer 255*c*. FIG. 15 illustrates an example where the light-emitting device 130R, the light-emitting device 130G, and the light-receiving device 150 each have a structure similar to the stacked-layer structure illustrated in FIG. 3A. An insulator is provided in a region between adjacent light-emitting devices and a region between a light-emitting device and a light-receiving device adjacent to each other. In FIG. 15 and the like, the insulating layer 125 and the insulating layer 127 over the insulating layer 125 are provided in this region.

The sacrificial layers 118*a* are positioned over the first layers 113*a* included in the light-emitting device 130R and the light-emitting device 130G, and the sacrificial layer 118*b* is positioned over the second layer 113*b* included in the light-receiving device 150.

The pixel electrode 111*a*, the pixel electrode 111*b*, and the pixel electrode 111*d* are each electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 271 embedded in the insulating layer 261. The top surface of the insulating layer 255*c* and a top surface of the plug 256 are level or substantially level with each other. A variety of conductive materials can be used for the plugs. FIG. 15 and the like illustrate an example where the pixel electrode has a two-layer structure of a reflective electrode and a transparent electrode over the reflective electrode.

The protective layer 131 is provided over the light-emitting device 130R, the light-emitting device 130G, and the light-receiving device 150. The substrate 120 is bonded to the protective layer 131 with the resin layer 122. Embodiment 1 can be referred to for details of the light-emitting devices and the components thereover up to the substrate 120. The substrate 120 corresponds to the substrate 292 in FIG. 14A.

[Display Apparatus 100B]

Figure 16:
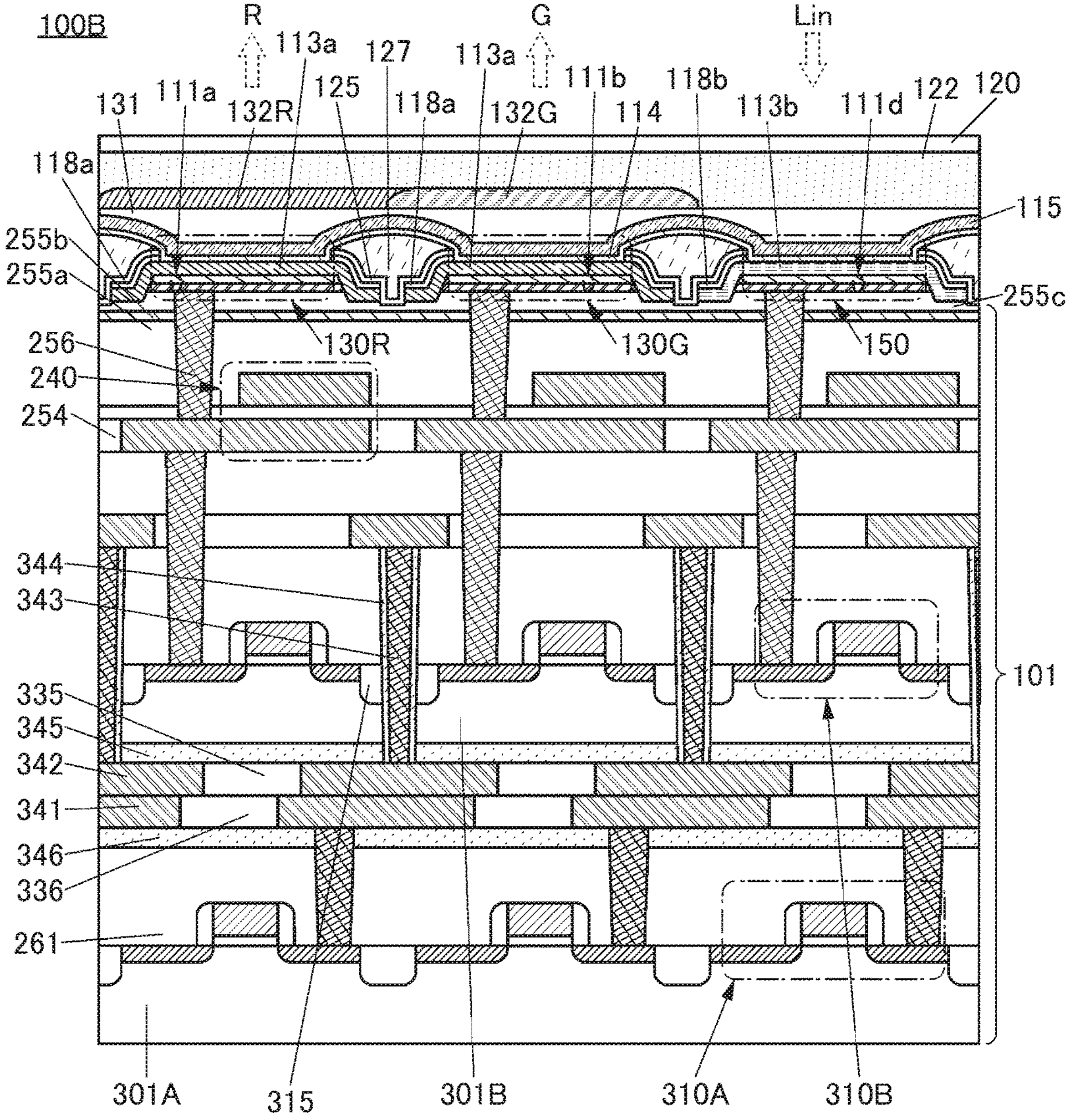
FIG. 16 is a cross-sectional view illustrating an example of a display apparatus.

The display apparatus 100B illustrated in FIG. 16 has a structure where a transistor 310A and a transistor 310B in each of which a channel is formed in a semiconductor substrate are stacked. Note that in the description of the display apparatus below, portions similar to those of the above-mentioned display apparatus are not described in some cases.

In the display apparatus 100B, a substrate 301B provided with the transistor 310B, the capacitor 240, and the light-emitting devices is bonded to a substrate 301A provided with the transistor 310A.

Here, an insulating layer 345 is preferably provided on the bottom surface of the substrate 301B. An insulating layer 346 is preferably provided over the insulating layer 261 provided over the substrate 301A. The insulating layers 345 and 346 are insulating layers functioning as protective layers and can inhibit diffusion of impurities into the substrate 301B and the substrate 301A. For the insulating layers 345 and 346, an inorganic insulating film that can be used for the protective layer 131 or an insulating layer 332 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. For the insulating layer 344, an inorganic insulating film that can be used for the protective layer 131 can be used.

A conductive layer 342 is provided under the insulating layer 345 on the rear surface of the substrate 301B (the surface opposite to the substrate 120). The conductive layer 342 is preferably provided to be embedded in an insulating layer 335. The bottom surfaces of the conductive layer 342 and the insulating layer 335 are preferably planarized. Here, the conductive layer 342 is electrically connected to the plug 343.

Over the substrate 301A, a conductive layer 341 is provided over the insulating layer 346. The conductive layer 341 is preferably provided to be embedded in an insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layer 341 and the conductive layer 342 to be bonded to each other favorably.

The conductive layer 341 and the conductive layer 342 are preferably formed using the same conductive material. For example, a metal film containing an element selected from Al, Cr, Cu, Ta, Ti, Mo, and W, a metal nitride film containing the above element as a component (a titanium nitride film, a molybdenum nitride film, or a tungsten nitride film), or the like can be used. Copper is particularly preferably used for the conductive layer 341 and the conductive layer 342. In that case, it is possible to employ Cu-to-Cu (copper-to-copper) direct bonding technique (a technique for achieving electrical continuity by connecting Cu (copper) pads.

[Display Apparatus 100C]

Figure 17:
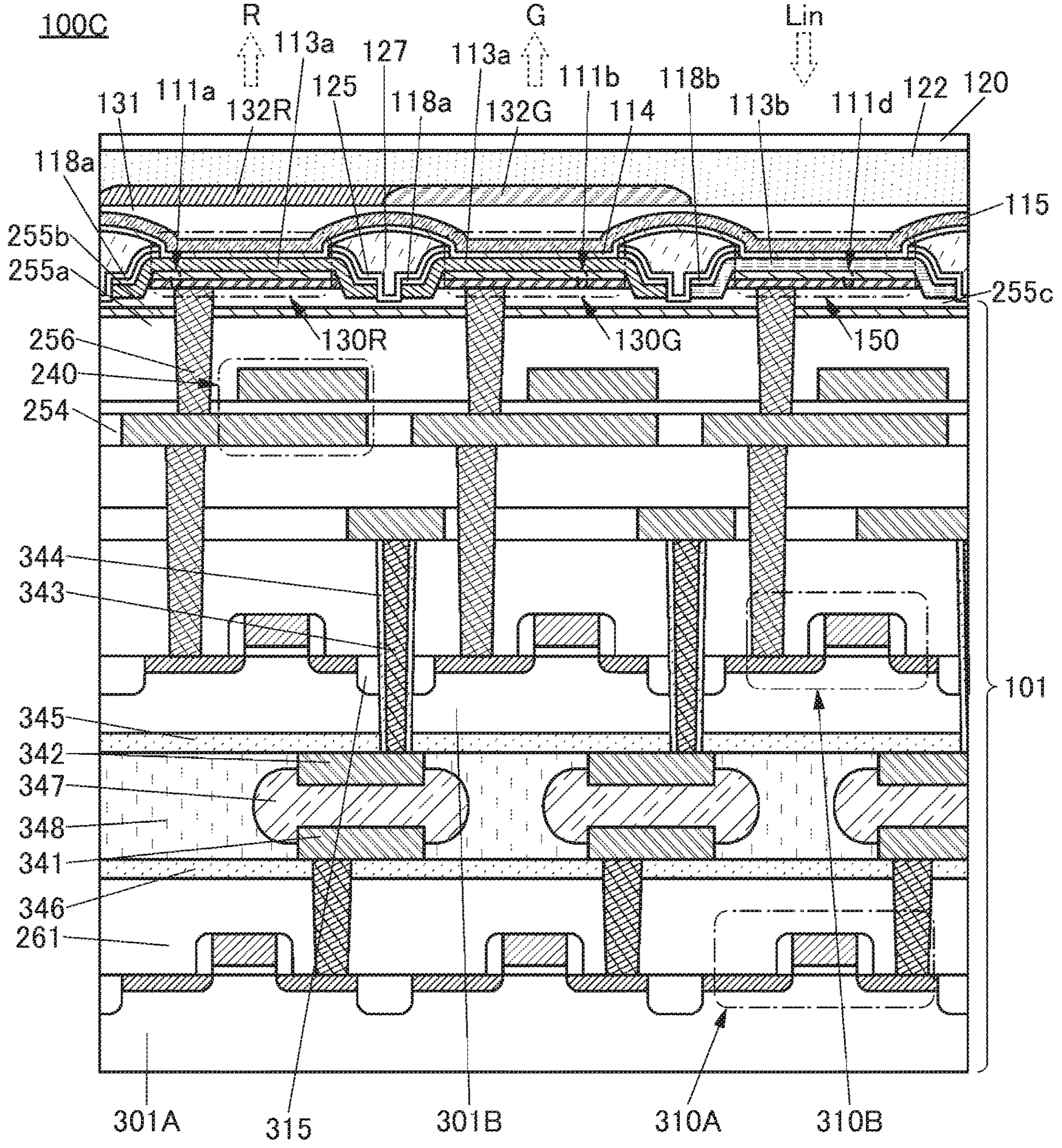
FIG. 17 is a cross-sectional view illustrating an example of a display apparatus.

The display apparatus 100C illustrated in FIG. 17 has a structure where the conductive layer 341 and the conductive layer 342 are bonded to each other through a bump 347.

As illustrated in FIG. 17, providing the bump 347 between the conductive layer 341 and the conductive layer 342 enables the conductive layer 341 and the conductive layer 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Apparatus 100D]

Figure 18:
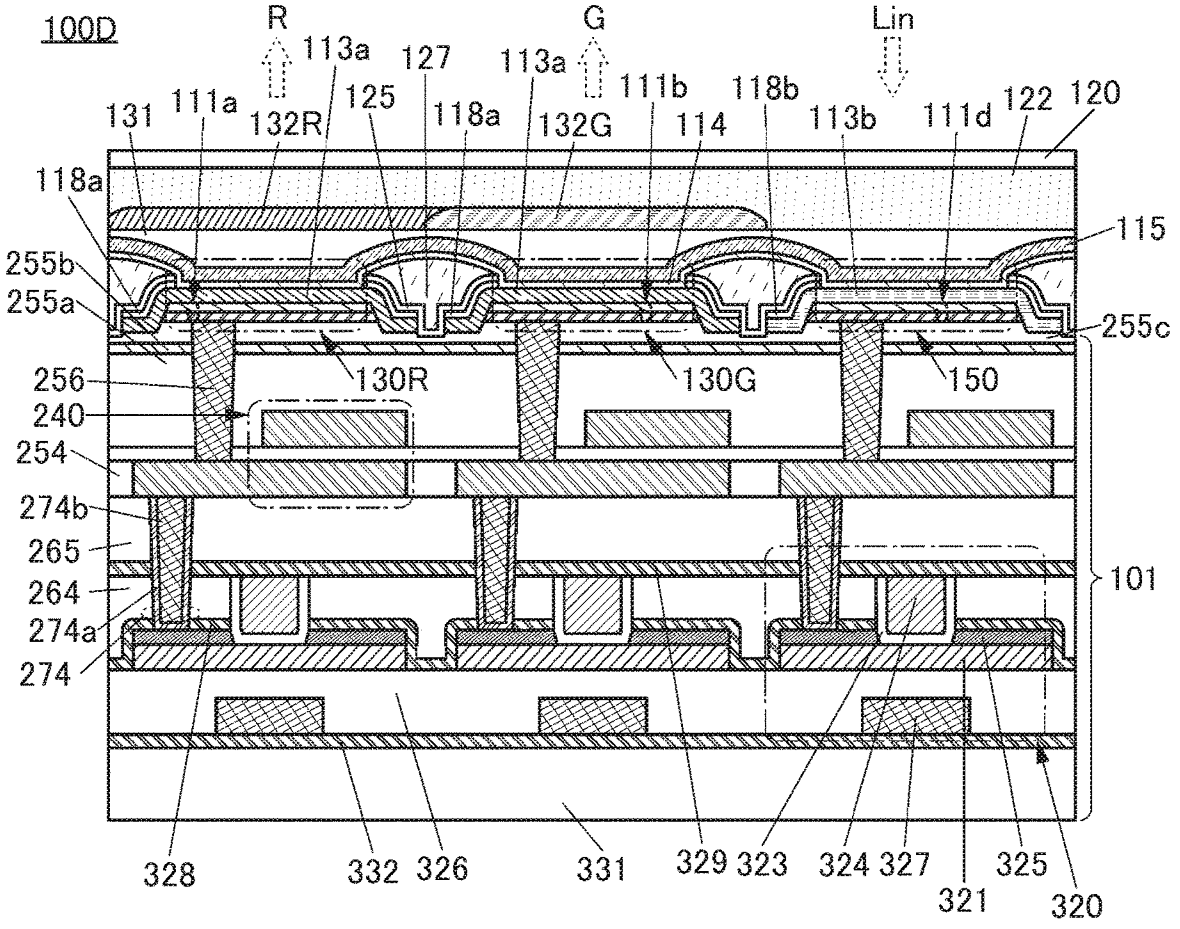
FIG. 18 is a cross-sectional view illustrating an example of a display apparatus.

The display apparatus 100D illustrated in FIG. 18 differs from the display apparatus 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 14A and FIG. 14B. A stacked-layer structure including the substrate 331 and components thereover up to the insulating layer 255*c* corresponds to the layer 101 including a transistor in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer

328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are subjected to planarization treatment so that their levels are equal to or substantially equal to each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided so as to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material through which hydrogen and oxygen are less likely to diffuse is preferably used for the conductive layer 274*a*.

[Display Apparatus 100E]

Figure 19:
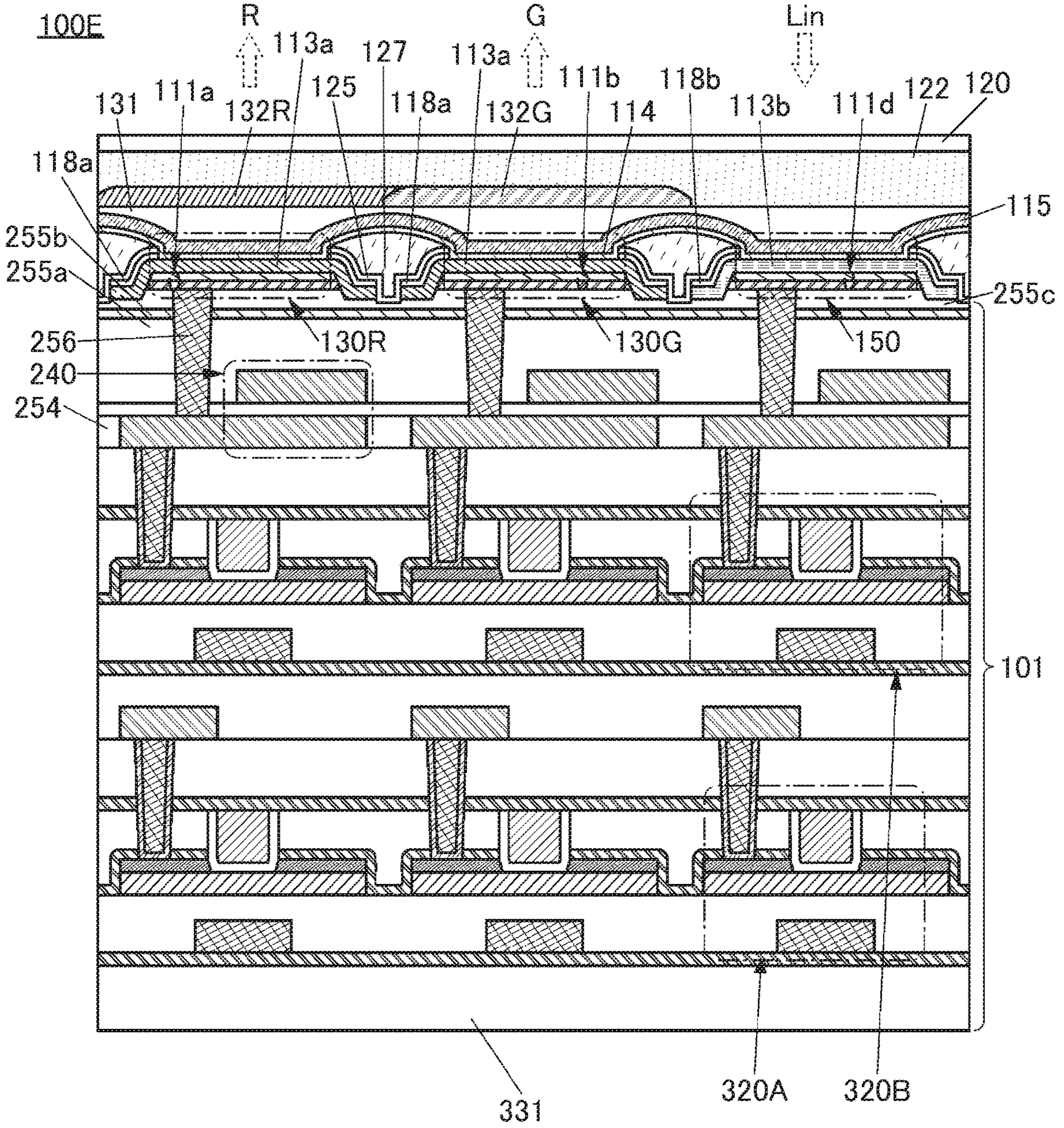
FIG. 19 is a cross-sectional view illustrating an example of a display apparatus.

The display apparatus 100E illustrated in FIG. 19 has a structure in which a transistor 320A and a transistor 320B each including an oxide semiconductor in a semiconductor where a channel is formed are stacked.

The description of the display apparatus 100D can be referred to for the transistor 320A, the transistor 320B, and the components around them.

Although the structure where two transistors including an oxide semiconductor are stacked is described, the present invention is not limited thereto. For example, three or more transistors may be stacked.

[Display Apparatus 100F]

Figure 20:
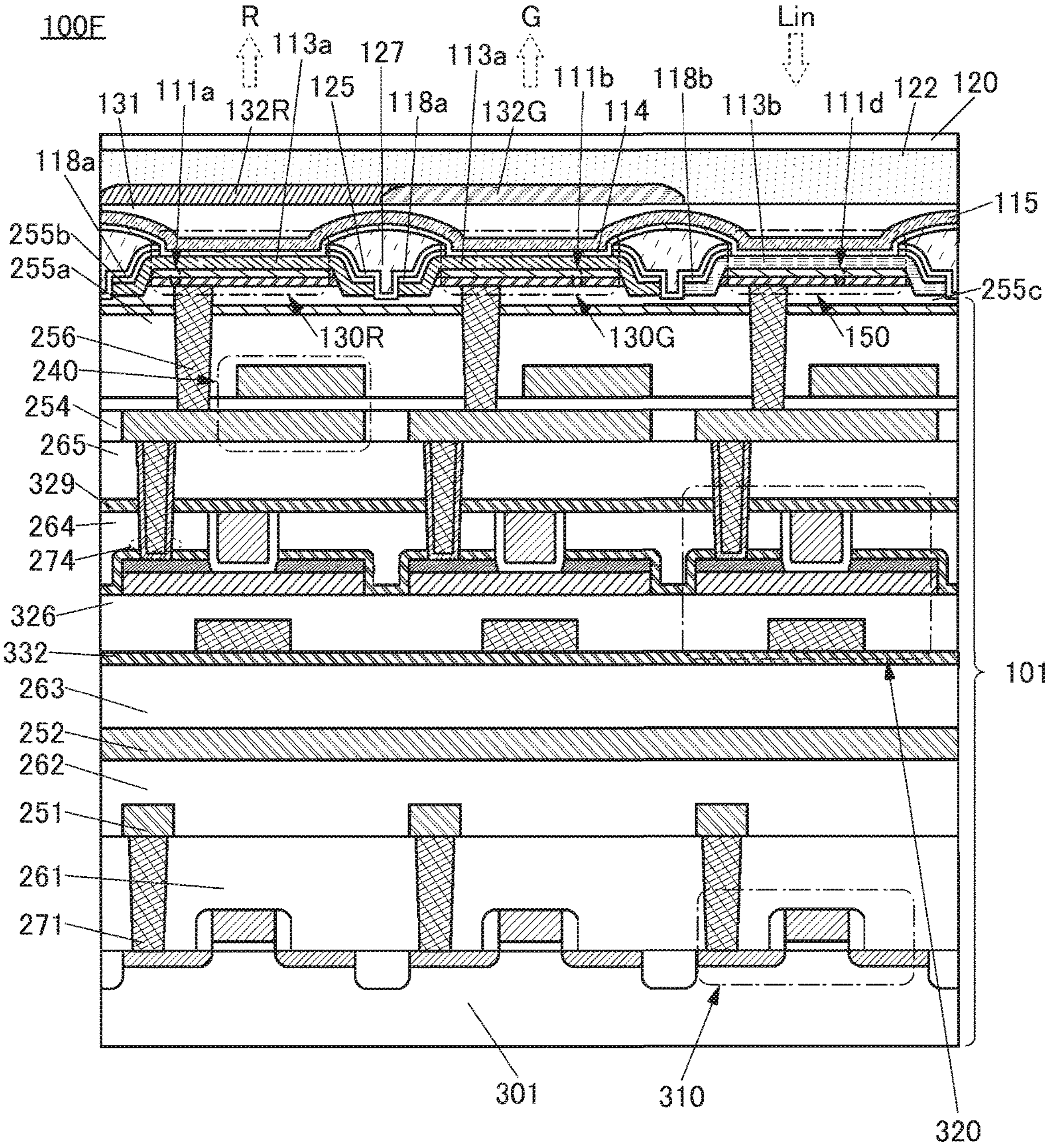
FIG. 20 is a cross-sectional view illustrating an example of a display apparatus.

The display apparatus 100F illustrated in FIG. 20 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.

[Display Apparatus 100G]

Figure 21:
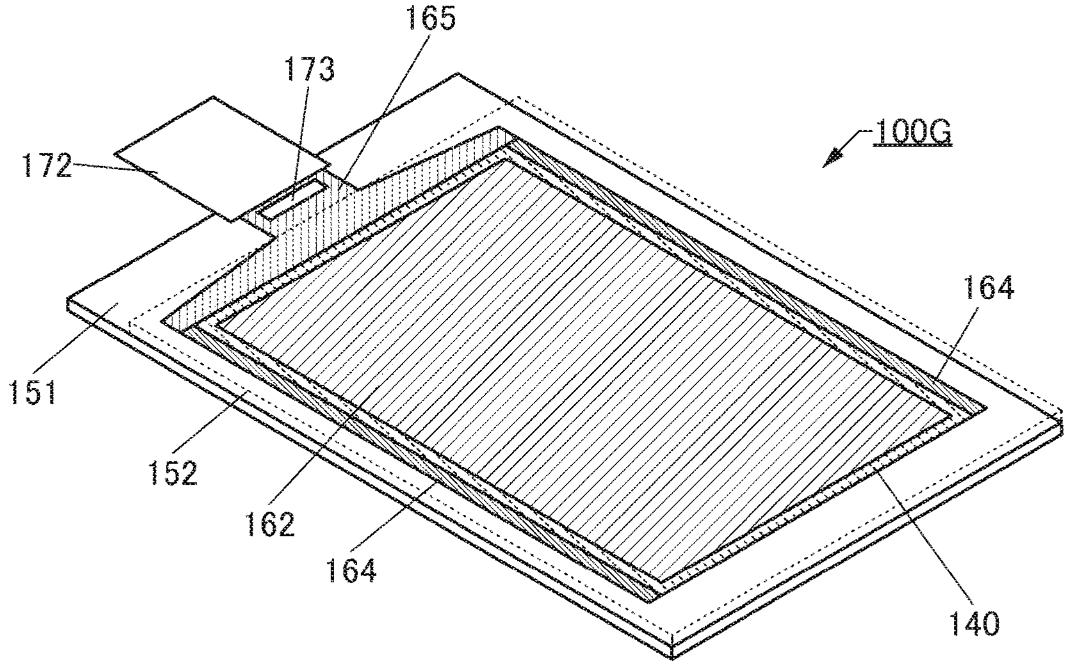
FIG. 21 is a perspective view illustrating an example of a display apparatus.
Figure 22A:
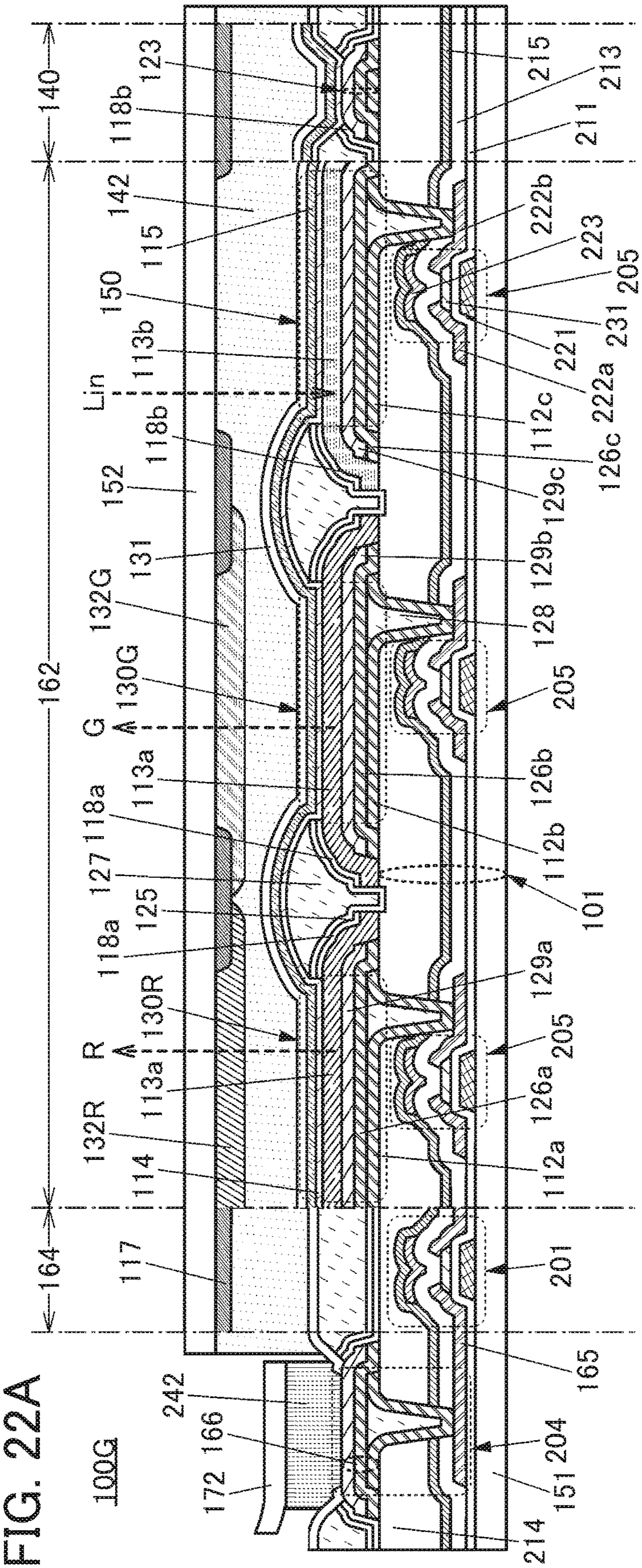
FIG. 22A is a cross-sectional view illustrating an example of a display apparatus.

FIG. 21 is a perspective view of the display apparatus 100G, and FIG. 22A is a cross-sectional view of the display apparatus 100G.

In the display apparatus 100G, a substrate 152 and a substrate 151 are bonded to each other. In FIG. 21, the substrate 152 is denoted by a dashed line.

The display apparatus 100G includes a display portion 162, the connection portion 140, a circuit 164, a wiring 165, and the like. FIG. 21 illustrates an example where an IC 173 and an FPC 172 are mounted on the display apparatus 100G. Thus, the structure illustrated in FIG. 21 can be regarded as a display module including the display apparatus 100G, the IC (integrated circuit), and the FPC.

The connection portion 140 is provided outside the display portion 162. The connection portion 140 can be provided along one or more sides of the display portion 162. The number of connection portions 140 can be one or more. FIG. 21 illustrates an example where the connection portion 140 is provided to surround the four sides of the display portion. A common electrode of a light-emitting device is electrically connected to a conductive layer in the connection portion 140, so that a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or input to the wiring 165 from the IC 173.

FIG. 21 illustrates an example where the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100G and the display module are not necessarily provided with an IC. The IC may be mounted on the FPC by a COF method or the like.

FIG. 22A illustrates an example of cross sections of part of a region including the FPC 172, part of the circuit 164, part of the display portion 162, part of the connection portion 140, and part of a region including an end portion of the display apparatus 100G.

The display apparatus 100G illustrated in FIG. 22A includes, between the substrate 151 and the substrate 152, a transistor 201, a transistor 205, the light-emitting device 130R that emits red light, the light-emitting device 130G that emits green light, the light-receiving device 150, the coloring layer 132R that transmits red light, and the coloring layer 132G that transmits green light.

The light-emitting devices 130R and 130G and the light-receiving device 150 each have the same structure as the stacked-layer structure illustrated in FIG. 1B except the structure of the pixel electrode. Embodiment 1 can be referred to for the details of the light-emitting devices and the light-receiving device.

The light-emitting device 130R includes a conductive layer 112*a*, a conductive layer 126*a* over the conductive layer 112*a*, and a conductive layer 129*a* over the conductive layer 126*a*. All of the conductive layers 112*a*, 126*a*, and 129*a* can be referred to as pixel electrodes, or one or two of them can be referred to as pixel electrodes.

The light-emitting device 130G includes a conductive layer 112*b*, a conductive layer 126*b* over the conductive layer 112*b*, and a conductive layer 129*b* over the conductive layer 126*b*.

The light-receiving device 150 includes a conductive layer 112*c*, a conductive layer 126*c* over the conductive layer 112*c*, and a conductive layer 129*c* over the conductive layer 126*c*.

The conductive layer 112*a* is connected to the conductive layer 222*b* included in the transistor 205 through an opening provided in the insulating layer 214. The end portion of the conductive layer 126*a* is positioned outward from the end portion of the conductive layer 112*a*. The end portion of the conductive layer 126*a* and the end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Detailed description of the conductive layers 112*b*, 126*b*, and 129*b* of the light-emitting device 130G and the conductive layers 112*c*, 126*c*, and 129*c* of the light-receiving device 150 is omitted because these conductive layers are similar to the conductive layers 112*a*, 126*a*, and 129*a* of the light-emitting device 130R.

Depressed portions are formed in the conductive layers 112*a*, 112*b*, and 112*c* to cover the openings provided in the insulating layer 214. A layer 128 is embedded in each of the depressed portions of the conductive layers 112*a*, 112*b*, and 112*c*.

The layer 128 has a planarization function for the depressed portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depressed portions of the conductive layers 112*a*, 112*b*, and 112*c* can also be used as the light-emitting regions or the light-receiving regions, increasing the aperture ratio of the pixels.

The layer 128 may be an insulating layer or a conductive layer. Any of a variety of inorganic insulating materials, organic insulating materials, and conductive materials can be used for the layer 128 as appropriate. Specifically, the layer 128 is preferably formed using an insulating material and is particularly preferably formed using an organic insulating material. For the layer 128, a material that can be used for the insulating layer 121 can be used.

Top and side surfaces of the conductive layers 126*a*, 126*b*, 129*a*, and 129*b* are covered with the first layer 113*a*. Similarly, the top surfaces and side surfaces of the conductive layers 126*c* and 129*c* are covered with the second layer 113*b*. Accordingly, regions provided with the conductive layers 126*a*, 126*b*, and 126*c* can be entirely used as the light-emitting regions of the light-emitting devices 130R and 130G and the light-receiving region of the light-receiving device 150, increasing the aperture ratio of the pixels.

The side surfaces of the first layer 113*a* and the second layer 113*b* are covered with the insulating layers 125 and 127. The sacrificial layer 118*a* is positioned between the first layer 113*a* and the insulating layer 125. The sacrificial layer 118*b* is positioned between the second layer 113*b* and the insulating layer 125. The common layer 114 is provided over the first layer 113*a*, the second layer 113*b*, and the insulating layers 125 and 127, and the common electrode 115 is provided over the common layer 114. The common layer 114 and the common electrode 115 are each a continuous film shared by a plurality of light-emitting devices and light-receiving devices.

The protective layer 131 is provided over the light-emitting devices 130R and 130G and the light-receiving device 150. The protective layer 131 and the substrate 152 are bonded to each other with an adhesive layer 142. The substrate 152 is provided with the coloring layers 132R and 132G and a light-blocking layer 117. A solid sealing structure, a hollow sealing structure, or the like can be employed to seal the light-emitting devices. In FIG. 22A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. Here, the adhesive layer 142 may be provided not to overlap with the light-emitting devices. The space may be filled with a resin other than the frame-shaped adhesive layer 142.

The conductive layer 123 is provided over the insulating layer 214 in the connection portion 140. An example is described in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the sacrificial layer 118*b*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are in direct contact with each other to be electrically connected to each other.

The display apparatus 100G has a top-emission structure. Light emitted from the light-emitting device is emitted toward the substrate 152. For the substrate 152, a material having a high property of transmitting visible light is preferably used. The pixel electrode contains a material that reflects visible light, and a counter electrode (the common electrode 115) contains a material that transmits visible light.

A stacked-layer structure including the substrate 151 and the components thereover up to the insulating layer 214 corresponds to the layer 101 including a transistor in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating layer and an inorganic insulating layer. The uppermost layer of the insulating layer 214 preferably has a function of an etching protective layer. Accordingly, a depressed portion can be prevented from being formed in the insulating layer 214 at the time of processing the conductive layer 112*a*, the conductive layer 126*a*, the conductive layer 129*a*, or the like. Alternatively, a depressed portion may be formed in the insulating layer 214 at the time of processing the conductive layer 112*a*, the conductive layer 126*a*, the conductive layer 129*a*, or the like.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer where a channel is formed.

The structure where the semiconductor layer where a channel is formed is provided between two gates is used for the transistor 201 and the transistor 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case degradation of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display apparatus of this embodiment.

As the oxide semiconductor having crystallinity, a CAAC (c-axis aligned crystalline)-OS, an nc (nanocrystalline)-OS, and the like can be given.

Alternatively, a transistor using silicon in its channel formation region (a Si transistor) may be used. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, and component cost and mounting cost can be reduced.

An OS transistor has extremely higher field-effect mobility than a transistor containing amorphous silicon. In addition, the OS transistor has an extremely low leakage current between a source and a drain in an off state (also referred to as off-state current), and charge accumulated in a capacitor that is connected in series to the transistor can be retained for a long period. Furthermore, power consumption of the display apparatus can be reduced with the use of an OS transistor.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor in the pixel circuit, the amount of current flowing between the source and the drain can be set minutely by a change in gate-source voltage; hence, the amount of current flowing through the light-emitting device can be controlled. Accordingly, the number of gray levels in the pixel circuit can be increased.

Regarding saturation characteristics of a current flowing when transistors operate in a saturation region, even in the case where the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the EL devices vary, for example. In other words, when the OS transistor operates in the saturation region, the source-drain current hardly changes with an increase in the source-drain voltage; hence, the emission luminance of the light-emitting device can be stable.

As described above, with the use of an OS transistor as a driving transistor included in the pixel circuit, it is possible to achieve "inhibition of black floating", "increase in emission luminance", "increase in gray level", "inhibition of variation in light-emitting devices", and the like.

The metal oxide used for the semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Alternatively, an oxide containing indium (In), aluminum (Al), and zinc (Zn) (also referred to as IAZO) is preferably used for the semiconductor layer. Alternatively, an oxide containing indium (In), aluminum (Al), gallium (Ga), and zinc (Zn) (also referred to as IAGZO) is preferably used for the semiconductor layer.

When an In-M-Zn oxide is used for the semiconductor layer, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

All of the transistors included in the display portion 162 may be OS transistors or all of the transistors included in the display portion 162 may be Si transistors; alternatively, some of the transistors included in the display portion 162 may be OS transistors and the others may be Si transistors.

For example, when both an LTPS transistor and an OS transistor are used in the display portion 162, the display apparatus can have low power consumption and high drive capability. Note that a structure where an LTPS transistor and an OS transistor are used in combination is referred to as LTPO in some cases. Note that as a further suitable example, a structure can be given where an OS transistor is used as, for example, a transistor functioning as a switch for controlling conduction and non-conduction between wirings and an LTPS transistor is used as, for example, a transistor for controlling current.

For example, one of the transistors included in the display portion 162 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the display portion 162 functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MML (metal maskless) structure. With this structure, the leakage current that might flow through the transistor and the leakage current that might flow between adjacent light-emitting devices (also referred to as lateral leakage current, side leakage current, or the like) can be extremely low. With the structure, a viewer can notice any one or more of the image crispness, the image sharpness, a high chroma, and a high contrast ratio in an image displayed on the display apparatus. When the leakage current that might flow through the transistor and the lateral leakage current that might flow between light-emitting devices are extremely low, display with little leakage of light at the time of black display (what is called black floating) can be achieved.

Figure 22B:
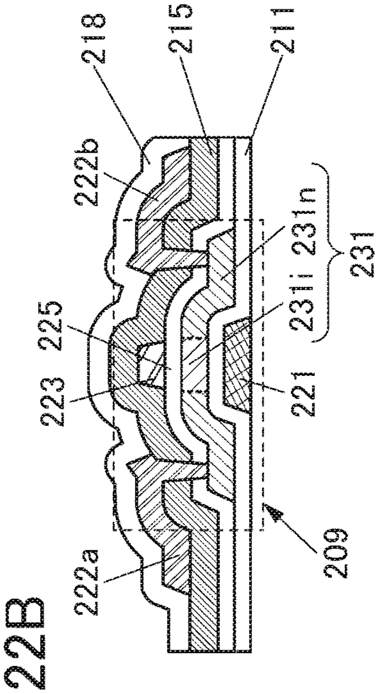
FIG. 22B and FIG. 22C are cross-sectional views illustrating examples of a transistor.
Figure 22C:
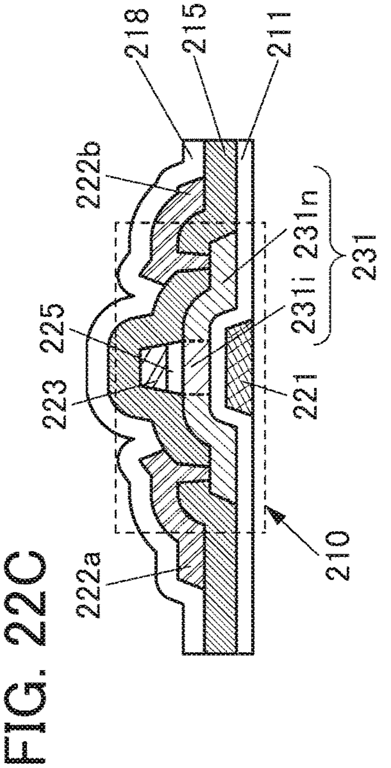

FIG. 22B and FIG. 22C illustrate other structure examples of transistors.

A transistor 209 and a transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of the low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 22B illustrates an example of the transistor 209 in which the insulating layer 225 covers the top and side surfaces of the semiconductor layer 231. The conductive layer 222*a* and the conductive layer 222*b* are connected to the low-resistance regions 231*n* through openings provided in the insulating layer 225 and the insulating layer 215. One of the conductive layer 222*a* and the conductive layer 222*b* functions as a source, and the other functions as a drain.

Meanwhile, in the transistor 210 illustrated in FIG. 22C, the insulating layer 225 overlaps with the channel formation region 231*i* of the semiconductor layer 231 and does not overlap with the low-resistance regions 231*n*. The structure illustrated in FIG. 22C can be formed by processing the insulating layer 225 with the conductive layer 223 as a mask, for example. In FIG. 22C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*, a conductive film obtained by processing the same conductive film as the conductive layers 126*a*, 126*b*, and 126*c*, and a conductive film obtained by processing the same conductive film as the conductive layers 129*a*, 129*b*, and 129*c*. The conductive layer 166 is exposed on the top surface of the connection portion 204. Thus, the connection portion 204 and the FPC 172 can be electrically connected to each other through the connection layer 242.

A light-blocking layer 117 is preferably provided on a surface of the substrate 152 that faces the substrate 151. The light-blocking layer 117 can be provided between adjacent light-emitting devices, in the connection portion 140, and in the circuit 164, for example. A variety of optical members can be arranged on the outer surface of the substrate 152.

The material that can be used for the substrate 120 can be used for each of the substrate 151 and the substrate 152.

The material that can be used for the resin layer 122 can be used for the adhesive layer 142.

As the connection layer 242, an anisotropic conductive film (ACF), an anisotropic conductive paste (ACP), or the like can be used.

[Display Apparatus 100H]

The display apparatus 100H illustrated in FIG. 23A is different from the display apparatus 100G mainly in that the display apparatus 100H is a bottom-emission display apparatus. Light emitted from the light-emitting devices is emitted toward the substrate 151. For the substrate 151, a material having a high property of transmitting visible light is preferably used. On the other hand, there is no limitation on the light-transmitting property of a material used for the substrate 152.

The light-blocking layer 117 is preferably formed between the substrate 151 and the transistor 201 and between the substrate 151 and the transistor 205. FIG. 23A illustrates an example where the light-blocking layer 117 is provided over the substrate 151, an insulating layer 153 is provided over the light-blocking layer 117, and the transistors 201 and 205 and the like are provided over the insulating layer 153.

The light-emitting device 130R includes the conductive layer 112*a*, the conductive layer 126*a* over the conductive layer 112*a*, and the conductive layer 129*a* over the conductive layer 126*a*.

The light-emitting device 130G includes the conductive layer 112*b*, the conductive layer 126*b* over the conductive layer 112*b*, and the conductive layer 129*b* over the conductive layer 126*b*.

A material having a high property of transmitting visible light is used for each of the conductive layers 112*a*, 112*b*, 126*a*, 126*b*, 129*a*, and 129*b*. A material reflecting visible light is preferably used for the common electrode 115.

Although FIG. 22A, FIG. 23A, and the like illustrate an example where the top surface of the layer 128 includes a flat portion, the shape of the layer 128 is not particularly limited. FIG. 23B to FIG. 23D illustrate variation examples of the layer 128.

As illustrated in FIGS. 23B and 23D, the top surface of the layer 128 can have a shape such that its center and the vicinity thereof are recessed, i.e., a shape including a concave surface, in a cross-sectional view.

As illustrated in FIG. 23C, the top surface of the layer 128 can have a shape such that its center and the vicinity thereof bulge, i.e., a shape including a convex surface, in a cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112*a* may be equal to or substantially equal to each other, or may be different from each other. For example, the level of the top surface of the layer 128 may be either lower or higher than the level of the top surface of the conductive layer 112*a*.

FIG. 23B can be regarded as illustrating an example where the layer 128 fits in the depressed portion in the conductive layer 112*a*. By contrast, as illustrated in FIG. 23D, the layer 128 may exist also outside the depression portion in the conductive layer 112*a*, that is, the layer 128 may be formed to have a top surface wider than the depression portion.

This embodiment can be combined with the other embodiments as appropriate.

Embodiment 4

In this embodiment, a light-emitting device that can be used in the display apparatus of one embodiment of the present invention will be described.

[Light-Emitting Device]

Figure 24A:
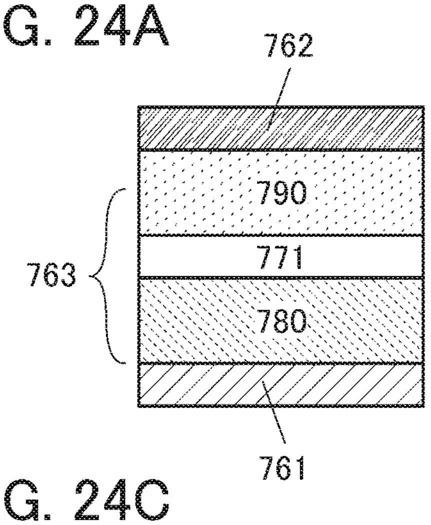
FIG. 24A to FIG. 24F are diagrams illustrating structure examples of a light-emitting device.

As illustrated in FIG. 24A, the light-emitting device includes an EL layer 763 between a pair of electrodes (a lower electrode 761 and an upper electrode 762). The EL layer 763 can be formed of a plurality of layers such as a layer 780, a light-emitting layer 771, and a layer 790.

The light-emitting layer 771 contains at least a light-emitting substance.

In the case where the lower electrode 761 is an anode and the upper electrode 762 is a cathode, the layer 780 includes one or more of a layer containing a substance with a high hole-injection property (hole-injection layer), a layer containing a substance with a high hole-transport property (hole-transport layer), and a layer containing a substance with a high electron-blocking property (electron-blocking layer). Furthermore, the layer 790 includes one or more of a layer containing a substance with a high electron-injection property (electron-injection layer), a layer containing a substance with a high electron-transport property (electron-transport layer), and a layer containing a substance with a high hole-blocking property (hole-blocking layer). In the case where the lower electrode 761 is a cathode and the upper electrode 762 is an anode, the above structures of the layer 780 and the layer 790 are switched.

The structure including the layer 780, the light-emitting layer 771, and the layer 790, which is provided between a pair of electrodes, can function as a single light-emitting unit, and the structure in FIG. 24A is referred to as a single structure in this specification.

Figure 24B:
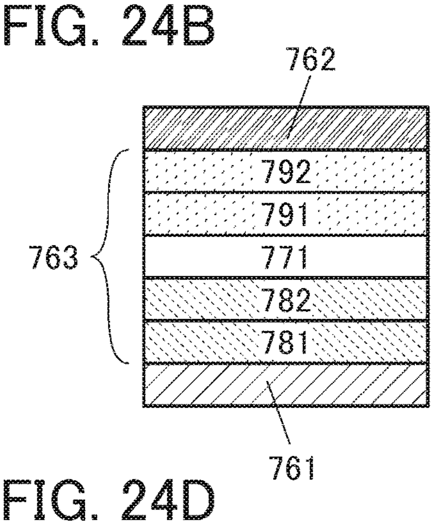

FIG. 24B is a variation example of the EL layer 763 included in the light-emitting device illustrated in FIG. 24A. Specifically, the light-emitting device illustrated in FIG. 24B includes a layer 781 over the lower electrode 761, a layer 782 over the layer 781, the light-emitting layer 771 over the layer 782, a layer 791 over the light-emitting layer 771, a layer 792 over the layer 791, and the upper electrode 762 over the layer 792.

In the case where the lower electrode 761 is an anode and the upper electrode 762 is a cathode, the layer 781 can be a hole-injection layer, the layer 782 can be a hole-transport layer, the layer 791 can be an electron-transport layer, and the layer 792 can be an electron-injection layer, for example. In the case where the lower electrode 761 is a cathode and the upper electrode 762 is an anode, the layer 781 can be an electron-injection layer, the layer 782 can be an electron-transport layer, the layer 791 can be a hole-transport layer, and the layer 792 can be a hole-injection layer. With such a stacked-layer structure, carriers can be efficiently injected to the light-emitting layer 771, and the efficiency of the recombination of carriers in the light-emitting layer 771 can be increased.

Figure 24C:
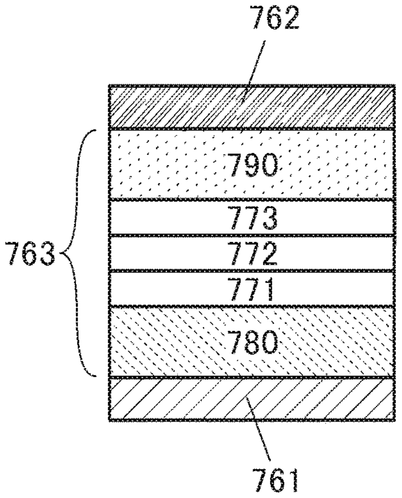
Figure 24D:
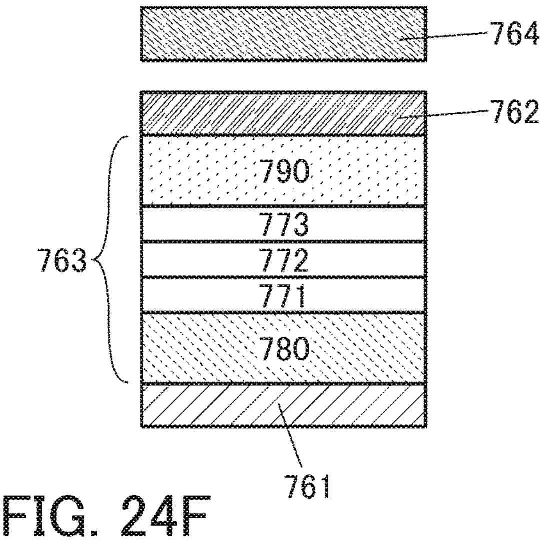

Note that the structure where a plurality of light-emitting layers (light-emitting layers 771, 772, and 773) are provided between the layer 780 and the layer 790 as illustrated in FIG. 24C and FIG. 24D is also a variation of the single structure.

Figure 24E:
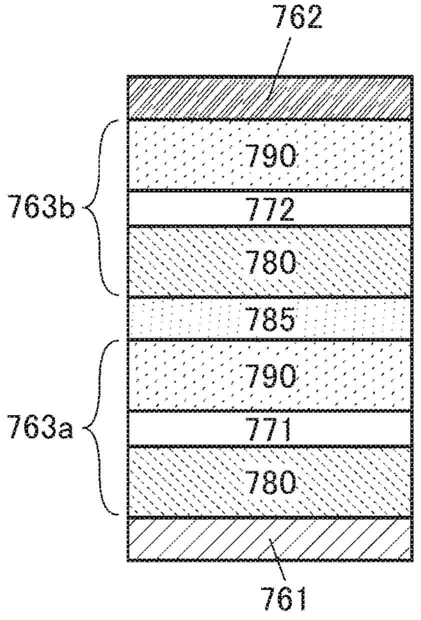
Figure 24F:
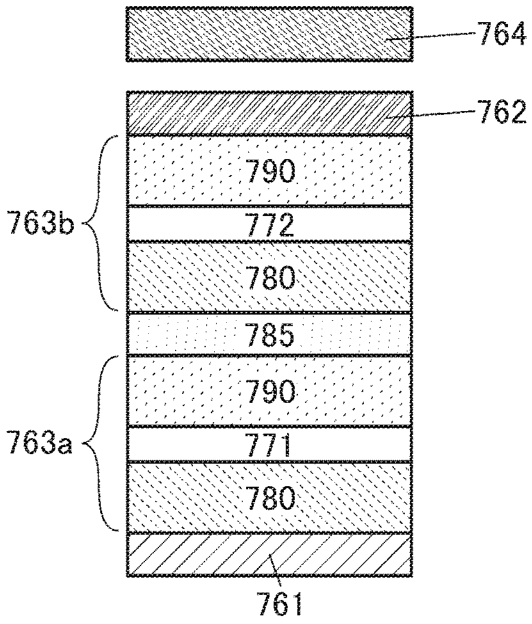

A structure in which a plurality of light-emitting units (an EL layer 763*a* and an EL layer 763*b*) are connected in series with a charge-generation layer 785 therebetween as illustrated in FIG. 24E and FIG. 24F is referred to as a tandem structure in this specification. Note that a tandem structure may be referred to as a stack structure. The tandem structure enables a light-emitting device capable of high-luminance light emission.

In FIG. 24C and FIG. 24D, light-emitting substances that emit light of the same color, or moreover, the same substance may be used for the light-emitting layer 771, the light-emitting layer 772, and the light-emitting layer 773. For example, a light-emitting substance that emits blue light may be used for the light-emitting layer 771, the light-emitting layer 772, and the light-emitting layer 773. A color conversion layer may be provided as a layer 764 illustrated in FIG. 24D.

Alternatively, light-emitting substances that emit light of different colors may be used for the light-emitting layer 771, the light-emitting layer 772, and the light-emitting layer 773. White light emission can be obtained when the light-emitting layer 771, the light-emitting layer 772, and the light-emitting layer 773 emit light of complementary colors. A color filter (also referred to as a coloring layer) may be provided as the layer 764 illustrated in FIG. 24D. When white light passes through a color filter, light of a desired color can be obtained.

The light-emitting device that emits white light preferably contains two or more kinds of light-emitting substances. For example, when an emission color of a first light-emitting layer and an emission color of a second light-emitting layer are complementary colors, the light-emitting device can be configured to emit white light as a whole. When white light emission is obtained using three or more light-emitting layers, the light-emitting device is configured to emit white light as a whole by combining emission colors of the three or more light-emitting layers.

In FIG. 24E and FIG. 24F, light-emitting substances that emit light of the same color, or moreover, the same substance may be used for the light-emitting layer 771 and the light-emitting layer 772. Alternatively, light-emitting substances that emit light of different colors may be used for the light-emitting layer 771 and the light-emitting layer 772. White light can be obtained when the light-emitting layer 771 and the light-emitting layer 772 emit light of complementary colors. FIG. 24F illustrates an example in which the layer 764 is further provided. One or both of a color conversion layer and a color filter (coloring layer) can be used as the layer 764. Note that in FIG. 24D and FIG. 24F, a conductive film transmitting visible light is used for the upper electrode 762 to extract light to the upper electrode 762 side.

Note that in FIG. 24C, FIG. 24D, FIG. 24E, and FIG. 24F, each of the layer 780 and the layer 790 may independently have a stacked-layer structure of two or more layers as in FIG. 24B.

Next, materials that can be used for the light-emitting device will be described.

A conductive film that transmits visible light is used as the electrode through which light is extracted, which is either the lower electrode 761 or the upper electrode 762. A conductive film that reflects visible light is preferably used as the electrode through which light is not extracted. In the case where the display apparatus includes a light-emitting device emitting infrared light, a conductive film which transmits visible light and infrared light is used as the electrode through which light is extracted, and a conductive film reflecting visible light and infrared light is preferably used as the electrode through which light is not extracted.

A conductive film that transmits visible light may be used also for the electrode through which light is not extracted. In this case, the electrode is preferably provided between a reflective layer and the EL layer 763. In other words, light emitted by the EL layer 763 may be reflected by the reflective layer to be extracted from the display apparatus.

As a material that forms the pair of electrodes of the light-emitting device, a metal, an alloy, an electrically conductive compound, a mixture thereof, and the like can be used as appropriate. Specific examples include an indium tin oxide (In—Sn oxide, also referred to as ITO), an In—Si—Sn oxide (also referred to as ITSO), an indium zinc oxide (In—Zn oxide), an In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a visible-light-transmitting property (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

Either a low molecular compound or a high molecular compound can be used in the light-emitting device, and an inorganic compound may also be contained. Each layer included in the light-emitting device can be formed by a method such as an evaporation method (including a vacuum evaporation method), a transfer method, a printing method, an inkjet method and a coating method.

The light-emitting layer can contain one or more kinds of light-emitting substances. As the light-emitting substance, a substance whose emission color is blue, violet, bluish violet, green, yellowish green, yellow, orange, red, or the like is used as appropriate. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (guest material). As one or more kinds of organic compounds, one or both of a substance with a high hole-transport property (hole-transport material) and a substance with a high electron-transport property (electron-transport material) can be used. Alternatively, as one or more kinds of organic compounds, a bipolar material or a TADF material may be used.

The light-emitting layer preferably contains a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from the exciplex to the light-emitting substance (phosphorescent material). When a combination of materials is selected so as to form an exciplex that exhibits light emission whose wavelength overlaps with the wavelength on a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 763 may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (also referred to as a substance with a high electron-transport property and a high hole-transport property), and the like.

The hole-injection layer injects holes from the anode to the hole-transport layer and contains a substance with a high hole-injection property. Examples of a substance with a high hole-injection property include an aromatic amine compound and a composite material containing a hole-transport material and an acceptor material (electron-accepting material).

A hole-transport layer is a layer transporting holes, which are injected from an anode by a hole-injection layer, to a light-emitting layer. The hole-transport layer is a layer containing a hole-transport material. The hole-transport material preferably has a hole mobility of $1\times10^{-6}$ $cm^2/Vs$ or higher. Note that other substances can also be used as long as the substances have a hole-transport property higher than an electron-transport property. As the hole-transport material, substances with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

An electron-transport layer is a layer transporting electrons, which are injected from a cathode by an electron-injection layer, to a light-emitting layer. The electron-transport layer contains an electron-transport material. The electron-transport material preferably has an electron mobility of $1\times10^{-6}$ $cm^2/Vs$ or higher. Note that other substances can also be used as long as the substances have an electron-transport property higher than a hole-transport property. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

The difference between the lowest unoccupied molecular orbital (LUMO) level of the substance with a high electron-injection property and the work function value of the material used for the cathode is preferably small (specifically, smaller than or equal to 0.5 eV).

For the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$; X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. In the stacked-layer structure, for example, lithium fluoride can be used for the first layer and ytterbium can be used for the second layer.

The electron-injection layer may contain an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the LUMO level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) or the like can be used for the organic compound having an unshared electron pair. Note that NBPhen has a higher glass transition temperature (Tg) than BPhen and thus has high heat resistance.

In the case of manufacturing a light-emitting device with a tandem structure, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For the charge-generation layer, for example, a material that can be used for the electron-injection layer, such as lithium, can be suitably used. For the charge-generation layer, for example, a material that can be used for the hole-injection layer can be suitably used. For the charge-generation layer, a layer containing a hole-transport material and an acceptor material (electron-accepting material) can be used. For the charge-generation layer, a layer containing an electron-transport material and a donor material can be used. Forming such a charge-generation layer can inhibit an increase in the driving voltage that would be caused by stacking light-emitting units.

This embodiment can be combined with the other embodiments as appropriate.

Embodiment 5

In this embodiment, a light-receiving device that can be used in the display apparatus of one embodiment of the present invention and a display apparatus having a light-receiving function will be described.

[Light-Receiving Device]

Figure 25A:
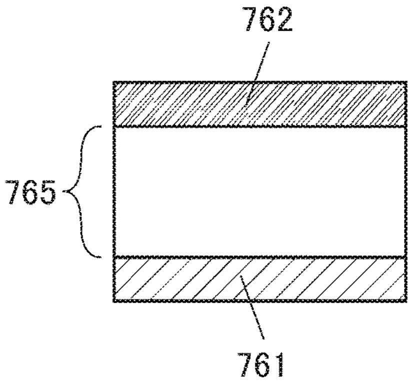
FIG. 25A and FIG. 25B are diagrams illustrating structure examples of a light-receiving device.

As illustrated in FIG. 25A, the light-receiving device includes a layer 765 between a pair of electrodes (the lower electrode 761 and the upper electrode 762). The layer 765 includes at least one active layer, and may further include another layer.

Figure 25B:
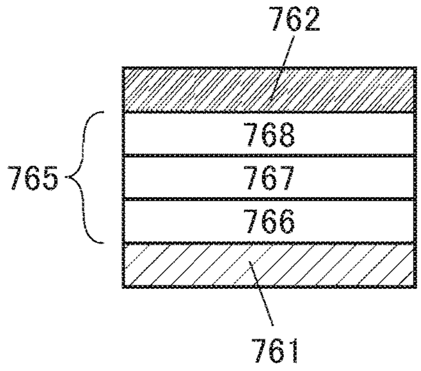

FIG. 25B is a variation example of the layer 765 included in the light-receiving device illustrated in FIG. 25A. Specifically, the light-receiving device illustrated in FIG. 25B includes a layer 766 over the lower electrode 761, an active layer 767 over the layer 766, a layer 768 over the active layer 767, and the upper electrode 762 over the layer 768.

The active layer 767 functions as a photoelectric conversion layer.

In the case where the lower electrode 761 is an anode and the upper electrode 762 is a cathode, the layer 766 includes one or both of a hole-transport layer and an electron-blocking layer. The layer 768 includes one or both of an electron-transport layer and a hole-blocking layer. In the case where the lower electrode 761 is a cathode and the upper electrode 762 is an anode, the above structures of the layer 766 and the layer 768 are switched.

Next, materials that can be used for the light-receiving device are described.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1",4',4"-tetrahydro-di [1,4]methanonaphthaleno[1,2:2',3',56,60:2",3"][5,6]fullerene-$C_{60}$ (abbreviation: ICBA).

Examples of the n-type semiconductor material include perylenetetracarboxylic acid derivatives such as N,N-dimethyl-3,4,9,10-perylenetetracarboxylic diimide (abbreviation: Me-PTCDI) and 2,2'-(5,5'-(thieno[3,2-b]thiophene-2,5-diyl)bis(thiophene-5,2-diyl))bis(methan-1-yl-1-ylidene) dimalononitrile (abbreviation: FT2TDMN).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), quinacridone, and rubrene.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a rubrene derivative, a tetracene derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

For example, the active layer is preferably formed by co-evaporation of an n-type semiconductor and a p-type semiconductor. Alternatively, the active layer may be formed by stacking an n-type semiconductor and a p-type semiconductor.

Three or more kinds of materials may be used for the active layer. For example, a third material may be mixed with an n-type semiconductor material and a p-type semiconductor material in order to extend the absorption wavelength range. The third material may be a low molecular compound or a high molecular compound.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a layer containing any of a substance with a high hole-injection property, a hole-blocking material, a substance with a high electron-injection property, an electron-blocking material, and the like. Layers other than the active layer included in the light-receiving device can be formed using a material that can be used for the light-emitting device.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO) or an organic compound such as polyethylenimine ethoxylated (PEIE) can be used. The light-receiving device may include a mixed film of PEIE and ZnO, for example.

[Display Apparatus Having Light Detection Function]

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light with the display portion, an image can be captured or an approach or touch of an object (e.g., a finger, a hand, or a pen) can be detected.

Furthermore, in the display apparatus of one embodiment of the present invention, the light-emitting devices can be used as a light source of the sensor. In the display apparatus of one embodiment of the present invention, when an object reflects (or scatters) light emitted from the light-emitting device included in the display portion, the light-receiving device can detect reflected light (or scattered light); thus, image capturing or touch sensing is possible even in a dark place.

Accordingly, a light-receiving portion and a light source do not need to be provided separately from the display apparatus; hence, the number of components of an electronic device can be reduced. For example, a biometric authentication device provided in the electronic device, a capacitive touch panel for scroll operation, or the like is not necessarily provided separately. Thus, with the use of the display apparatus of one embodiment of the present invention, the electronic device can be provided at lower manufacturing cost.

In the case where the light-receiving devices are used as the image sensor, the display apparatus can capture an image with the use of the light-receiving devices. For example, the display apparatus of this embodiment can be used as a scanner.

For example, image capturing for personal authentication with the use of a fingerprint, a palm print, the iris, the shape of a blood vessel (including the shape of a vein and the shape of an artery), a face, or the like is possible by using the image sensor.

For example, an image of the periphery of an eye, the surface of the eye, or the inside (eyeground or the like) of the eye of a user of a wearable device can be captured with the use of the image sensor. Therefore, the wearable device can have a function of detecting one or more selected from a blink, movement of an iris, and movement of an eyelid of the user.

For example, the fatigue level of the user can be estimated from one or both of the number of blinks and the time required for one blink. For the eye fatigue estimation, a system using AI (Artificial Intelligence) may be employed. An eye tracking function may be added to the electronic device.

The light-receiving device can be used in a touch sensor (also referred to as a direct touch sensor), a near touch sensor (also referred to as a hover sensor, a hover touch sensor, a contactless sensor, or a touchless sensor), or the like.

Here, the touch sensor or the near touch sensor can detect an approach or contact of an object (e.g., a finger, a hand, or a pen).

The touch sensor can detect the object when the display apparatus and the object come in direct contact with each other. Furthermore, even when an object is not in contact with the display apparatus, the near touch sensor can detect the object. For example, the display apparatus is preferably capable of detecting an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of a touch sensor or a near touch sensor may be changed in accordance with the refresh rate. In the case where the refresh rate of the display apparatus is 120 Hz, for example, the driving frequency of a touch sensor or a near touch sensor can be higher than 120 Hz (typically, 240 Hz). This structure can achieve low power consumption and can increase the response speed of a touch sensor or a near touch sensor.

Figure 25C:
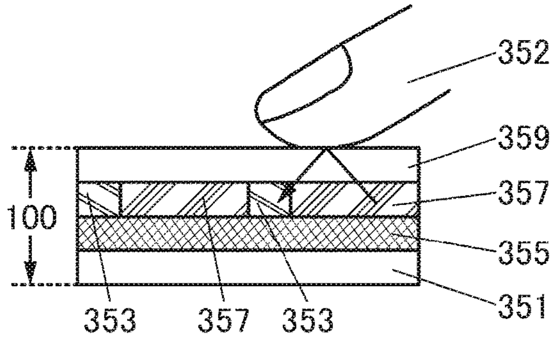
FIG. 25C to FIG. 25E are diagrams illustrating structure examples of a display apparatus.
Figure 25D:
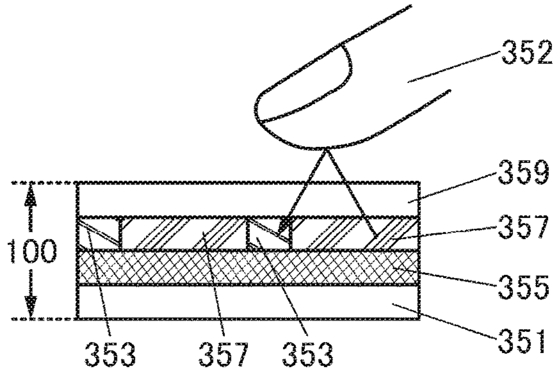
Figure 25E:
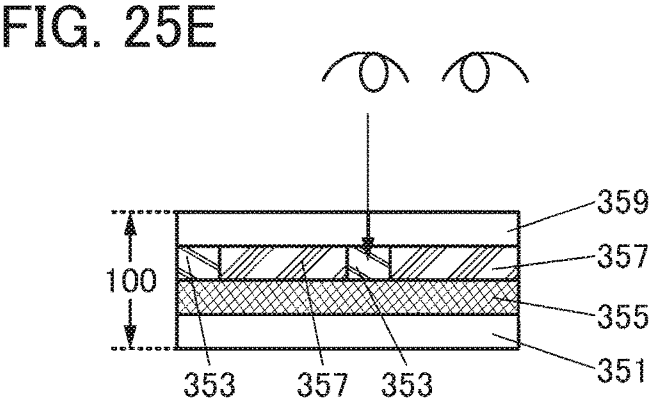

The display apparatus 100 illustrated in FIG. 25C to 25E includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. One or more of a switch, a transistor, a capacitor, a resistor, a wiring, a terminal, and the like can be provided in the functional layer 355. Note that in the case where the light-emitting device and the light-receiving device are driven by a passive-matrix method, a structure provided with neither a switch nor a transistor may be employed.

For example, after light emitted from the light-emitting device in the layer 357 including light-emitting devices is reflected by a finger 352 that touches the display apparatus 100 as illustrated in FIG. 25C, the light-receiving device in the layer 353 including light-receiving devices detects the reflected light. Thus, the touch of the finger 352 on the display apparatus 100 can be detected.

The display apparatus may have a function of sensing an object that is close to (i.e., that is not touching) the display apparatus as illustrated in FIG. 25D and FIG. 25E or capturing an image of such an object. FIG. 25D illustrates an example in which a human finger is detected, and FIG. 25E illustrates an example in which information on the surroundings, surface, or inside of the human eye (e.g., the number of blinks, the movement of an eyeball, and the movement of an eyelid) is sensed.

This embodiment can be combined with the other embodiments as appropriate.

Embodiment 6

In this embodiment, electronic devices of one embodiment of the present invention are described with reference to FIG. 26 to FIG. 28.

An electronic device of this embodiment is provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display apparatus of one embodiment of the present invention can have a resolution, and thus can be favorably used for an electronic device having a relatively small display portion. Examples of such an electronic device include a watch-type or a bracelet-type information terminal device (wearable device), and a wearable device worn on a head, such as a device for VR such as a head mounted display, a glasses-type device for AR, and a device for MR.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840× 2160), or 8K (number of pixels: 7680× 4320). In particular, the definition is preferably 4K, 8K, or higher. Furthermore, the pixel density (resolution) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display apparatus with one or both of high definition and high resolution, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 26A to FIG. 26D. These wearable devices have at least one of a function of displaying AR contents, a function of displaying VR contents, a function of displaying SR contents, and a function of displaying MR contents. The electronic device having a function of displaying a content of at least one of AR, VR, SR, MR, and the like enables the user to reach a higher level of immersion.

Figure 26A:
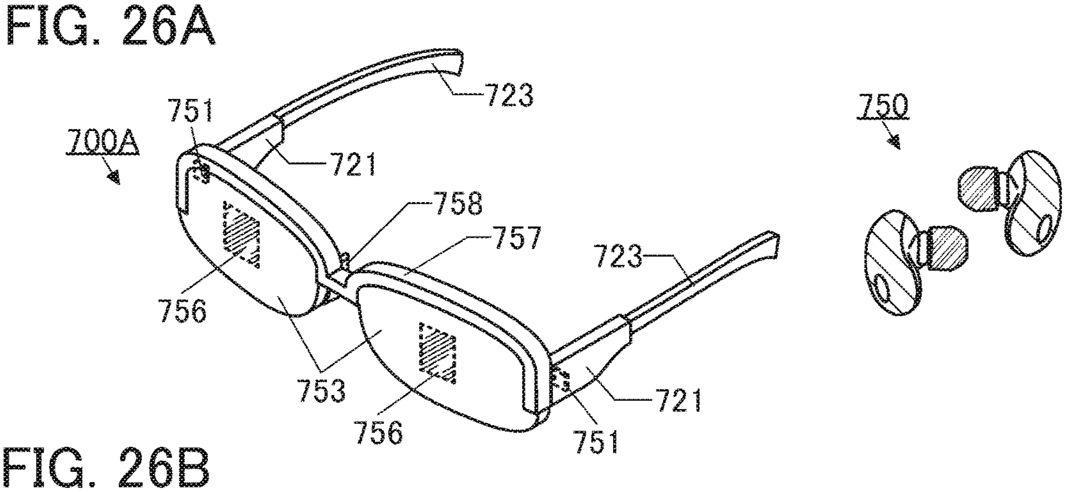
FIG. 26A to FIG. 26D are diagrams illustrating examples of electronic devices.
Figure 26B:
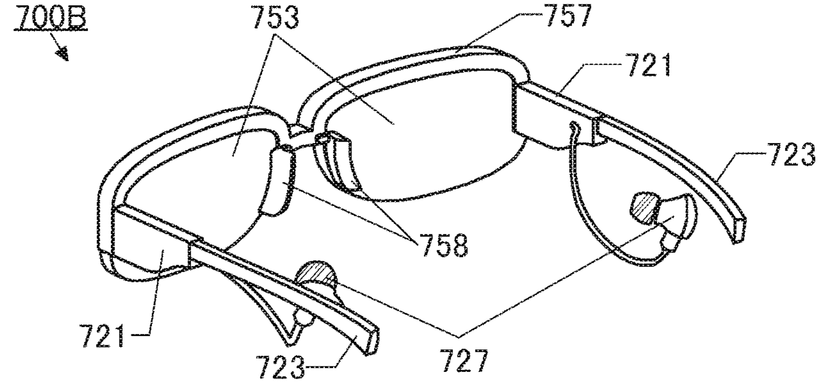

An electronic device 700A illustrated in FIG. 26A and an electronic device 700B illustrated in FIG. 26B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panel 751. Thus, the electronic device can perform display with extremely high resolution.

The electronic device 700A and the electronic device 700B can each project an image displayed on the display panel 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display region 756.

The communication portion includes a wireless communication device, and a video signal and the like can be supplied by the wireless communication device. Note that instead of or in addition to the wireless communication device, a connector to which a cable for supplying a video signal and a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 26C:
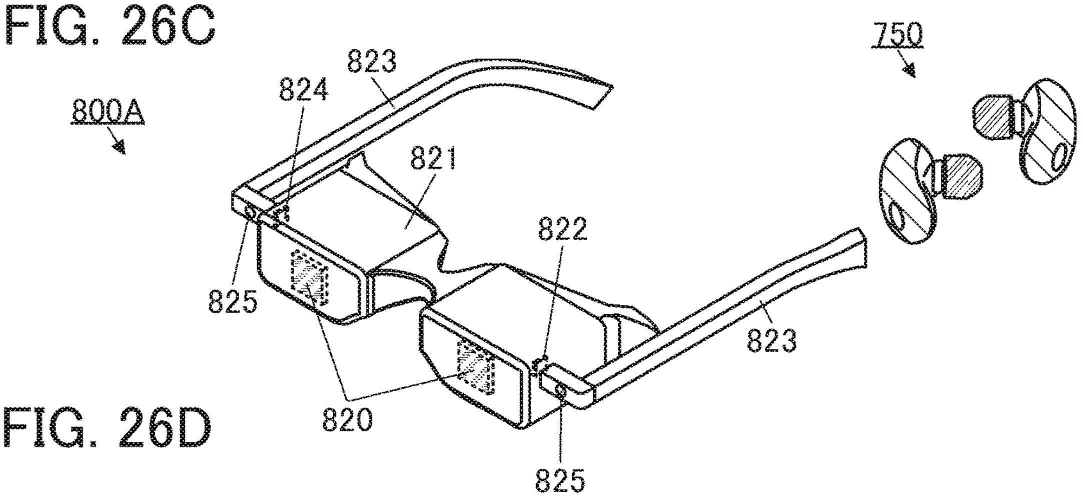
Figure 26D:
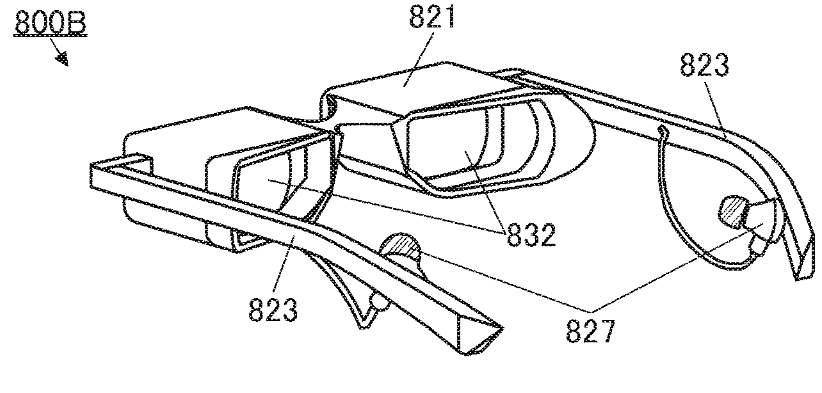

An electronic device 800A illustrated in FIG. 26C and an electronic device 800B illustrated in FIG. 26D each include a pair of display portions 820, a housing 821, a communication portion 822, a pair of wearing portions 823, a control portion 824, a pair of image capturing portions 825, and a pair of lenses 832.

A display apparatus of one embodiment of the present invention can be used in the display portions 820. Thus, the electronic device can perform display with extremely high resolution. This enables a user to feel high sense of immersion.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 26C or the like illustrates an example in which the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 26A has a function of transmitting information to the earphones 750 with the wireless communication function. As another example, the electronic device 800A illustrated in FIG. 26C has a function of transmitting information to the earphones 750 with the wireless communication function.

The electronic device may include an earphone portion. The electronic device 700B illustrated in FIG. 26B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 26D includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 27A:
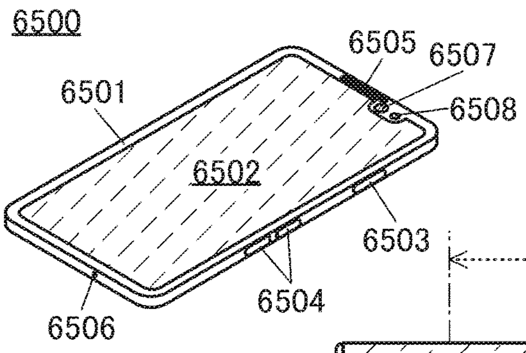
FIG. 27A to FIG. 27F are diagrams illustrating examples of electronic devices.

An electronic device 6500 illustrated in FIG. 27A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 27B:
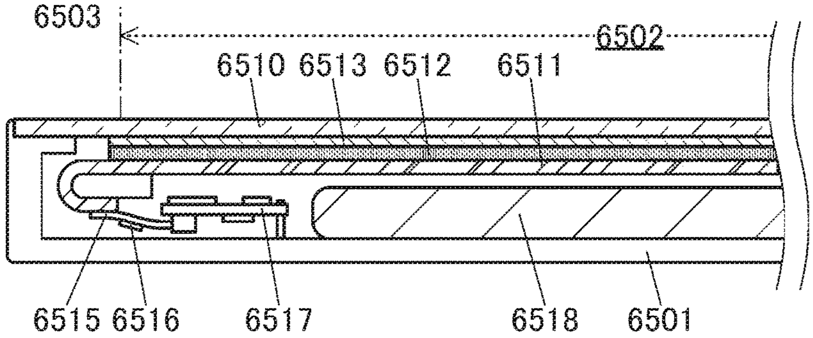

FIG. 27B is a schematic cross-sectional view including an end portion of the housing 6501 on the microphone 6506 side.

A protection member 6510 having a light-transmitting property is provided on a display surface side of the housing

6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

Figure 27C:
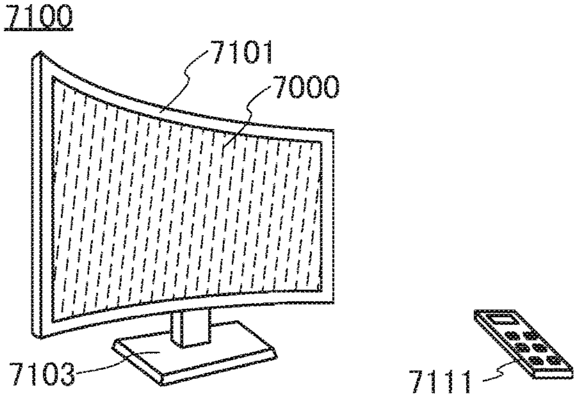

FIG. 27C illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 27C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 27D:
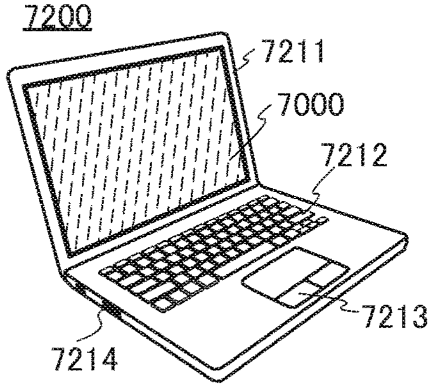

FIG. 27D illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 27E:
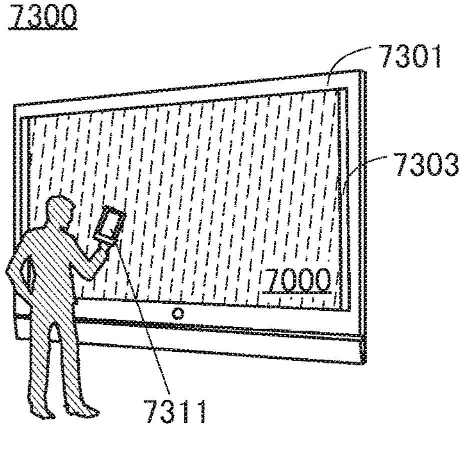
Figure 27F:
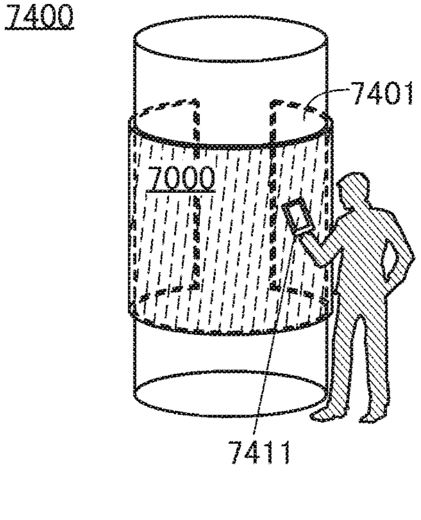

FIG. 27E and FIG. 27F illustrate examples of digital signage.

Digital signage 7300 illustrated in FIG. 27E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 27F is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 27E and FIG. 27F.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 27E and FIG. 27F, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 28A to FIG. 28G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display apparatus of one embodiment of the present invention can be used for the display portion 9001 in FIG. 28A to FIG. 28G.

The electronic devices illustrated in FIG. 28A to FIG. 28G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 28A to FIG. 28G are described in detail below.

Figure 28A:
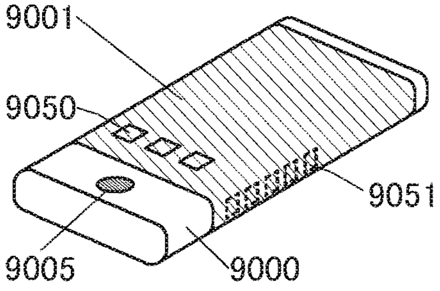
FIG. 28A to FIG. 28G are diagrams illustrating examples of electronic devices.

FIG. 28A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 28A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 28B:
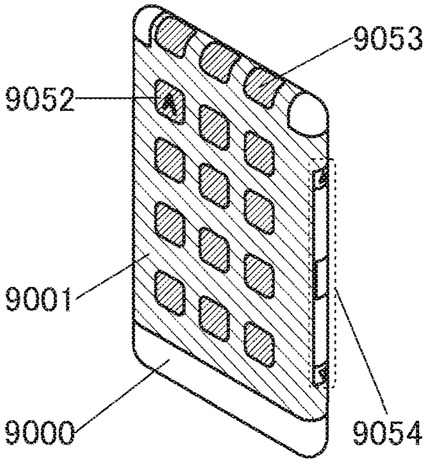

FIG. 28B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 28C:
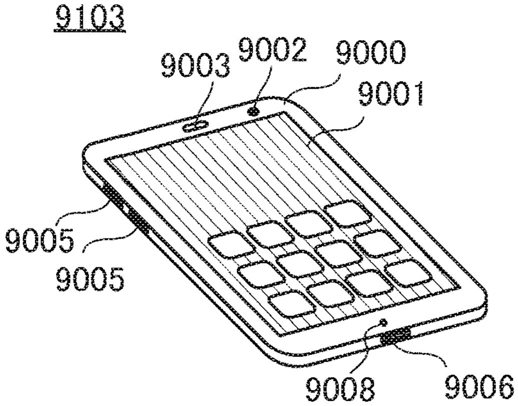

FIG. 28C is a perspective view of a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 28D:
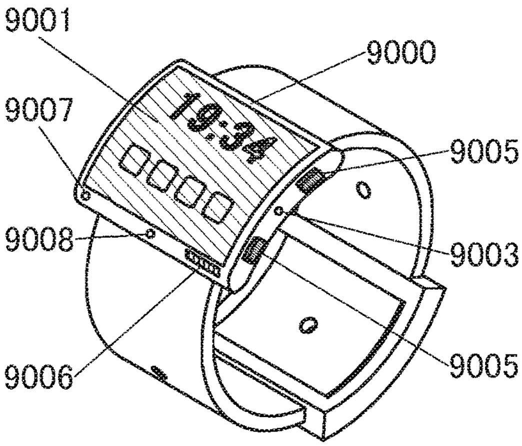

FIG. 28D is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 28E:
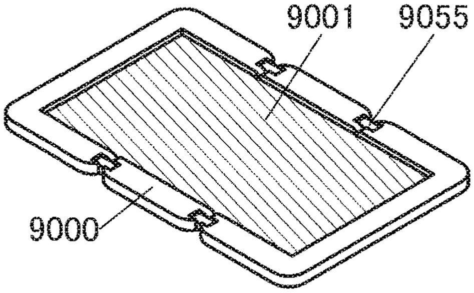
Figure 28F:
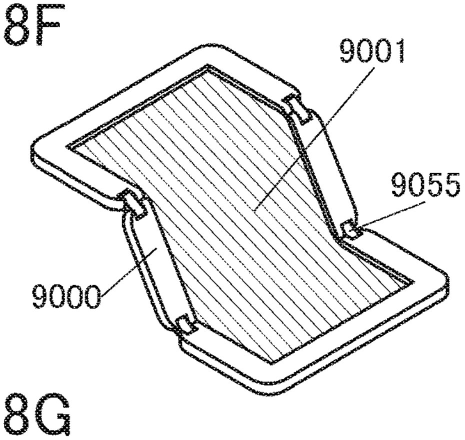
Figure 28G:
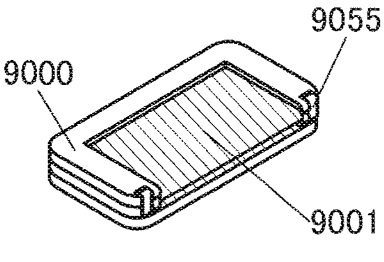

FIG. 28E to FIG. 28G are perspective views illustrating a foldable portable information terminal 9201. FIG. 28E is a perspective view of an opened state of the portable information terminal 9201, FIG. 28G is a perspective view of a folded state thereof, and FIG. 28F is a perspective view of a state in the middle of change from one of FIG. 28E and FIG. 28G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

Lin: light, 100A: display apparatus, 100B: display apparatus, 100C: display apparatus, 100D: display apparatus, 100E: display apparatus, 100F: display apparatus, 100G: display apparatus, 100H: display apparatus, 100: display apparatus, 101: layer, 110B: subpixel, 110G: subpixel, 110IR: subpixel, 110R: subpixel, 110S: subpixel, 110: pixel, 111*a*: pixel electrode, 111*b*: pixel electrode, 111*c*: pixel electrode, 111*d*: pixel electrode, 111*e*: pixel electrode, 112*a*: conductive layer, 112*b*: conductive layer, 112*c*: conductive layer, 113*a*: first layer, 113A: film, 113*b*: second layer, 113B: film, 113*c*: third layer, 114: common layer, 115: common electrode, 117: light-blocking layer, 118*a*: sacrificial layer, 118A: sacrificial film, 118*b*: sacrificial layer, 118B: sacrificial film, 118*c*: sacrificial layer, 119*a*: sacrificial layer, 119A: sacrificial film, 119*b*: sacrificial layer, 119B: sacrificial film, 120: substrate, 121: insulating layer, 122: resin layer, 123: conductive layer, 125A: insulating film, 125: insulating layer, 126*a*: conductive layer, 126*b*: conductive layer, 126*c*: conductive layer, 127A: insulating film, 127: insulating layer, 128: layer, 129*a*: conductive layer, 129*b*: conductive layer, 129*c*: conductive layer, 130B: light-emitting device, 130G: light-emitting device, 130IR: light-emitting device, 130R: light-emitting device, 131: protective layer, 132B: coloring layer, 132G: coloring layer, 132R: coloring layer, 132V: coloring layer, 133: lens array, 134: insulating layer, 135: space, 140: connection portion, 142: adhesive layer, 150: light-receiving device, 151: substrate, 152: substrate, 153: insulating layer, 162: display portion, 164: circuit, 165: wiring, 166: conductive layer, 172: FPC, 173: IC, 190A: resist mask, 190B: resist mask, 191: mask, 192: mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 231*i*: channel formation region, 231*n*: low-resistance region, 231: semiconductor layer, 240: capacitance, 241: conductive layer, 242: connection layer, 243: insulating layer, 245: conductive layer, 251: conductive layer, 252: conductive layer, 254: insulating layer, 255*a*: insulating layer, 255*b*: insulating layer, 255*c*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301A: substrate, 301B: substrate, 301: substrate, 310A: transistor, 310B: transistor, 310: transistor, 311: conductive layer, 312: low-resistance region, 313: insulating layer, 314: insulating layer, 315: element isolation layer, 320A: transistor, 320B: transistor, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 335: insulating layer, 336: insulating layer, 341: conductive layer, 342: conductive layer, 343: plug, 344: insulating layer, 345: insulating layer, 346: insulating layer, 347: bump, 348: adhesive layer, 351: substrate, 352: finger, 353: layer, 355: functional layer, 357: layer, 359: substrate, 700A: electronic device, 700B: electronic device, 721: housing, 723: mounting portion, 727: earphone portion, 750: earphone, 751: display panel, 753: optical member, 756: display region, 757: frame, 758: nose pad, 761: lower electrode, 762: upper electrode, 763*a*: EL layer, 763*b*: EL layer, 763: EL layer, 764: layer, 765: layer, 766: layer, 767: active layer, 768: layer, 771: light-emitting layer, 772: light-emitting layer, 773: light-emitting layer, 780: layer, 781: layer, 782: layer, 785: charge-generation layer, 790: layer, 791: layer, 792: layer, 800A: electronic device, 800B: electronic device, 820: display portion, 821: housing, 822: communication portion, 823: mounting portion, 824: control portion, 825: image capturing portion, 827: earphone portion, 832: lens, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A display apparatus comprising a display portion in which a first arrangement pattern and a second arrangement pattern are repeatedly placed in a first direction, wherein in the first arrangement pattern, a first subpixel and a second subpixel are repeatedly arranged in a second direction, wherein in the second arrangement pattern, a third subpixel, a fourth subpixel, and a fifth subpixel are repeatedly arranged in the second direction, wherein the first subpixel comprises a first light-emitting device, wherein the second subpixel comprises a second light-emitting device, wherein the third subpixel comprises a third light-emitting device, wherein the fourth subpixel comprises a fourth light-emitting device, wherein the fifth subpixel comprises a light-receiving device, wherein the first light-emitting device comprises a first pixel electrode, a first EL layer over the first pixel electrode, and a common electrode over the first EL layer, wherein the second light-emitting device comprises a second pixel electrode, a second EL layer over the second pixel electrode, and the common electrode over the second EL layer, wherein the third light-emitting device comprises a third pixel electrode, a third EL layer over the third pixel electrode, and the common electrode over the third EL layer, wherein the fourth light-emitting device comprises a fourth pixel electrode, a fourth EL layer over the fourth pixel electrode, and the common electrode over the fourth EL layer, wherein the fifth subpixel comprises a fifth pixel electrode, an active layer over the fifth pixel electrode, and the common electrode over the active layer, wherein a first insulating layer is positioned below the first pixel electrode, the second pixel electrode, the third pixel electrode, the fourth pixel electrode, and the fifth pixel electrode, wherein a second insulating layer and a third insulating layer are provided between the first pixel electrode and the second pixel electrode, between the second pixel electrode and the third pixel electrode, between the third pixel electrode and the fourth pixel electrode, and between the fourth pixel electrode and the fifth pixel electrode, wherein the second insulating layer comprises a depressed portion in contact with the first insulating layer, and wherein the third insulating layer is filled into the depressed portion.

2. The display apparatus according to claim 1, wherein a longitudinal direction of the third subpixel, the fourth subpixel, and the fifth subpixel is the first direction.

3. The display apparatus according to claim 1, wherein a longitudinal direction of the first subpixel is the second direction.

4. The display apparatus according to claim 1, wherein the second subpixel emits infrared light and has the lowest aperture ratio among the first subpixel to the fifth subpixel.

5. A display apparatus comprising a display portion in which a first arrangement pattern and a second arrangement pattern are repeatedly placed in a first direction, wherein in the first arrangement pattern, a first subpixel, a second subpixel, and a third subpixel are repeatedly arranged in a second direction, wherein in the second arrangement pattern, a fourth subpixel and a fifth subpixel are repeatedly arranged in the second direction, wherein the first subpixel comprises a first light-emitting device, wherein the second subpixel comprises a second light-emitting device, wherein the third subpixel comprises a third light-emitting device, wherein the fourth subpixel comprises a fourth light-emitting device, wherein the fifth subpixel comprises a light-receiving device, wherein the first light-emitting device comprises a first pixel electrode, a first EL layer over the first pixel electrode, and a common electrode over the first EL layer, wherein the second light-emitting device comprises a second pixel electrode, a second EL layer over the second pixel electrode, and the common electrode over the second EL layer, wherein the third light-emitting device comprises a third pixel electrode, a third EL layer over the third pixel electrode, and the common electrode over the third EL layer, wherein the fourth light-emitting device comprises a fourth pixel electrode, a fourth EL layer over the fourth pixel electrode, and the common electrode over the fourth EL layer, wherein the fifth subpixel comprises a fifth pixel electrode, an active layer over the fifth pixel electrode, and the common electrode over the active layer, wherein a first insulating layer is positioned below the first pixel electrode, the second pixel electrode, the third pixel electrode, the fourth pixel electrode, and the fifth pixel electrode, wherein a second insulating layer and a third insulating layer are provided between the first pixel electrode and the second pixel electrode, between the second pixel electrode and the third pixel electrode, between the third pixel electrode and the fourth pixel electrode, and between the fourth pixel electrode and the fifth pixel electrode, wherein the second insulating layer comprises a depressed portion in contact with the first insulating layer, and wherein the third insulating layer is filled into the depressed portion.

6. The display apparatus according to claim 5, wherein a longitudinal direction of the first subpixel, the second subpixel, and the third subpixel is the first direction.

7. The display apparatus according to claim 5, wherein a longitudinal direction of the fifth subpixel is the second direction.

8. The display apparatus according to claim 5, wherein the fourth subpixel emits infrared light and has the lowest aperture ratio among the first subpixel to the fifth subpixel.

9. A display apparatus comprising a pixel comprising a first subpixel, a second subpixel, a third subpixel, a fourth subpixel, and a fifth subpixel, wherein the first subpixel comprises a first light-emitting device and a first coloring layer, wherein the second subpixel comprises a second light-emitting device and a second coloring layer, wherein the third subpixel comprises a third light-emitting device and a third coloring layer, wherein the fourth subpixel comprises a fourth light-emitting device, wherein the fifth subpixel comprises a light-receiving device, wherein the first light-emitting device comprises a first pixel electrode, a first EL layer over the first pixel electrode, and a common electrode over the first EL layer, wherein the second light-emitting device comprises a second pixel electrode, a second EL layer over the second pixel electrode, and the common electrode over the second EL layer, wherein the third light-emitting device comprises a third pixel electrode, a third EL layer over the third pixel electrode, and the common electrode over the third EL layer, wherein the fourth light-emitting device comprises a fourth pixel electrode, a fourth EL layer over the fourth pixel electrode, and the common electrode over the fourth EL layer, wherein the light-receiving device comprises a fifth pixel electrode, an active layer over the fifth pixel electrode, and the common electrode over the active layer, wherein a first insulating layer is positioned below the first pixel electrode, the second pixel electrode, the third pixel electrode, the fourth pixel electrode, and the fifth pixel electrode, wherein a second insulating layer and a third insulating layer are provided between the first pixel electrode and the second pixel electrode, between the second pixel electrode and the third pixel electrode, between the third pixel electrode and the fourth pixel electrode, and between the fourth pixel electrode and the fifth pixel electrode, wherein the second insulating layer comprises a depressed portion in contact with the first insulating layer, wherein the third insulating layer is filled into the depressed portion, wherein the first EL layer to the third EL layer have a same structure and are apart from one another, wherein the first coloring layer to the third coloring layer transmit light of different colors, wherein the fourth subpixel emits infrared light, and wherein the light-receiving device is configured to detect light emitted by at least one of the first subpixel to the fourth subpixel.

10. A display apparatus comprising a pixel comprising a first subpixel, a second subpixel, a third subpixel, a fourth subpixel, and a fifth subpixel, wherein the first subpixel comprises a first light-emitting device and a first coloring layer, wherein the second subpixel comprises a second light-emitting device and a second coloring layer, wherein the third subpixel comprises a third light-emitting device and a third coloring layer, wherein the fourth subpixel comprises a fourth light-emitting device and a fourth coloring layer, wherein the fifth subpixel comprises a light-receiving device, wherein the first light-emitting device comprises a first pixel electrode, a first EL layer over the first pixel electrode, and a common electrode over the first EL layer, wherein the second light-emitting device comprises a second pixel electrode, a second EL layer over the second pixel electrode, and the common electrode over the second EL layer, wherein the third light-emitting device comprises a third pixel electrode, a third EL layer over the third pixel electrode, and the common electrode over the third EL layer, wherein the fourth light-emitting device comprises a fourth pixel electrode, a fourth EL layer over the fourth pixel electrode, and the common electrode over the fourth EL layer, wherein the light-receiving device comprises a fifth pixel electrode, an active layer over the fifth pixel electrode, and the common electrode over the active layer, wherein a first insulating layer is positioned below the first pixel electrode, the second pixel electrode, the third pixel electrode, the fourth pixel electrode, and the fifth pixel electrode, wherein a second insulating layer and a third insulating layer are provided between the first pixel electrode and the second pixel electrode, between the second pixel electrode and the third pixel electrode, between the third pixel electrode and the fourth pixel electrode, and between the fourth pixel electrode and the fifth pixel electrode, wherein the second insulating layer comprises a depressed portion in contact with the first insulating layer, wherein the third insulating layer is filled into the depressed portion, wherein the first EL layer to the fourth EL layer have a same structure and are apart from one another, wherein the first coloring layer to the third coloring layer transmit light of different colors, wherein the fourth coloring layer includes a stack of two or more of the first coloring layer to the third coloring layer, and wherein the light-receiving device is configured to detect light emitted by at least one of the first subpixel to the fourth subpixel.

11. A display module comprising:

the display apparatus according to claim 1; and at least one of a connector and an integrated circuit.

12. An electronic device comprising:

the display module according to claim 11; and at least one of a housing, a battery, a camera, a speaker, and a microphone.

13. A display module comprising:

the display apparatus according to claim 5; and at least one of a connector and an integrated circuit.

14. An electronic device comprising:

the display module according to claim 13; and at least one of a housing, a battery, a camera, a speaker, and a microphone.

15. A display module comprising:

the display apparatus according to claim 9; and at least one of a connector and an integrated circuit.

16. An electronic device comprising:

the display module according to claim 15; and at least one of a housing, a battery, a camera, a speaker, and a microphone.

17. A display module comprising:

the display apparatus according to claim 10; and at least one of a connector and an integrated circuit.

18. An electronic device comprising:

the display module according to claim 17; and at least one of a housing, a battery, a camera, a speaker, and a microphone.

* * * * *